(12) United States Patent
Park et al.

(10) Patent No.: US 9,997,713 B2
(45) Date of Patent: Jun. 12, 2018

(54) ORGANIC LIGHT-EMITTING DEVICE

(71) Applicant: SAMSUNG DISPLAY CO., LTD., Yongin-City, Gyeonggi-Do (KR)

(72) Inventors: Jun-Ha Park, Yongin (KR); Seok-Hwan Hwang, Yongin (KR); Young-Kook Kim, Yongin (KR); Hye-Jin Jung, Yongin (KR); Eun-Young Lee, Yongin (KR); Jin-O Lim, Yongin (KR); Sang-Hyun Han, Yongin (KR); Eun-Jae Jeong, Yongin (KR); Soo-Yon Kim, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 651 days.

(21) Appl. No.: 14/151,795

(22) Filed: Jan. 9, 2014

(65) Prior Publication Data
US 2014/0209875 A1    Jul. 31, 2014

(30) Foreign Application Priority Data

Jan. 28, 2013    (KR) .................. 10-2013-0009507

(51) Int. Cl.
*B32B 19/00* (2006.01)
*B32B 9/00* (2006.01)
(Continued)

(52) U.S. Cl.
CPC ........ *H01L 51/006* (2013.01); *H01L 51/0054* (2013.01); *H01L 51/0059* (2013.01);
(Continued)

(58) Field of Classification Search
USPC ....................................................... 428/690
See application file for complete search history.

(56) References Cited

U.S. PATENT DOCUMENTS 5,645,948 A    7/1997   Shi et al.
6,682,832 B2   1/2004   Satou et al.
(Continued)

FOREIGN PATENT DOCUMENTS

JP    05-021161 A    1/1993
JP    6-240245 A     8/1994
(Continued)

OTHER PUBLICATIONS

Adachi, Chihaya et al., Confinement of charge carriers and molecular excitons within 5-nm-thick emitter layer in organic electroluminescent devices with a double heterostructure, journal, Aug. 6, 1990, pp. 531-533, American Institute of Physics.
(Continued)

*Primary Examiner* — Austin Murata
(74) *Attorney, Agent, or Firm* — Lewis Roca Rothgerber Christie LLP

(57) ABSTRACT

An organic light-emitting device including a compound represented by Formula 1 below:

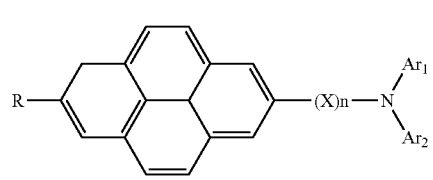

<Formula 1> wherein description of Formula 1 above is specified in the detailed description.

19 Claims, 1 Drawing Sheet

(51) Int. Cl.
*H01L 51/00* (2006.01)
*H01L 51/50* (2006.01)

(52) U.S. Cl.
CPC ...... *H01L 51/0061* (2013.01); *H01L 51/0067* (2013.01); *H01L 51/5072* (2013.01)

(56) References Cited

U.S. PATENT DOCUMENTS

| | | | |
|---|---|---|---|
| 7,051,949 B2 | 5/2006 | Aiyama | |
| 7,981,523 B2 | 7/2011 | Hosokawa et al. | |
| 2004/0053069 A1 | 3/2004 | Sotoyama et al. | |
| 2005/0200296 A1* | 9/2005 | Naugler, Jr. | H05B 37/02 315/150 |
| 2006/0251925 A1* | 11/2006 | Hosokawa | C07C 211/54 428/690 |
| 2007/0009758 A1* | 1/2007 | Funahashi | C07C 211/61 428/690 |
| 2007/0141396 A1* | 6/2007 | Chun | H01L 51/0072 428/690 |
| 2011/0235324 A1* | 9/2011 | Irion | A61B 1/0638 362/235 |
| 2011/0266530 A1* | 11/2011 | Park | H01L 51/0052 257/40 |

FOREIGN PATENT DOCUMENTS

| | | |
|---|---|---|
| JP | 10-017860 A | 1/1998 |
| JP | 11-087067 A | 3/1999 |
| JP | 2006-298793 A | 11/2006 |
| JP | 4060669 B2 | 3/2008 |
| KR | 10-2005-0107809 A | 11/2005 |
| KR | 10-0525408 B1 | 11/2005 |
| KR | 10-2011-0034977 A | 4/2011 |

OTHER PUBLICATIONS

Johansson, Nicklas et al., Solid-State Amplified Spontaneous Emission in Some Spiro-Type Molecules: A New Concept for the Design of Solid-State Lasing Molecules, journal, 1998, pp. 1136-1141, Wiley-VCH Verlag GmbH, D-69469 Weinheim, Advanced Materials.

Sakamoto, Youichi et al., Synthesis, Characterization, and Electron-Transport Property of Perfluorinated Phenylene Dendrimers, journal, Feb. 15, 2000, pp. 1832-1833, 2000 American Chemical Society.

Tang, C.W. et al., Organic electroluminescent diodes, journal, Sep. 21, 1987, pp. 913-915, American Institute of Physics.

Tao, Y.T. et al., Sharp green electroluminescence from 1H-pyrazolo[3,4-b]quinoline-based light-emitting diodes, journal, Feb. 8, 2012, pp. 1574-1577, American Institute of Physics.

Yamaguchi, Shigehiro et al., Diphenylamino-Substituted 2,5-Diarylsiloles for Single-Layer Organic Electroluminescent Devices, journal, Nov. 10, 2000, pp. 98-99, The Chemical Society of Japan.

* cited by examiner

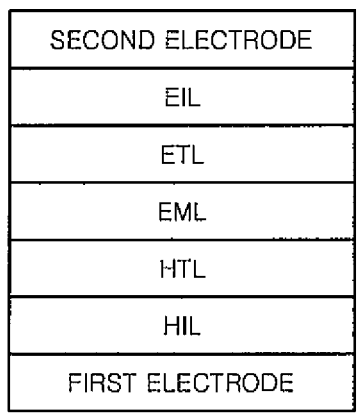

ORGANIC LIGHT-EMITTING DEVICE

CROSS-REFERENCE TO RELATED PATENT APPLICATION

This application claims priority to and the benefit of Korean Patent Application No. 10-2013-0009507, filed on Jan. 28, 2013, in the Korean Intellectual Property Office, the content of which is incorporated herein in its entirety by reference.

BACKGROUND

1. Field

The following description relates to an organic light-emitting device.

2. Description of the Related Art

Organic light-emitting divides (OLEDs), which are self-emitting devices, have advantages such as wide viewing angles, excellent contrast, quick response, high brightness, excellent driving voltage, and can provide multicolored images.

A typical device has a structure including a substrate, and an anode, a hole transport layer (HTL), an emission layer (EML), an electron transport layer (ETL) and a cathode which are sequentially stacked on the substrate. The HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons (carriers) recombine in the EML to generate excitons. When the excitons drop from an excited state to a ground state, light is emitted.

There has been an ongoing demand for a material having improved electrical stability, high charge-transfer or emission capability, a high glass transition temperature that is high enough to prevent crystallization, in regard to existing unimolecular materials.

SUMMARY

Aspects of the present invention are directed toward an organic light-emitting device (OLED) with high color purity, high efficiency, and long lifetime by including a compound according to an embodiment of the present invention as an organic light-emitting material.

According to an embodiment of the present invention, there is provided an OLED including a first electrode; a second electrode; and an organic layer that is interposed between the first electrode and the second electrode and includes an electron transport layer, wherein the electron transport layer includes a compound represented by Formula 1 below:

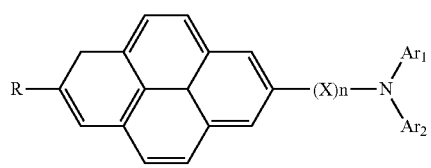

<Formula 1>

In Formula 1,

R may be a hydrogen atom, a deuterium atom, a halogen atom, a nitro group, a cyano group, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group;

$Ar_1$ and $Ar_2$ may each independently be a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group, wherein one of $Ar_1$ and $Ar_2$ is a functional group including a moiety that attracts an electron;

X may be a direct bond, a substituted or unsubstituted $C_6$-$C_{60}$ arylene group, a substituted or unsubstituted $C_2$-$C_{60}$ heteroarylene group, a substituted or unsubstituted $C_6$-$C_{60}$ condensed polycyclic group, or a divalent group with at least two of the arylene group, the heteroarylene group, and the condensed polycyclic group linked together; and n may be an integer of 0 to 10.

According to another embodiment of the present invention, there is provided a flat panel display device including the above-described OLED, wherein the first electrode of the OLED is electrically connected to a source electrode or a drain electrode of a thin-film transistor.

BRIEF DESCRIPTION OF THE DRAWINGS

The above and other features and advantages of the present invention will become more apparent by describing in detail exemplary embodiments thereof with reference to the attached drawings in which:

The drawing is a schematic view of a structure of an organic light-emitting device according to an embodiment of the present invention.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

According to an embodiment of the present invention, there is provided an organic light-emitting device (OLED) including a first electrode; a second electrode; and an organic layer that is interposed between the first electrode and the second electrode and includes an electron transport layer, wherein the electron transport layer includes a compound represented by Formula 1 below:

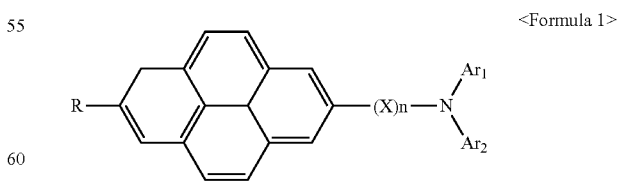

<Formula 1>

In Formula 1,

R may be a hydrogen atom, a deuterium atom, a halogen atom, a nitro group, a cyano group, a substituted or unsubstituted $C_1$-$C_{60}$ alkyl group, a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group;

$Ar_1$ and $Ar_2$ may each independently be a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group, wherein one of $Ar_1$ and $Ar_2$ is a functional group including a moiety that attracts an electron;

X may be a direct bond, a substituted or unsubstituted $C_6$-$C_{60}$ arylene group, a substituted or unsubstituted $C_2$-$C_{60}$ heteroarylene group, or a substituted or unsubstituted $C_6$-$C_{60}$ condensed polycyclic group, or a divalent group with at least two of the arylene group, the heteroarylene group, and the condensed polycyclic group linked together; and n may be an integer of 0 to 10.

The compound of Formula 1 according to an embodiment of the present invention is suitable as a hole transporting material, and an OLED including the compound of Formula 1 may have characteristics such as high efficiency, long lifetime, and the like.

The compound of Formula 1 will now be described in more detail.

In some embodiments, the moiety attracting an electron may be selected from the group consisting of —F;

—CN;

a $C_1$-$C_{60}$ alkyl group substituted with at least one —F;

a $C_2$-$C_{60}$ heteroaryl group; and a $C_2$-$C_{60}$ heteroaryl group substituted at least one of a deuterium atom, —F, Cl, —Br, —I, —CN, a hydroxyl group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_5$-$C_{60}$ aryl group, or a $C_2$-$C_{60}$ heteroaryl group.

In some embodiments, in Formula 1, R may be a hydrogen atom, a deuterium atom, a $C_1$-$C_{30}$ alkyl group, or one of the groups represented by Formulas 2a to 2e below:

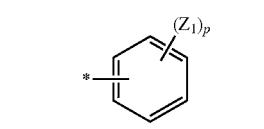

2a

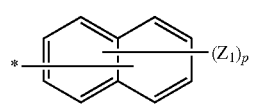

2b

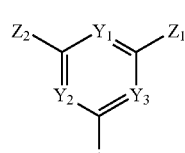

2c

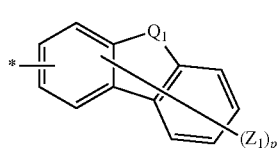

2d

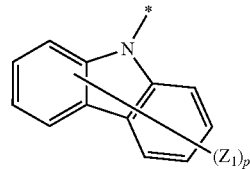

2e

In Formulas 2a to 2e, $Q_1$ may be a linking group represented by —C($R_{30}$)($R_{31}$)—, —O—, —S—, or —N($R_{32}$)—;

$Y_1$ to $Y_3$ may each independently be CH or N;

$Z_1$, $Z_2$, $R_{30}$, $R_{31}$, and $R_{32}$ may each independently be a hydrogen atom, a deuterium atom, a substituted or unsubstituted $C_1$-$C_{20}$ alkyl group, a substituted or unsubstituted $C_5$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano atom, a nitro group, a hydroxyl group, or a carboxyl group;

p may be an integer of 1 to 8; and

* is a binding site.

In some embodiments, in Formula 1, $Ar_1$ and $Ar_2$ may each independently be one of the groups represented by Formulas 3a to 3e below:

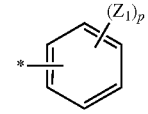

3a

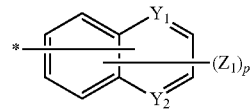

3b

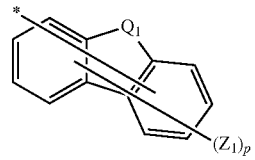

3c

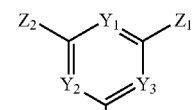

3d

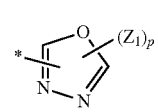

3e

In Formulas 3a to 3e, $Y_1$ to $Y_3$ may each independently be CH or N;

$Q_2$ may be a linking group represented by —C($R_{30}$)($R_{31}$)—, —S—, or —O—;

$Z_1$, $Z_2$, $R_{30}$, and $R_{31}$ may each independently be a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano atom, a nitro group, a hydroxyl group, or a carboxyl group;

p may be an integer of 1 to 7, and

* is a binding site.

In some embodiments, in Formula 1, X may be one of the groups represented by Formulas 4a to 4c below:

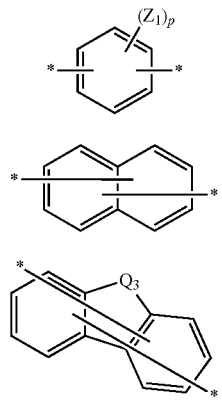

In Formulas 4a to 4c, $Q_3$ may be a linking group represented by —C($R_{30}$)($R_{31}$)—, —S—, or —O—;

$Z_1$, $R_{30}$, and $R_{31}$ may each independently be a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano atom, a nitro group, a hydroxyl group, or a carboxyl group;

p may be an integer of 1 to 4; and

* is a binding site.

Hereinafter, substituents described with reference to the Formulas will now be described in more detail. (In this regard, the numbers of carbons in substituents are presented only for illustrative purposes and do not limit the characteristics of the substituents. The substituents not defined herein are defined as substituents generally known to one of ordinary skill in the art).

The unsubstituted $C_1$-$C_{60}$ alkyl group used herein may be linear or branched. Non-limiting examples of the unsubstituted $C_1$-$C_{60}$ alkyl group are methyl, ethyl, propyl, iso-butyl, sec-butyl, pentyl, iso-amyl, hexyl, heptyl, octyl, nonanyl, and dodecyl. At least one hydrogen atom of the unsubstituted $C_1$-$C_{60}$ alkyl group may be substituted with a deuterium atom, a halogen atom, a hydroxyl group, a nitro group, a cyano atom, an amino group, an amidino group, a hydrazine, a hydrazone, a carboxyl group or a salt thereof, a sulfonic acid group or a salt thereof, a phosphoric acid group or a salt thereof, or a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, or a $C_4$-$C_{16}$ heteroaryl group (hereinafter, substituents of any substitution in the present specification may be the same as those described above for alkyl groups).

The unsubstituted $C_2$-$C_{60}$ alkenyl group may indicate an unsaturated alkyl group having at least one carbon-carbon double bond in the center or at a terminal of the alkyl group. Examples of the unsubstituted $C_2$-$C_{60}$ alkenyl group are an ethenyl group, a propenyl group, a butenyl group, and the like. At least one hydrogen atom of the unsubstituted $C_2$-$C_{60}$ alkenyl group may be substituted with a substituent described above in conjunction with the alkyl group.

The unsubstituted $C_2$-$C_{60}$ alkynyl group may indicate an alkyl group having at least one carbon-carbon triple bond in the center or at a terminal of the alkyl group. Examples of the unsubstituted $C_2$-$C_{60}$ alkynyl group are acetylene, propylene, phenylacetylene, naphthylacetylene, isopropylacetylene, t-butylacetylene, diphenylacetylene, and the like. At least one hydrogen atom of the unsubstituted $C_2$-$C_{60}$ alkynyl group may be substituted with a substituent described above in conjunction with the alkyl group.

The unsubstituted $C_3$-$C_{60}$ cycloalkyl group may indicate a $C_{30}$-$C_{60}$ cyclic alkyl group, wherein at least one hydrogen atom of the unsubstituted $C_3$-$C_{60}$ cycloalkyl group may be substituted with a substituent described above in conjunction with the $C_1$-$C_{60}$ alkyl group.

The unsubstituted $C_1$-$C_{60}$ alkoxy group may indicate a group having a structure of —OA (wherein A is an unsubstituted $C_1$-$C_{60}$ alkyl group as described above). Non-limiting examples of the unsubstituted $C_1$-$C_{60}$ alkoxy group are a methoxy group, an ethoxy group, a propoxy group, an isopropyloxy group, a butoxy group, a pentoxy group, and the like. At least one hydrogen atom of the unsubstituted $C_1$-$C_{60}$ alkoxy group may be substituted with a substituent described above in conjunction with the alkyl group.

A $C_7$-$C_{60}$ aralkyl group may indicate an aryl group linked to an alkyl group. Examples of a substituted or unsubstituted aralkyl group are benzyl, 1-phenylethyl, 2-phenylethyl, 1-phenylisopropyl, 2-phenylisopropyl, phenyl-t-butyl, α-naphtylmethyl, 1-α-naphtylethyl, 2-α-naphtylethyl, 1-α-naphtylisopropyl, 2-α-naphtylisopropyl, β-naphtylmethyl, 1-β-naphtylethyl, 2-β-naphtylethyl, 1-β-naphtylisopropyl, 2-β-naphtylisopropyl, 1-pyrrolylmethyl, 2-(1-pyrrolyl) ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, 1-chloro-2-phenylisopropyl, or the like.

A $C_1$-$C_{60}$ alkoxycarbonyl group may be represented by —COOZ, and examples of Z are methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, or the like.

The unsubstituted $C_6$-$C_{60}$ aryl group may indicate a carbocyclic aromatic system including at least one ring. At least two rings may be fused to each other or linked to each other by a single bond. The term 'aryl' used herein may refer to an aromatic system such as phenyl, naphtyl, or antracenyl. Also, at least one hydrogen atom of the unsubstituted $C_6$-$C_{60}$ aryl group may be substituted with a substituent described above in conjunction with the unsubstituted $C_1$-$C_{60}$ alkyl group.

Examples of the substituted or unsubstituted $C_6$-$C_{60}$ aryl group are a phenyl group, a $C_1$-$C_{10}$ alkylphenyl group (i.e., an ethylphenyl group), a halophenyl group (i.e., an o-, m-, and p-fluorophenyl group or a dichlorophenyl group), a cyanophenyl group, a dicyanophenyl, a trifluoromethoxyphenyl group, a biphenyl group, a halobiphenyl group, a cyanobiphenyl group, a $C_1$-$C_{10}$ alkylbiphenyl group, a $C_1$-$C_{10}$ alkoxybiphenyl group, an o-, m-, and p-tolyl group, an o-, m-, and p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphtyl group, a halonaphtyl group (i.e., a fluoronaphtyl group), a $C_1$-$C_{10}$ alkylnaphtyl group (i.e., a methylnaphtyl group), a $C_1$-$C_{10}$ alkoxynaphtyl group (i.e., a methoxynaphtyl group), a cyanonaphtyl group, an antracenyl group, an azulenyl group, a heptalenyl group, an acenaphtylenyl group, a phenalenyl group, a fluorenyl group, an antraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphtylenyl group, a heptaphenyl group, a heptacenyl group, a pyranthrenyl group, an ovalenyl group, or the like.

The unsubstituted $C_2$-$C_{60}$ heteroaryl group used herein may include one, two, three or four hetero atoms selected from N, O, P, and S. At least two rings may be fused to each other or linked to each other by a single bond. Examples of the unsubstituted $C_2$-$C_{60}$ heteroaryl group are a 1,2,4,5-tetrazinyl group, a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indolyl group, a quinolyl group, an isoquinolyl group, and a dibenzothiophene group, and the like. In addition, at least one hydrogen atom of the unsubstituted $C_2$-$C_{60}$ heteroaryl group may be substituted with a substituent described above in conjunction with the unsubstituted $C_1$-$C_{60}$ alkyl group.

The unsubstituted $C_6$-$C_{60}$ aryloxy group is a group represented by —$OA_1$, wherein $A_1$ may be a $C_6$-$C_{60}$ aryl group. Examples of the aryloxy group are a phenoxy group, and the like. At least one hydrogen atom of the unsubstituted $C_5$-$C_{60}$ aryloxy group may be substituted with a substituent described above in conjunction with the unsubstituted $C_1$-$C_{60}$ alkyl group.

The unsubstituted $C_6$-$C_{60}$ arylthio group is a group represented by —$SA_1$, wherein $A_1$ may be a $C_6$-$C_{60}$ aryl group. Examples of the arylthio group are a benzenethio group, a naphthylthio group, and the like. At least one hydrogen atom of the unsubstituted $C_6$-$C_{60}$ arylthio group may be substituted with a substituent described above in conjunction with the unsubstituted $C_1$-$C_{60}$ alkyl group.

The unsubstituted $C_6$-$C_{60}$ condensed polycyclic group used herein may refer to a substituent including at least two rings, wherein at least one aromatic ring and at least one non-aromatic ring are fused to each other, or may refer to a substituent having an unsaturated group in a ring that may not form a conjugate structure. The unsubstituted $C_6$-$C_{60}$ condensed polycyclic group is distinct from an aryl group or a heteroaryl group in terms of being non-aromatic.

A condensed polycyclic group including N, O, or S may refer to a substituent including N, O, or S, and at least two rings, wherein at least one aromatic ring and at least one non-aromatic ring are fused to each other, or may refer to a substituent having an unsaturated group in a ring that may not form a conjugate structure. The condensed polycyclic group is non-aromatic in general.

At least one hydrogen atom of the unsubstituted $C_6$-$C_{60}$ condensed polycyclic group or the condensed polycyclic group including N, O, or S may be substituted with the same substituents of the $C_1$-$C_{60}$ alkyl group as described above.

The compound of Formula 1 may be one of the following compounds below, but is not limited thereto:

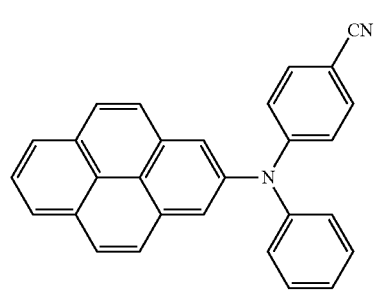

1

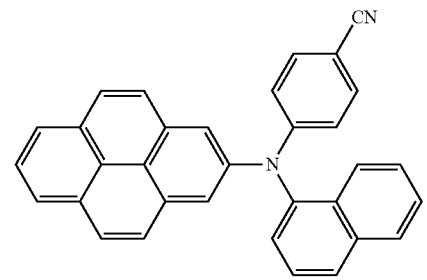

2

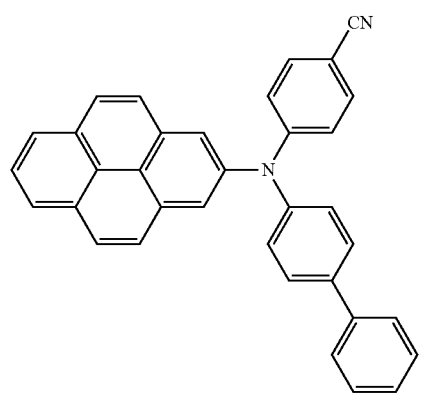

3

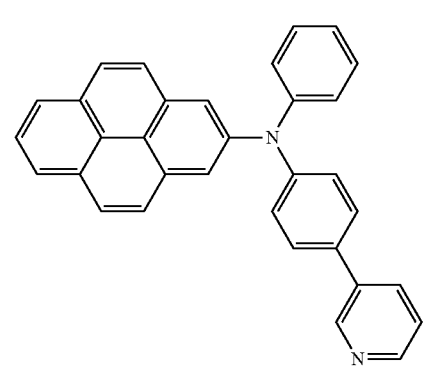

4

-continued
| | |
|---|---|
| 5 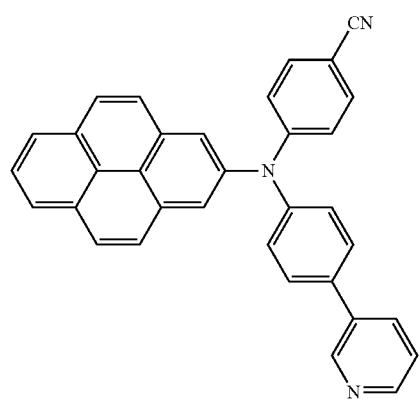 | 6 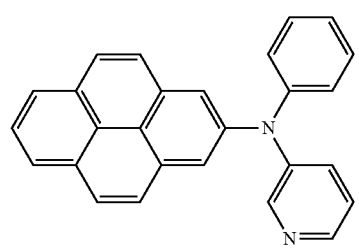 |
| 7 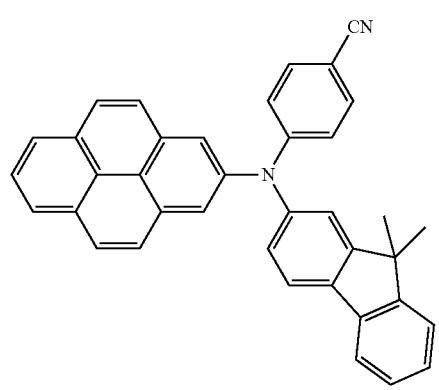 | 8 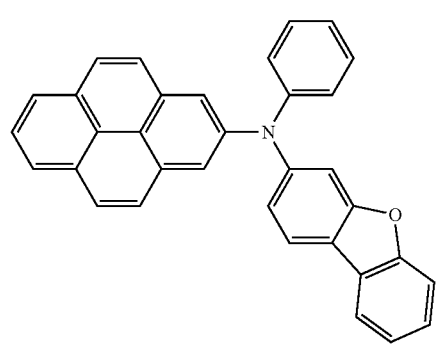 |
| 9 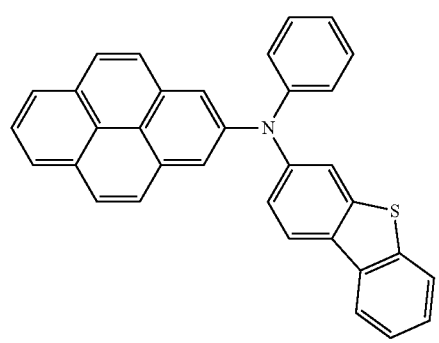 | 10 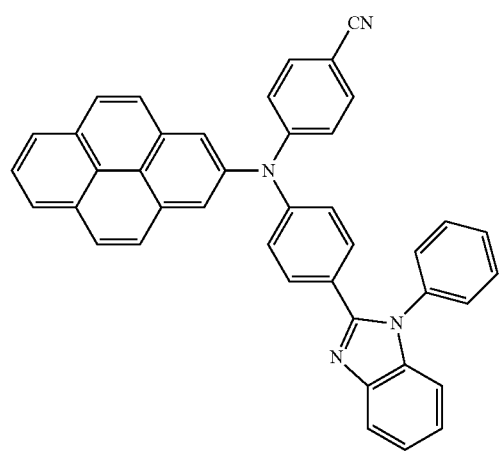 |
| 11 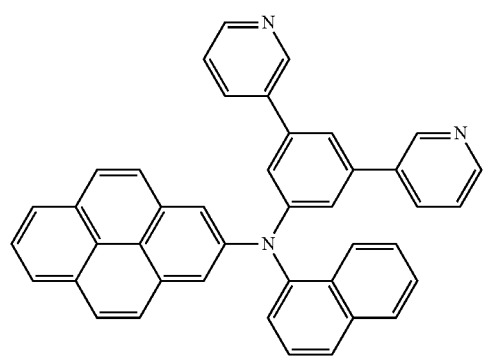 | 12 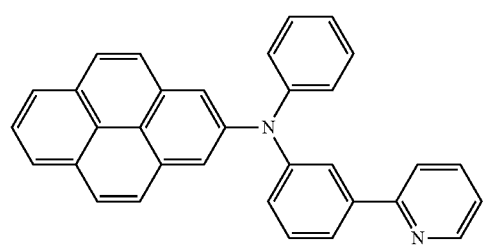 |

-continued
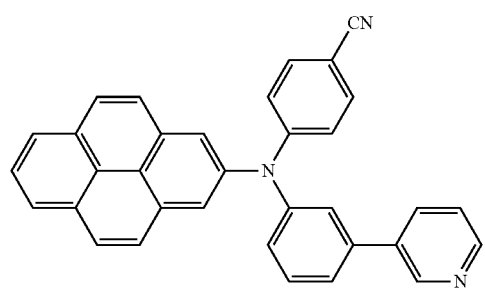
13
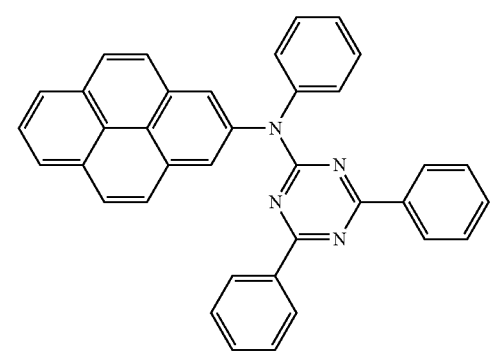
14
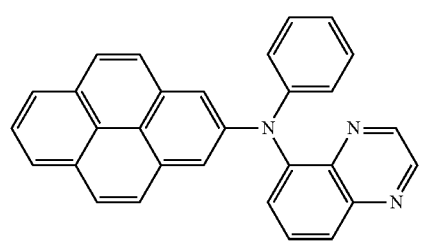
15
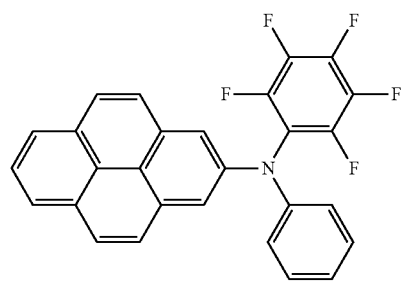
16
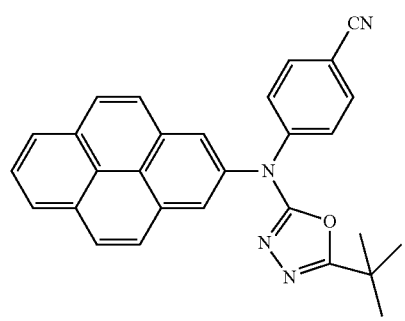
17
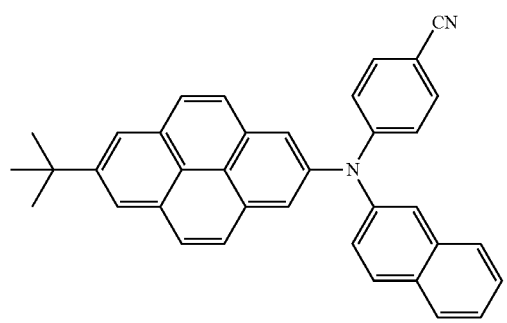
18
19
20
21
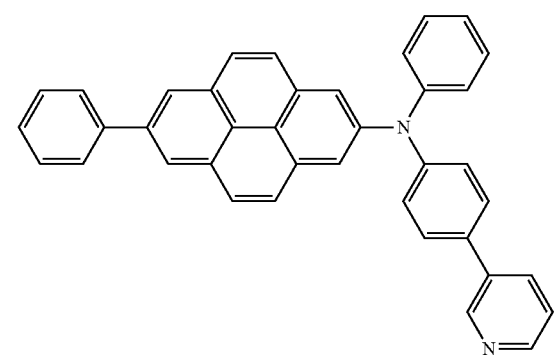
22

-continued
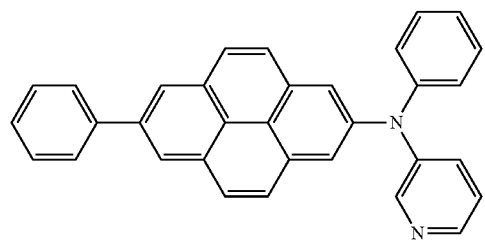
23
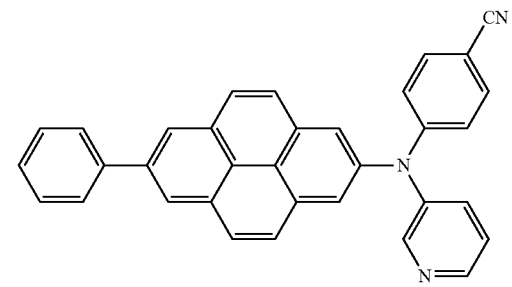
24
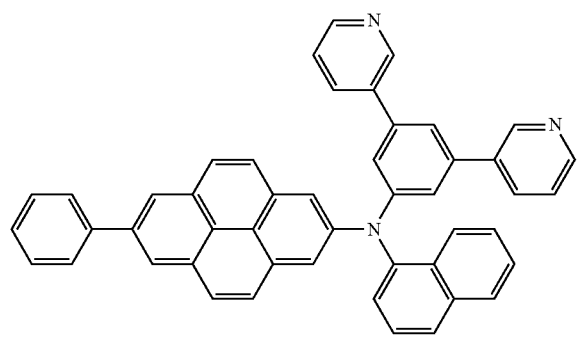
25
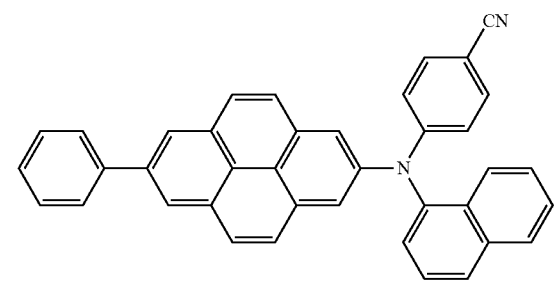
26
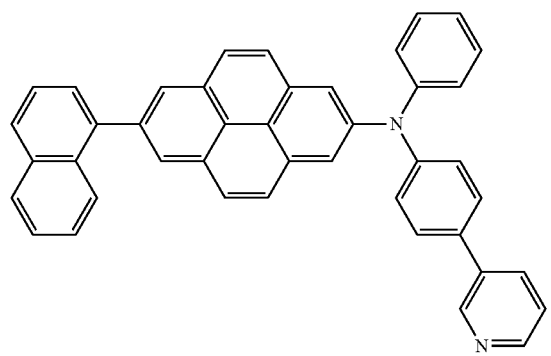
27
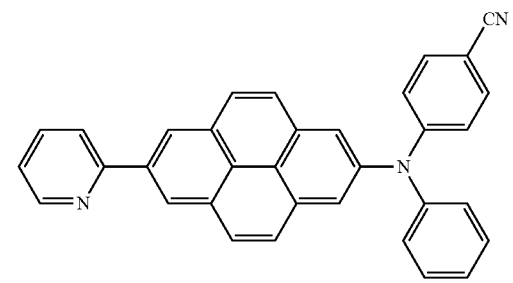
28
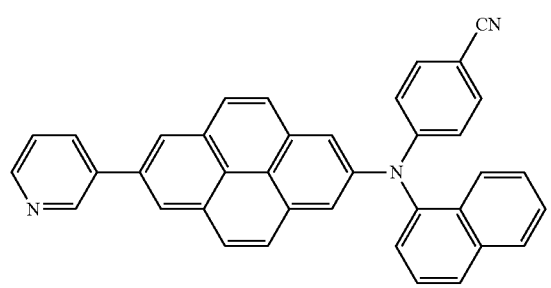
29
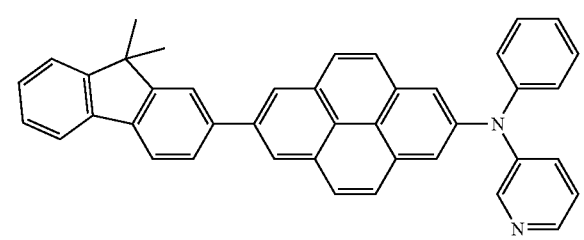
30
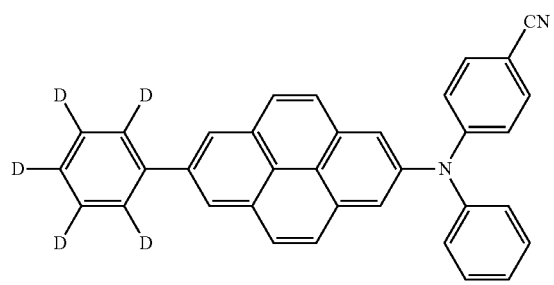
31
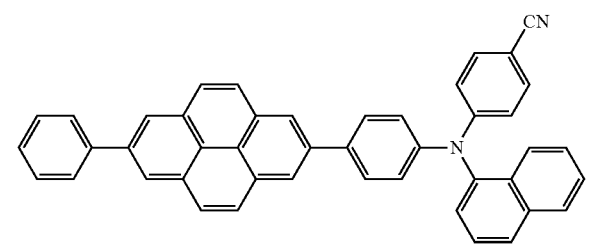
32

-continued
33
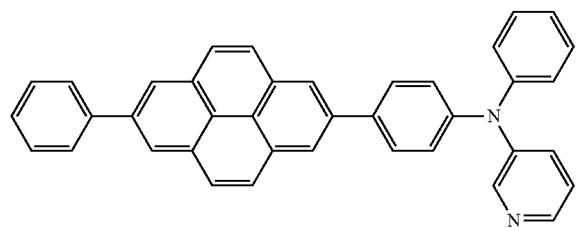
34
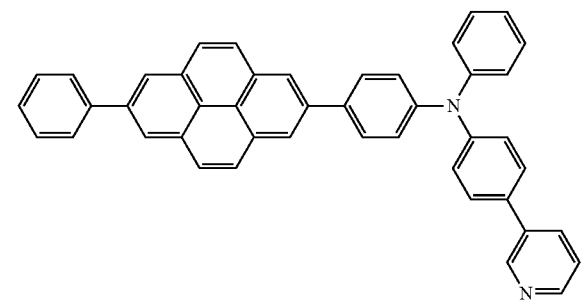
35
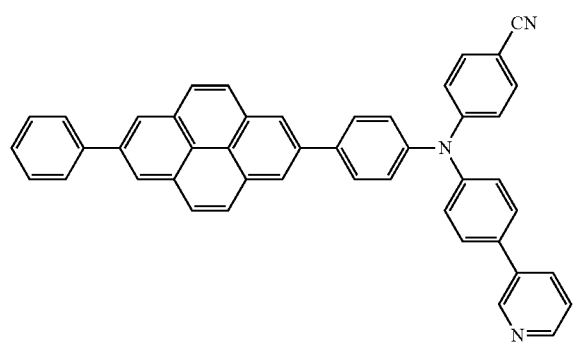
36
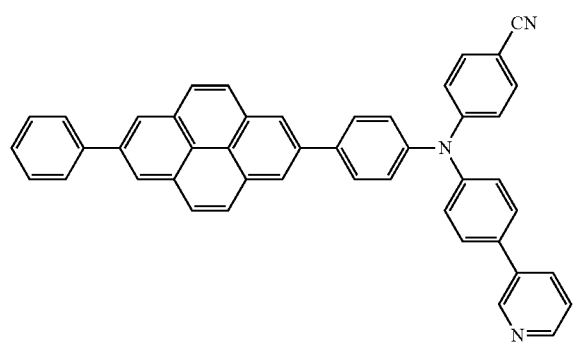
37
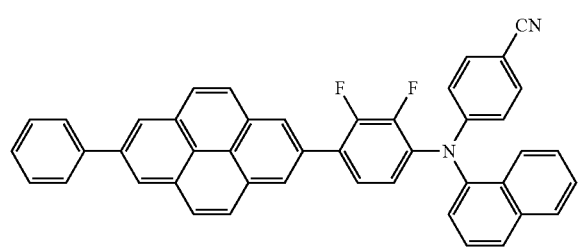
38
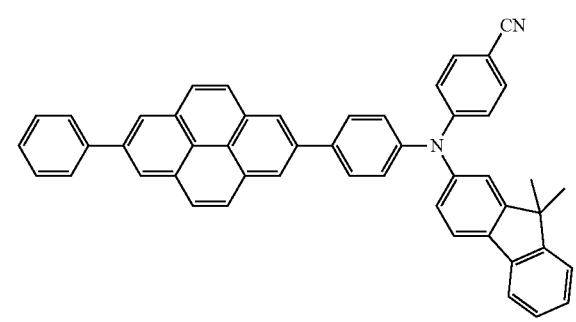
39
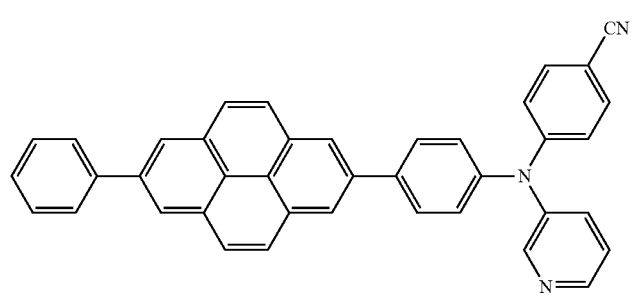
40
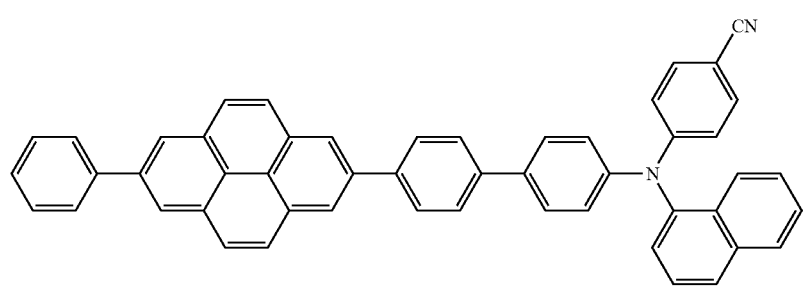

-continued
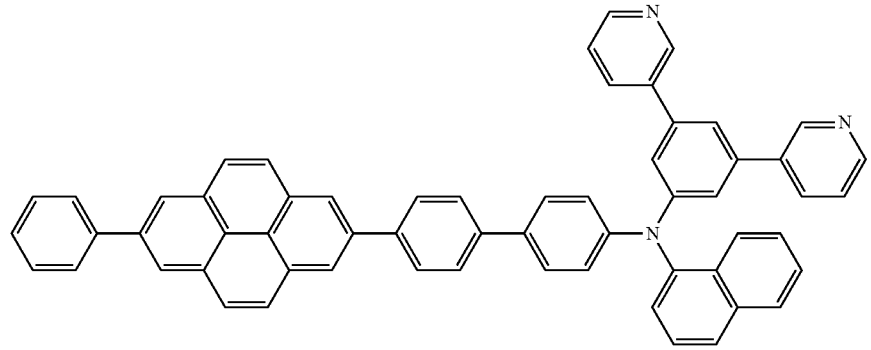
41
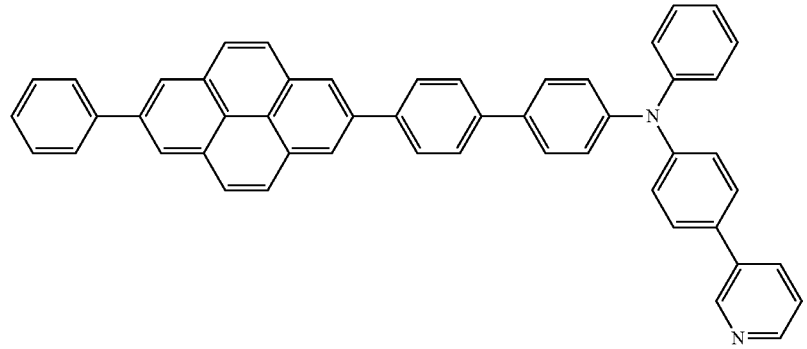
42
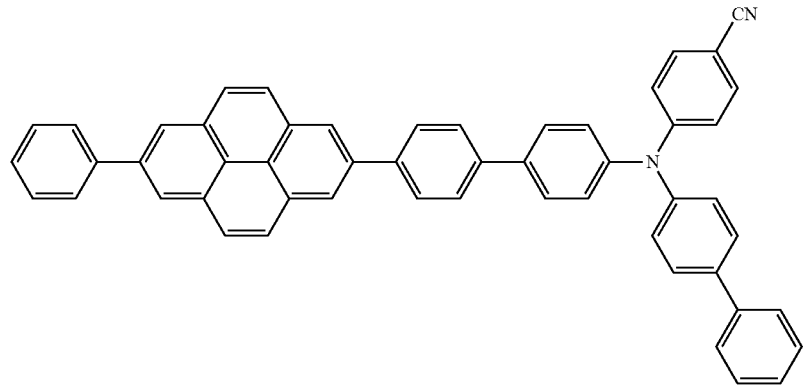
43
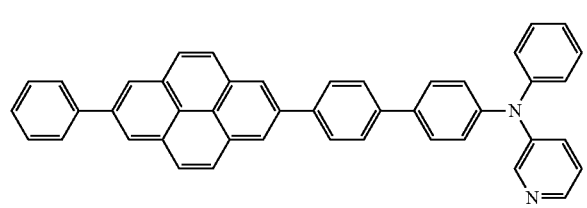
44
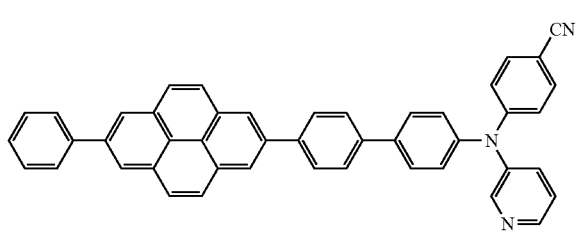
45
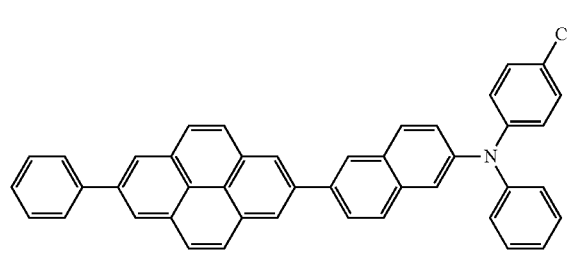
46
47

-continued
48
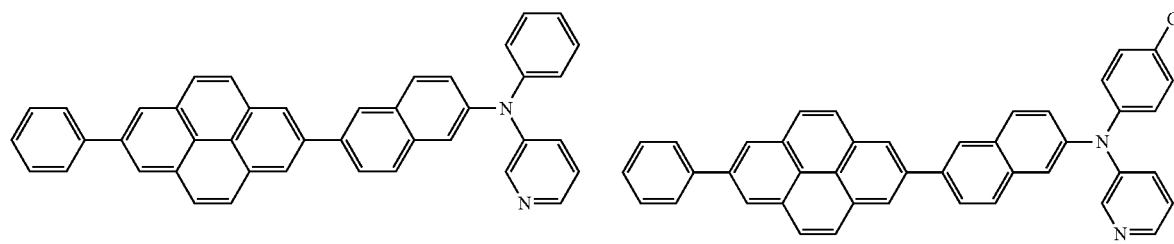
49
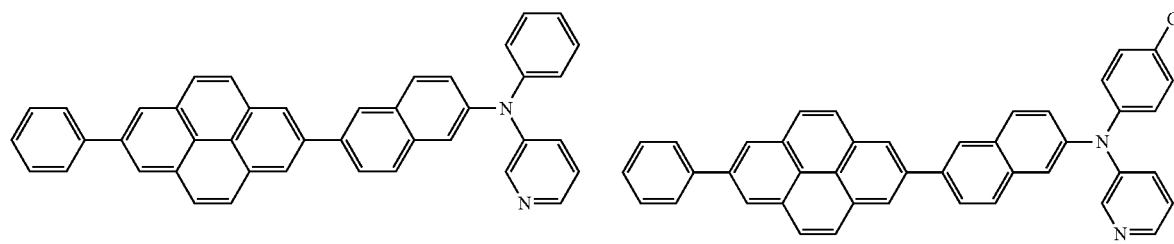
50
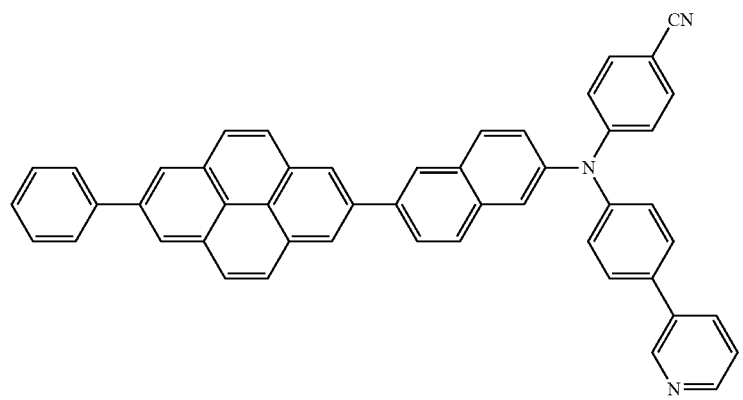
51
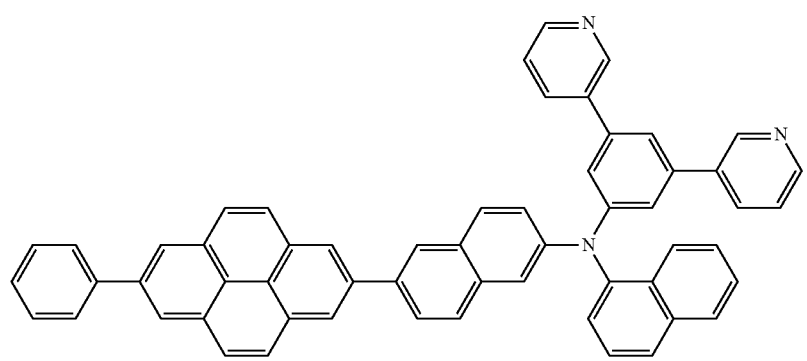
52
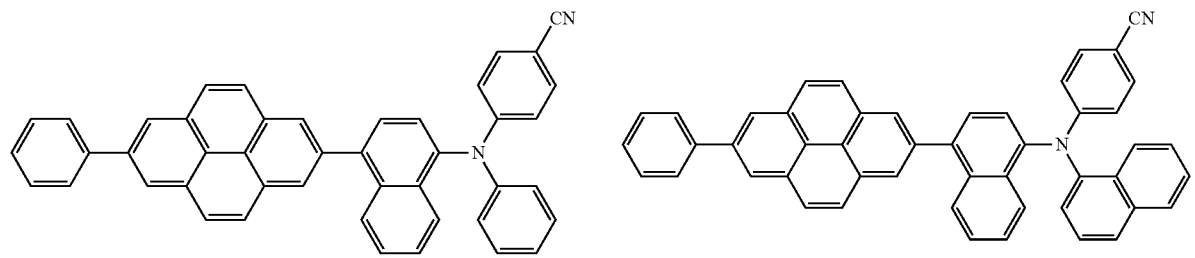
53
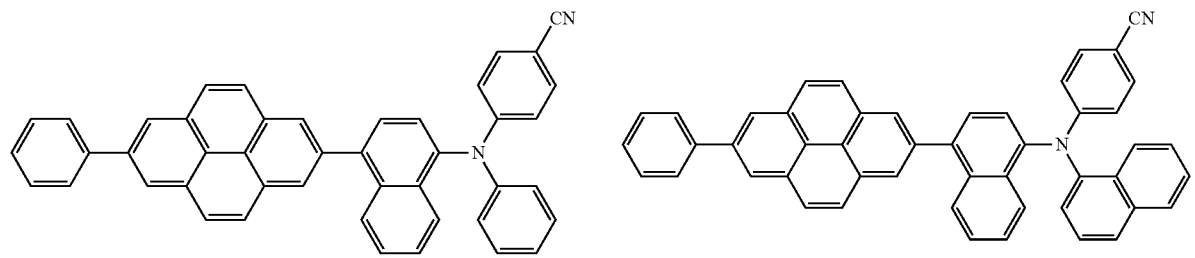
54
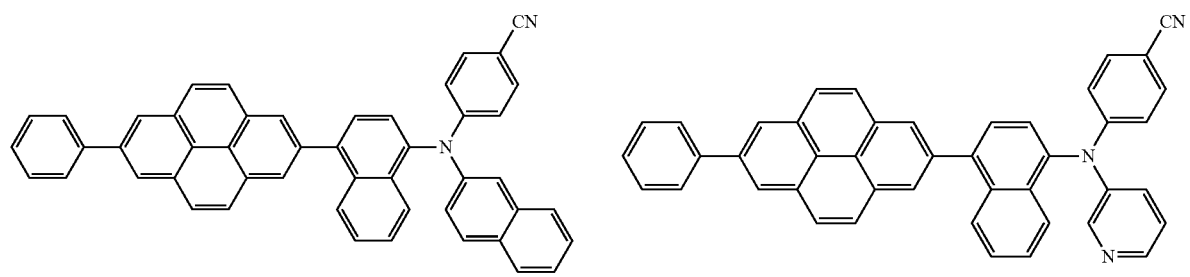
55
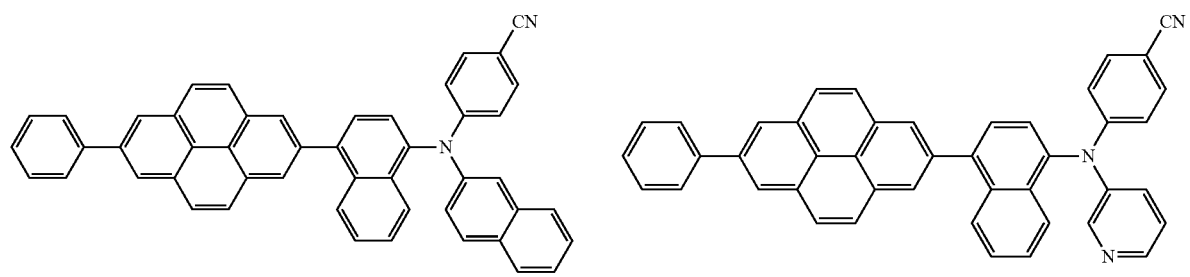

-continued
56
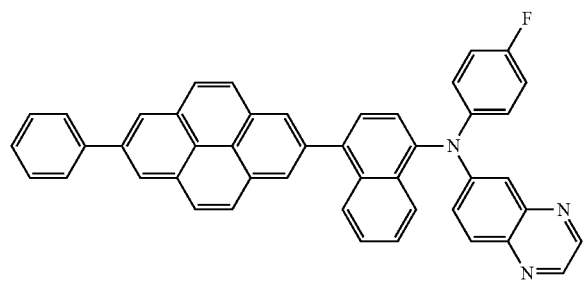
57
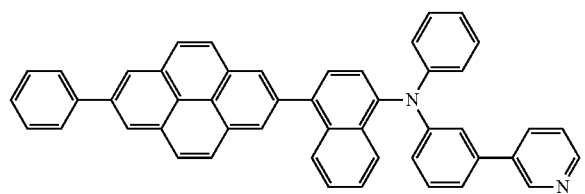
58
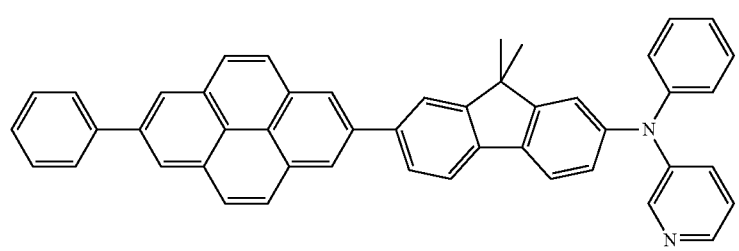
59
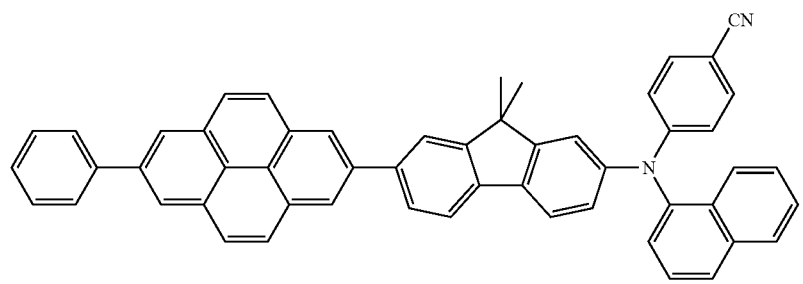
60
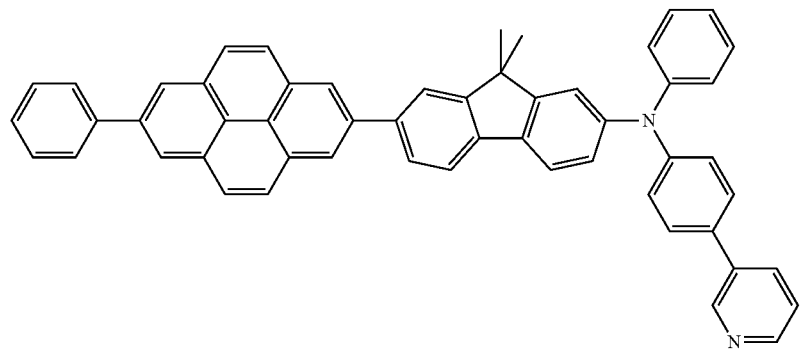
61
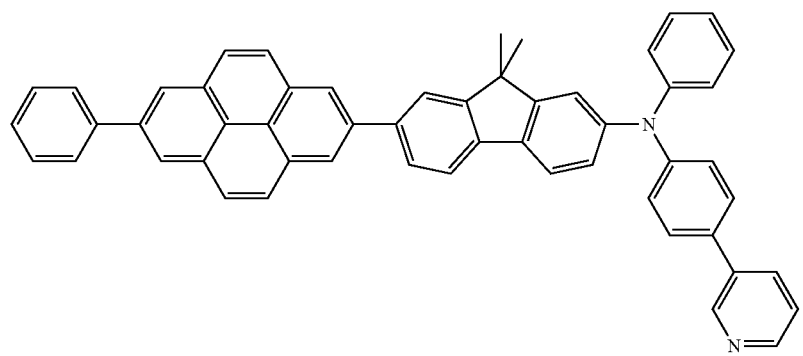

62
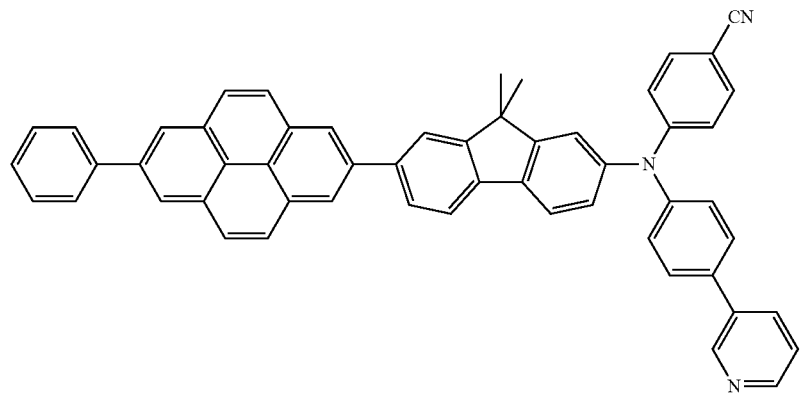
63
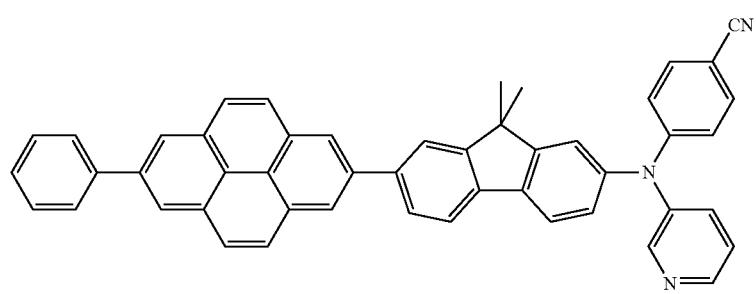
64
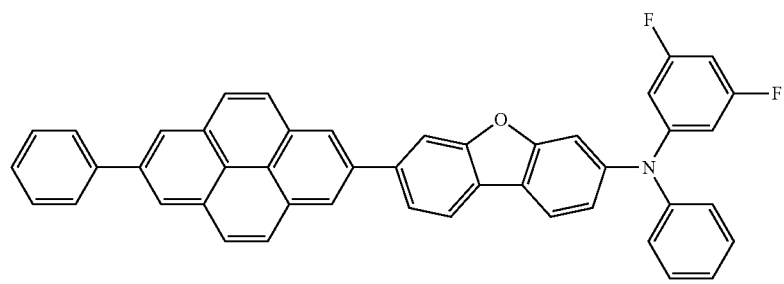
65
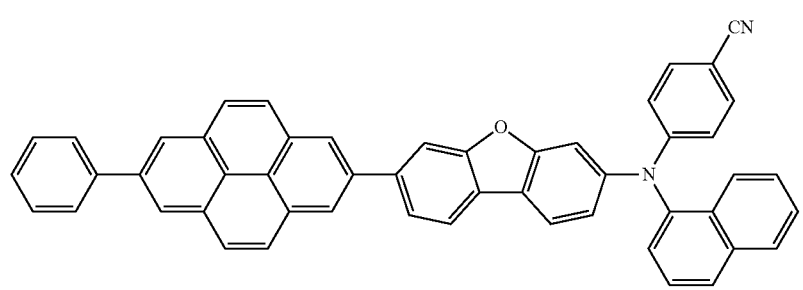
66
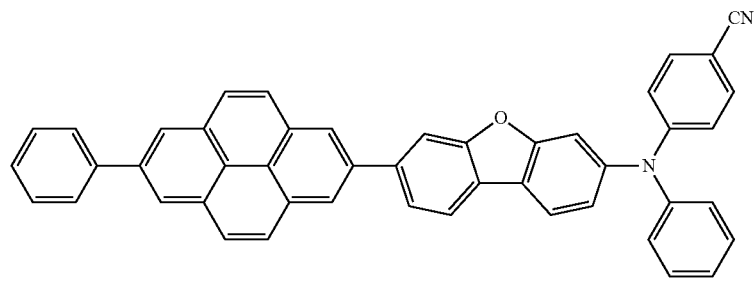

-continued
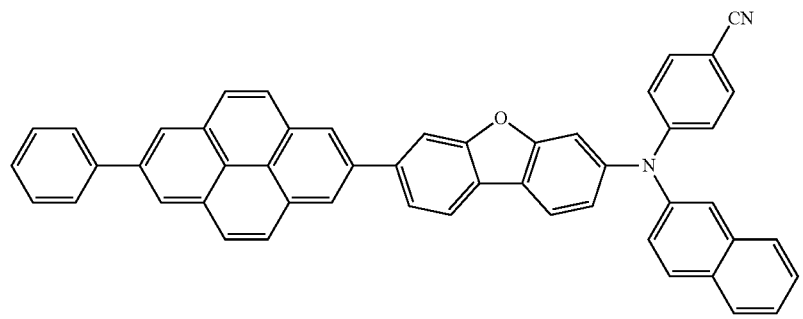
67
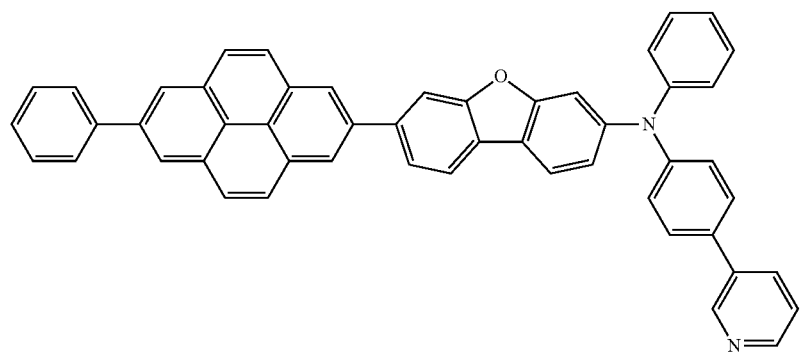
68
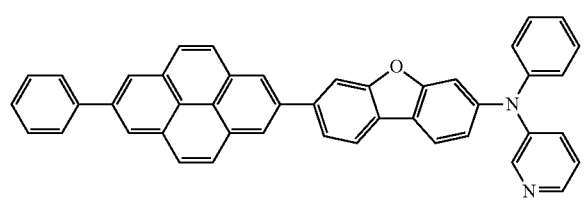
69
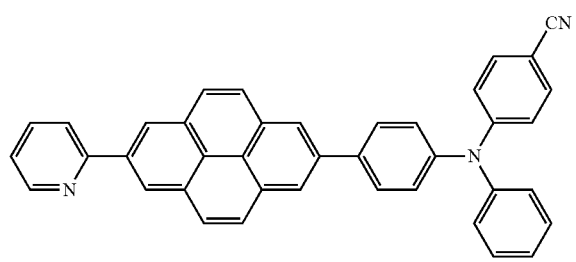
70
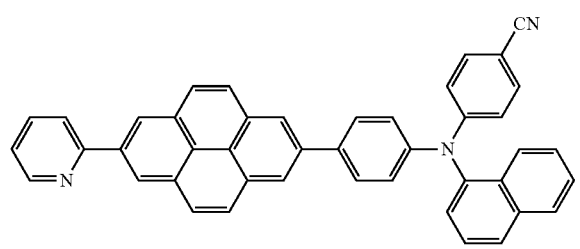
71
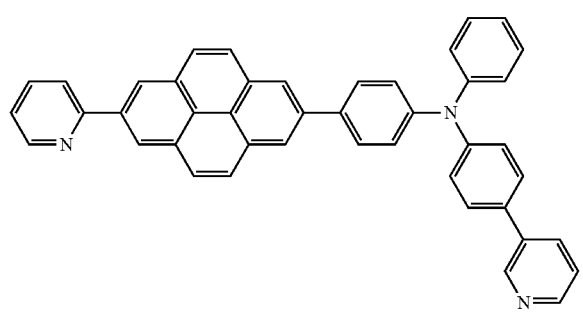
72
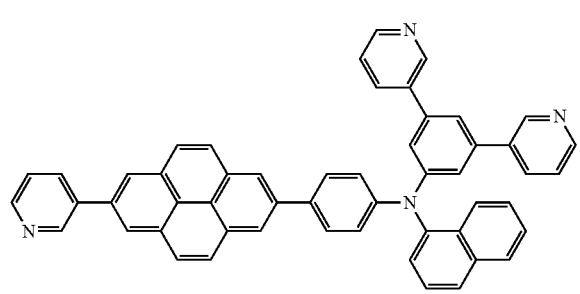
73
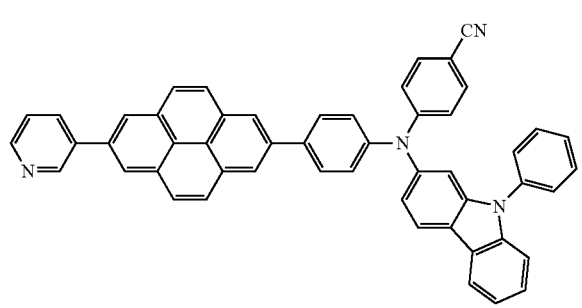
74

-continued
75
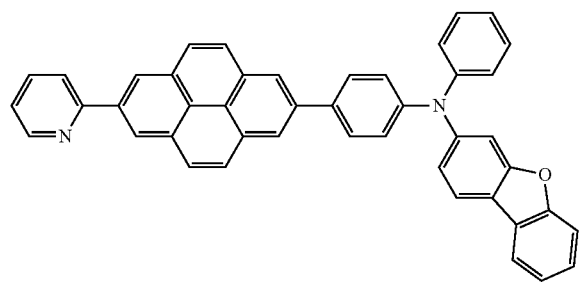
76
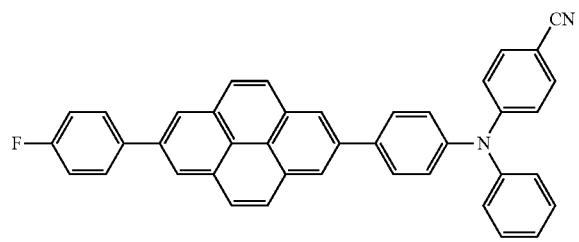
77
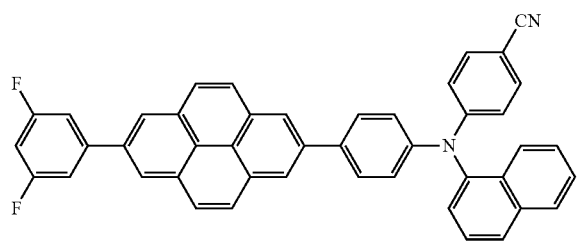
78
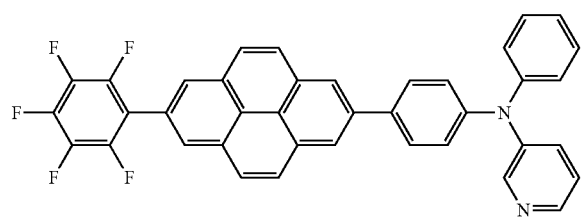
79
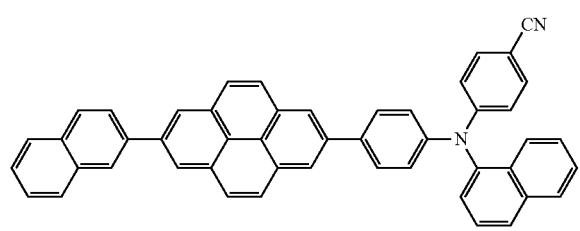
80
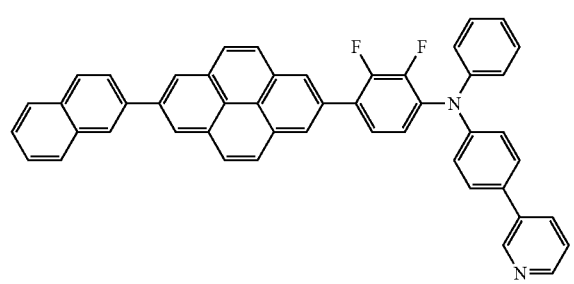
81
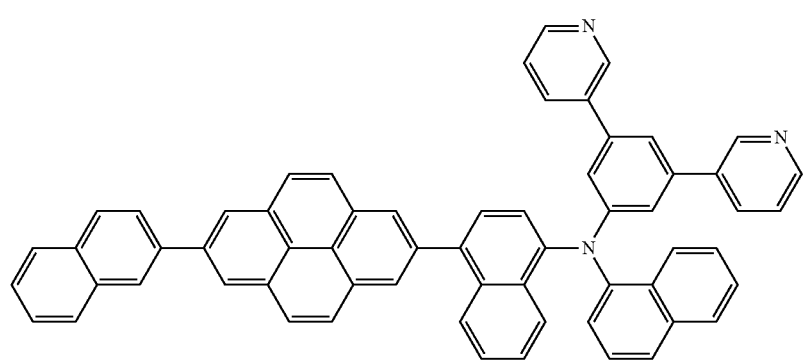
82
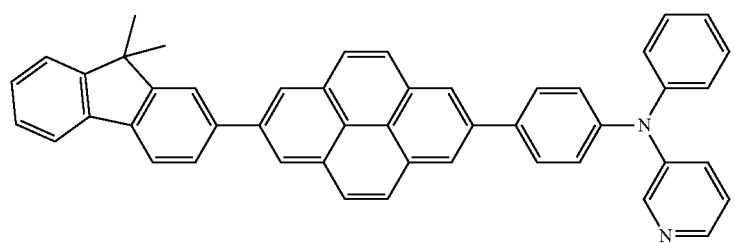

83
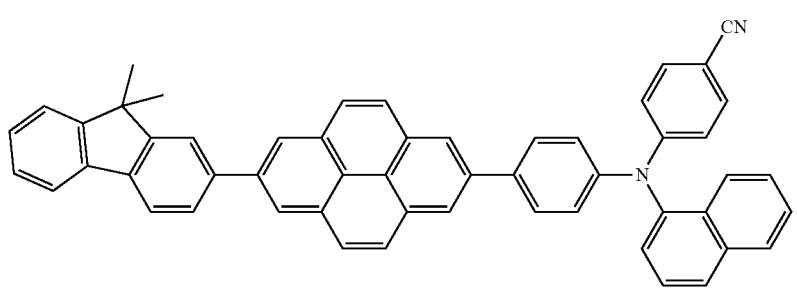
84
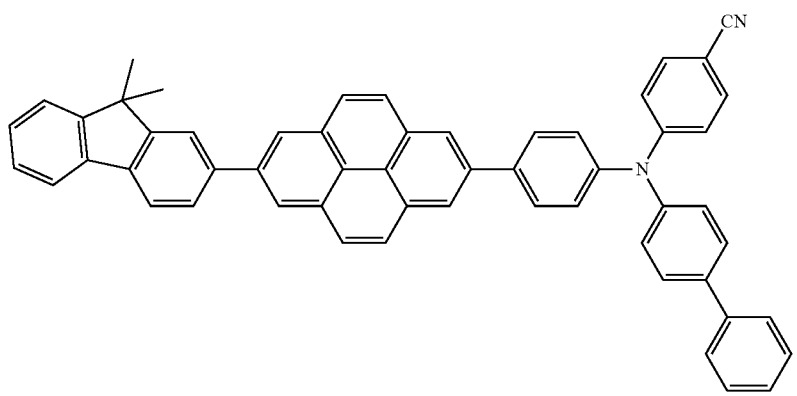
85
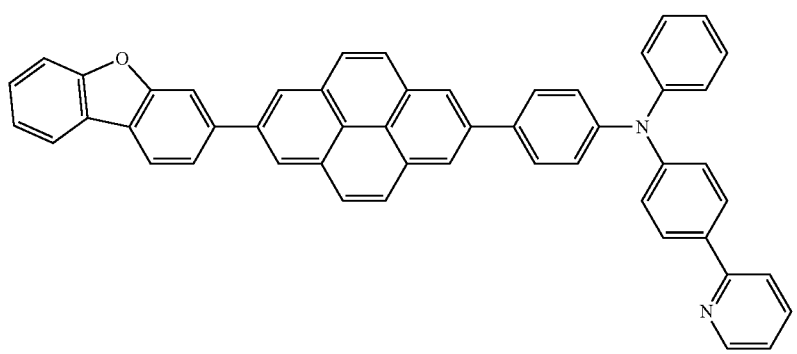
86
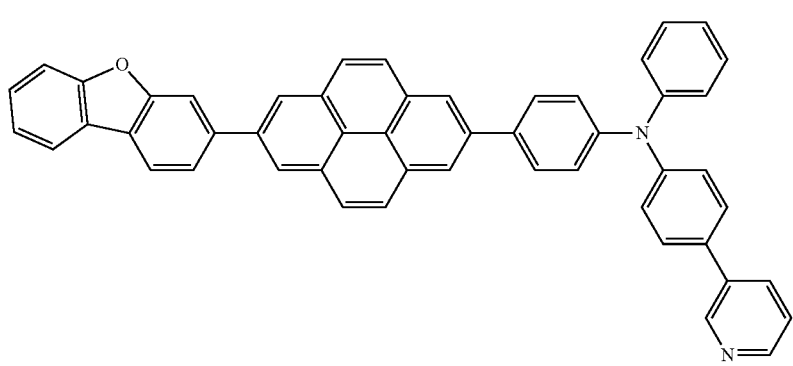
87
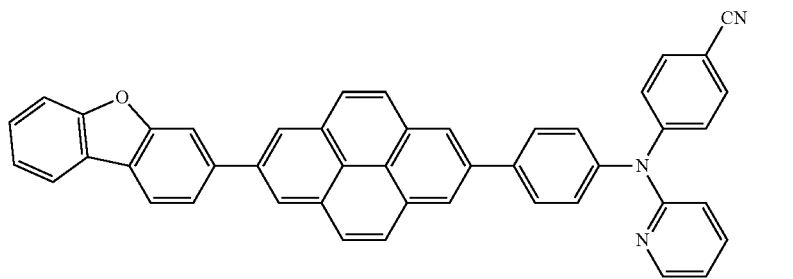

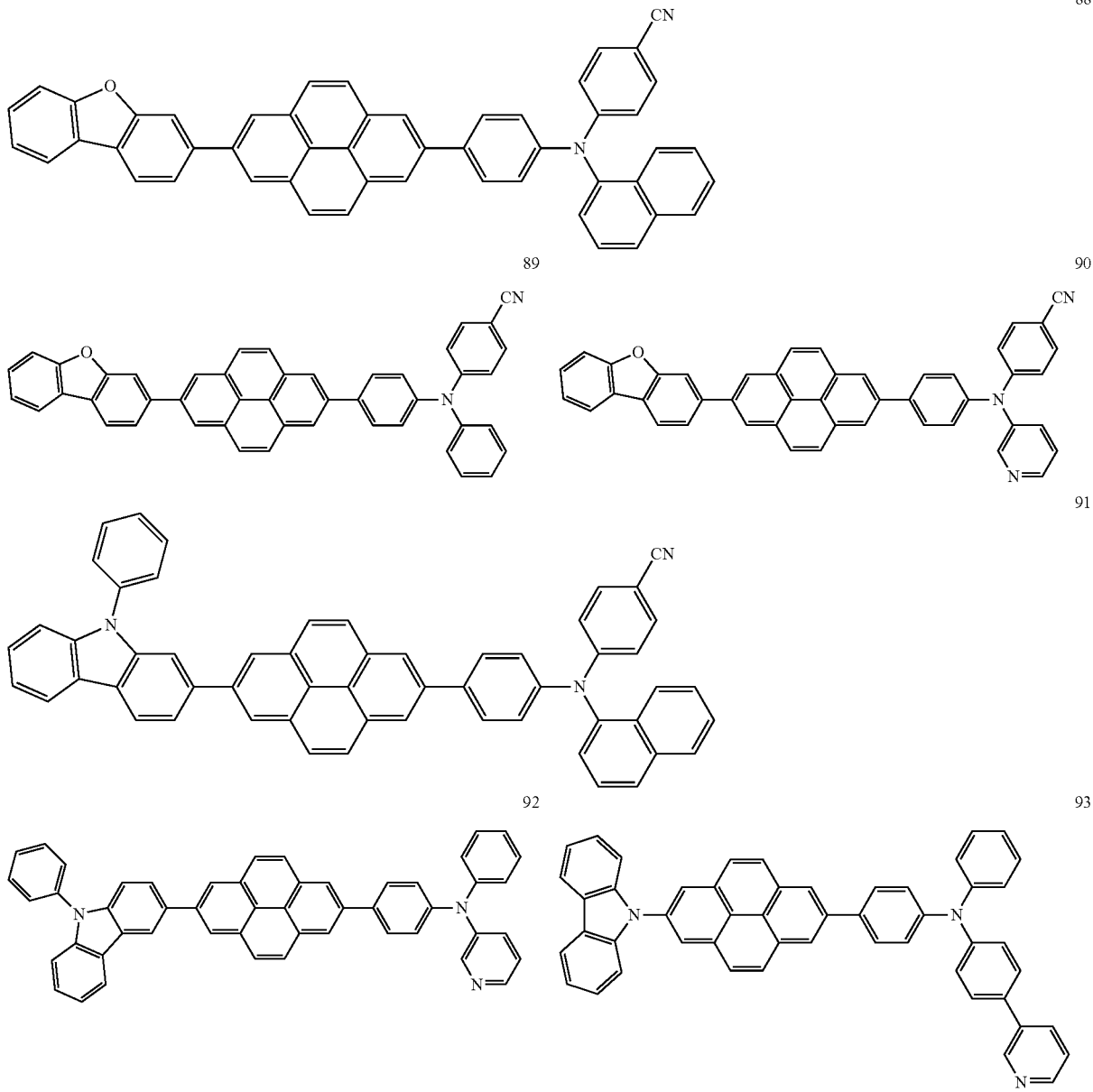

Another aspect of the present invention provides an OLED including an organic layer. The organic layer may include at least one layer from among a hole injection layer (HIL), a hole transport layer (HTL), a functional layer having both hole injection and hole transport capabilities (hereinafter, a "H-functional layer"), a buffer layer, an electron blocking layer (EBL), an emission layer (EML), a hole blocking layer (HBL), an electron transport layer (ETL), an electron injection layer (EIL), and a functional layer having both electron injection and electron transport capabilities (hereinafter, an "E-functional layer").

In particular, the organic layer may be used as an ETL.

In some embodiments, the OLED may include an EIL, an ETL, an EML, a HIL, a HTL, or an H-functional layer having both hole injection and hole transport capabilities. The EIL, the ETL, and the E-functional layer having both electron injection and electron transport capabilities may include the compound of Formulas above having electron injection and/or electron transport capabilities, and the EML may include the compound of Formulas above and an antracene-based compound, an arylamine-based compound, or a styryl-based compound.

In some other embodiments, the OLED may include an EIL, an ETL, an EML, a HIL, a HTL, or a H-functional layer having both hole injection and transport capabilities, wherein at least one of a red emission layer, a green emission layer, a blue emission layer, and a white emission layer of the emission layer may include a phosphorescent compound, and at least one of the HIL, HTL, and H-functional layer having both hole injection and hole transport capabilities may include a charge-generating material. In some embodiments, the charge-generating material may be a p-dopant, and the p-dopant may be a quinine derivative, a metal oxide, or a cyano group-containing compound, but is not limited thereto.

In some embodiments, the organic layer may include an ETL, and the ETL may include an electron-transporting organic compound and a metal complex. The metal complex may be a lithium (Li) complex.

The term "organic layer" used herein may refer to a single layer and/or a multi-layer interposed between the first electrode and the second electrode of the OLED.

The drawing is a schematic view of a structure of an OLED according to an embodiment of the present invention. Hereinafter, a structure of an OLED according to an embodiment of the present invention and a method of manufacturing the same will now be described with reference to the drawing.

A substrate may be any substrate that is used in existing OLEDs. In some embodiments, the substrate may be a glass substrate or a transparent plastic substrate with strong mechanical strength, thermal stability, transparency, surface smoothness, ease of handling, and water resistance.

The first electrode may be formed by depositing or sputtering a first electrode-forming material on the substrate. When the first electrode is an anode, a material having a high work function may be used as the first electrode-forming material to facilitate hole injection. The first electrode may be a reflective electrode or a transmission electrode. Transparent and conductive materials such as indium tin oxide (ITO), indium zinc oxide (IZO), stannic oxide (SnO2), zinc oxide (ZnO), or the like may be used to form the first electrode. The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single-layer or a multi-layer structure including at least two layers. For example, the first electrode may have a three-layered structure of ITO/Ag/ITO, but is not limited thereto.

An organic layer may be disposed on the first electrode.

The organic layer may include a HIL, a HTL, a buffer layer (not shown), an EML, an ETL, or an EIL.

The HIL may be formed on the first electrode by vacuum deposition, spin coating, casting, Langmuir-Blodgett (LB) deposition, or the like.

When the HIL is formed using vacuum deposition, vacuum deposition conditions may vary depending on the compound that is used to form the HIL, and a desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the deposition conditions are not limited thereto.

When the HIL is formed using spin coating, the coating conditions may vary depending on the material that is used to form the HIL, and a desired structure and thermal properties of the HIL to be formed. For example, the coating rate may be in a range of about 2,000 rpm to about 5,000 rpm, and a temperature at which heat treatment is performed to remove a solvent after coating may be in the range of about 80° C. to about 200° C. However, the coating conditions are not limited thereto.

The HIL may be formed of any material that is commonly used to form a HIL. Examples of the material that can be used to form the HIL are N,N'-diphenyl-N,N'-bis-[4-(phenyl-m-tolyl-amino)-phenyl]-biphenyl-4,4'-diamine (DNTPD), a phthalocyanine compound such as copper-phthalocyanine, 4,4',4"-tris(3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate (PANI/PSS), but are not limited thereto.

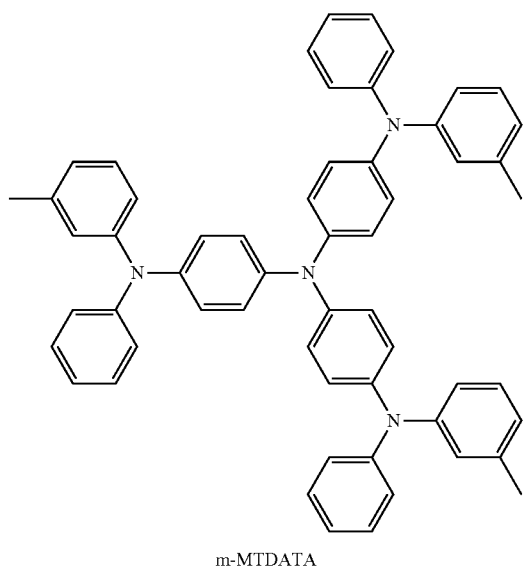

m-MTDATA

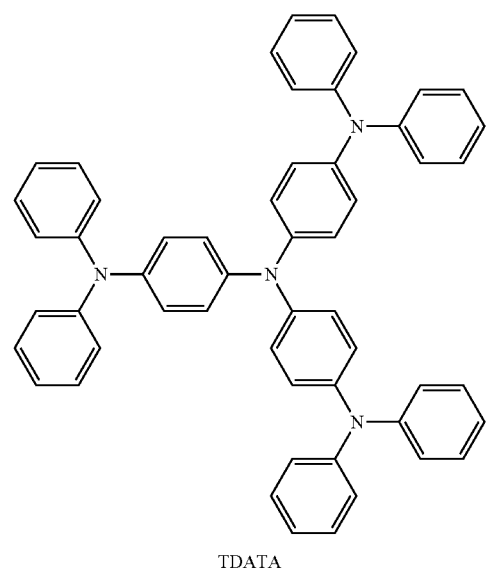

TDATA

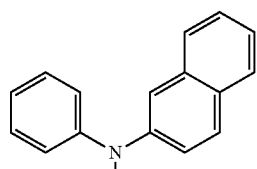
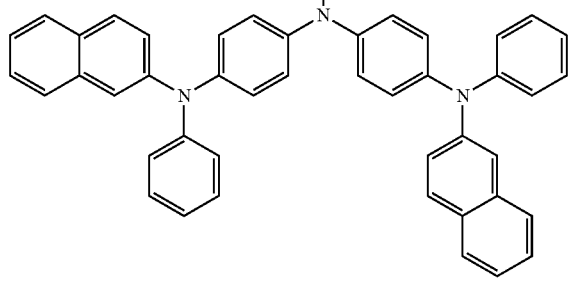

2-TNATA

The thickness of the HIL may be from about 100 Å to about 10,000 Å, and in some embodiments, may be from about 100 Å to about 1,000 Å. In one embodiment, when the thickness of the HIL is within these ranges, the HIL has good hole injecting ability without a substantial increase in driving voltage.

Then, the HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary depending on the material that is used to form the HTL.

The HTL may be formed of any suitable material that is used to form a HTL. Examples of the material that can be used to form the HTL are carbazole derivatives such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB), but are not limited thereto.

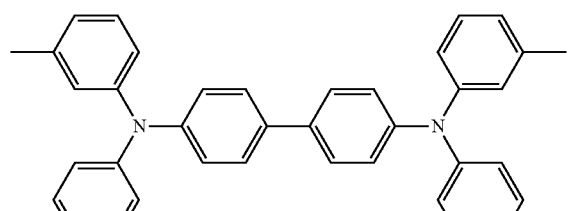

TPD

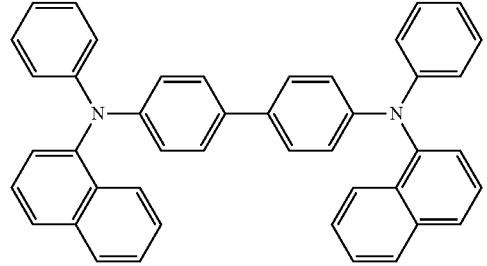

NPB

The thickness of the HTL may be from about 50 Å to about 2,000 Å, and in some embodiments, from about 100 Å to about 1,500 Å. In one embodiment, when the thickness of the HTL is within these ranges, the HTL has good hole transporting ability without a substantial increase in driving voltage.

The H-functional layer (having both hole injection and hole transport capabilities) may include at least one material from each group of the hole injection layer materials and hole transport layer materials. The thickness of the H-functional layer may be from about 500 Å to about 10,000 Å, and in some embodiments, may be from about 100 Å to about 1,000 Å. In one embodiment, when the thickness of the H-functional layer is within these ranges, the H-functional layer has good hole injection and transport capabilities without a substantial increase in driving voltage.

In some embodiments, at least one of the HIL, HTL, and H-functional layer may include at least one of a compound of Formula 300 below and a compound of Formula 350 below:

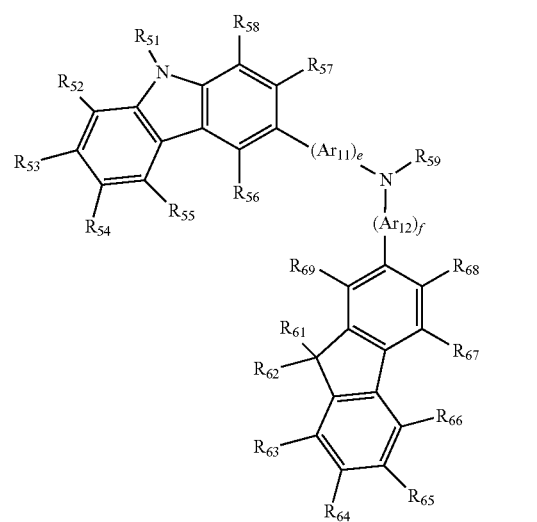

<Formula 300>

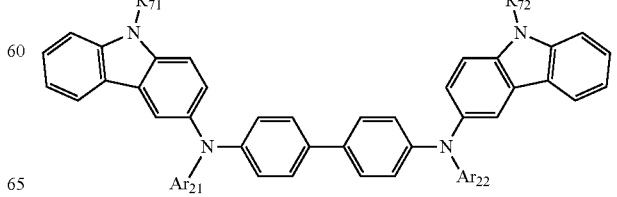

<Formula 350>

In Formulas 300 and 350, $Ar_{11}$, $Ar_{12}$, $Ar_{21}$, and $Ar_{22}$ may each independently be a substituted or unsubstituted $C_6$-$C_{60}$ arylene group.

In Formula 300, e and f may each independently be an integer of 0 to 5, for example, may be 0, 1, or 2. For example, e may be 1, and f may be 0, but are not limited thereto.

In Formulas 300 and 350, $R_{51}$ to $R_{58}$, $R_{61}$ to $R_{69}$, and $R_{71}$ to $R_{72}$ may each independently be a hydrogen atom, a deuterium atom, a halogen atom, a hydroxyl group, a cyano atom, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_5$-$C_{60}$ arylthio group. In some embodiments, $R_{51}$ to $R_{58}$, $R_{61}$ to $R_{69}$, and $R_{71}$ to $R_{72}$ may each independently be a hydrogen atom; a deuterium atom; a halogen atom; a hydroxyl group; a cyano atom; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (i.e., a methyl group, an ethyl group, a propyl group, a butyl group, a pentyl group, a hexyl group, or the like); a $C_1$-$C_{10}$ alkoxy group (i.e., a methoxy group, an ethoxy group, a propoxy group, a butoxy group, a pentoxy group, or the like); a $C_1$-$C_{10}$ alkyl group and a $C_1$-$C_{10}$ alkoxy group substituted with at least one of a deuterium atom, a halogen atom, a hydroxyl group, a cyano atom, a nitro group, an amino group, an amidino group, a hydrazine, a hydrazone, a carboxyl group or a salt thereof, a sulfonic acid group or a salt thereof, and a phosphoric acid group or a salt thereof; a phenyl group; a naphtyl group; an anthryl group; a fluorenyl group; a pyrenyl group; or a phenyl group, a naphtyl group, an anthryl group, a fluorenyl group, or a pyrenyl group substituted with at least one of a deuterium atom, a halogen atom, a hydroxyl group, a cyano atom, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group; but are not limited thereto.

In Formula 300, $R_{59}$ may be a phenyl group; a naphtyl group; an anthryl group; a biphenyl group; a pyridinyl group; or a phenyl group, a naphtyl group, an anthryl group, a biphenyl group, and a pyridinyl group substituted with at least one of a deuterium atom, a halogen atom, a hydroxyl group, a cyano atom, a nitro group, an amino group, an amidino group, a hydrazine, a hydrazone, a carboxyl group or a salt thereof, sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

In some embodiments, the compound of Formula 300 may be represented by Formula 300A below, but is not limited thereto:

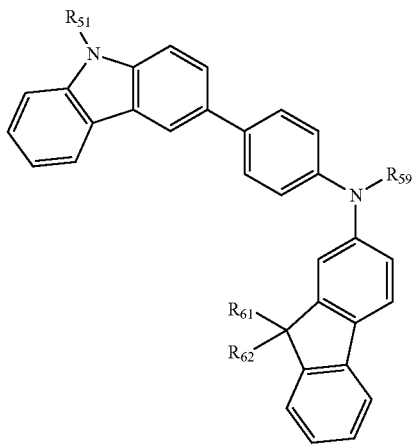

<Formula 300A>

In Formula 300A, a detailed description of $R_{61}$, $R_{62}$, $R_{61}$ and $R_{59}$ may be as defined above.

For example, at least one of the HIL, HTL, and H-functional layer may include at least one of the compounds represented by Formulas 301 and 320, but is not limited thereto.

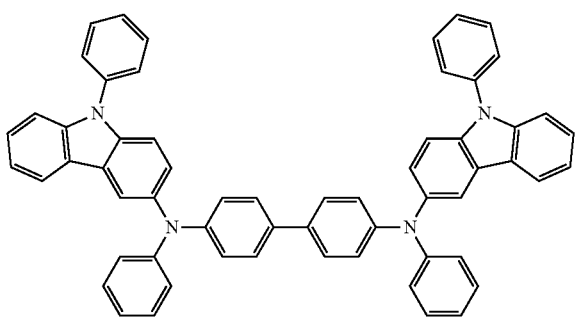

301

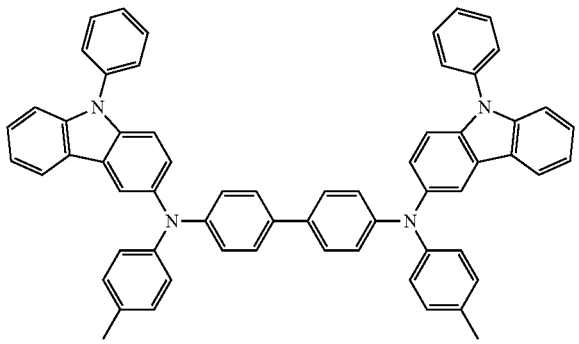

302

303
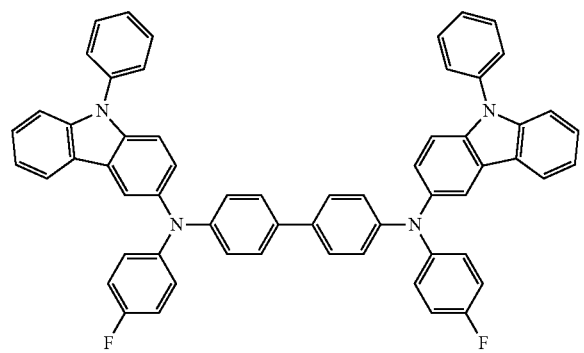
304
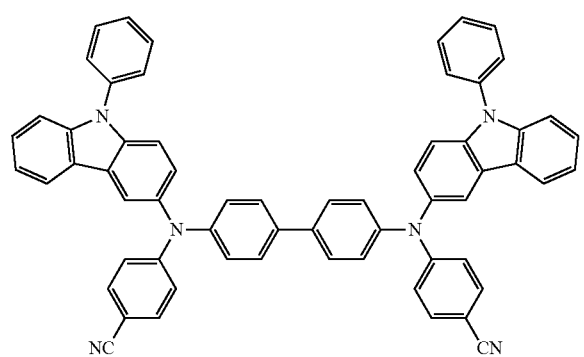
305
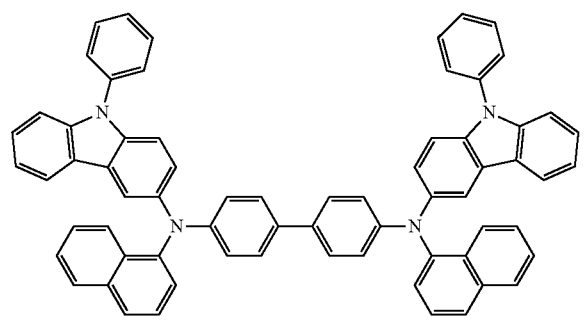
306
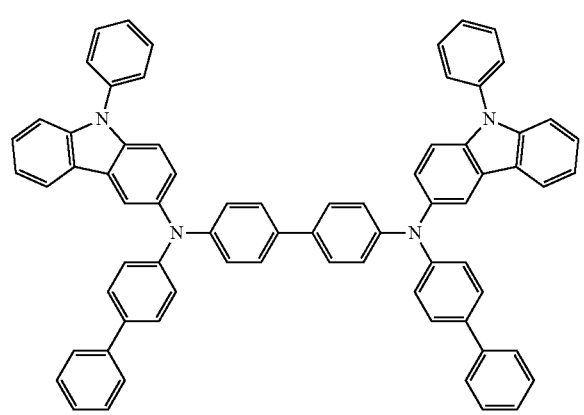
307
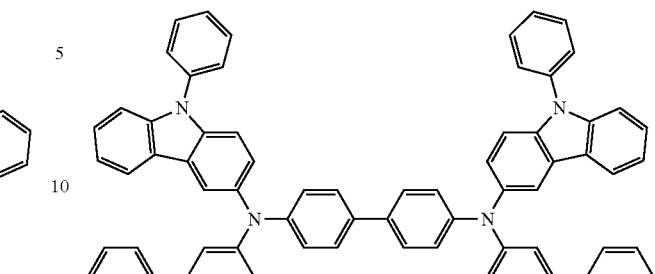
308
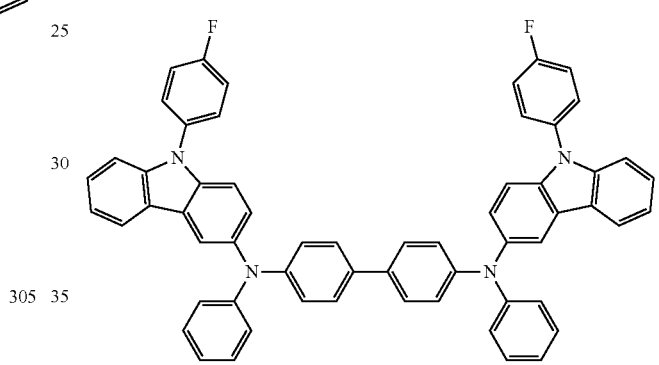
309
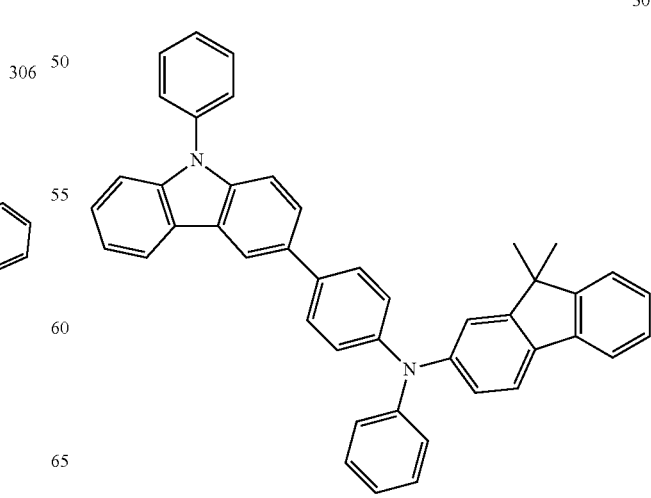

-continued
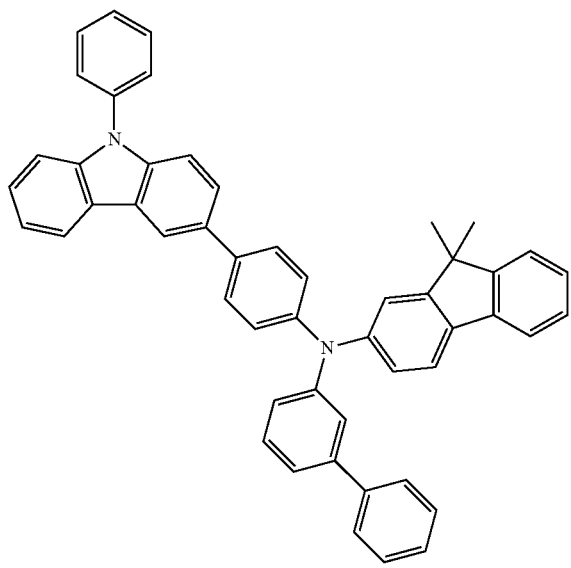
310
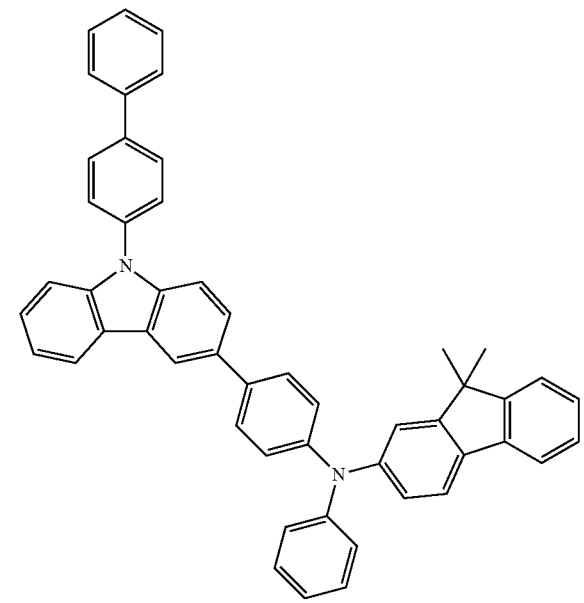
312
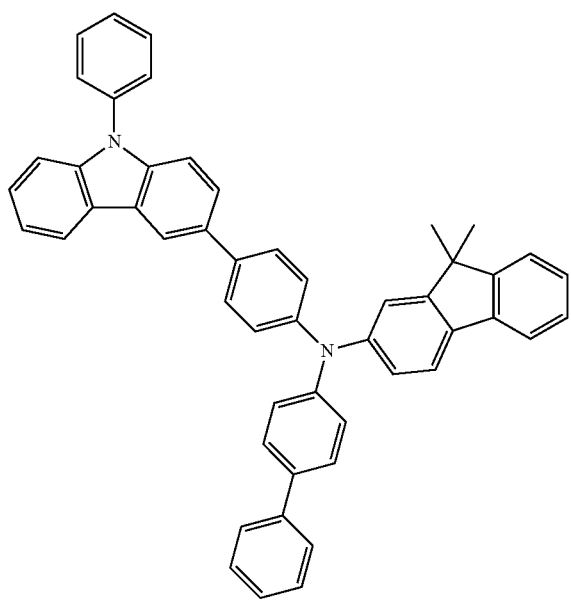
311
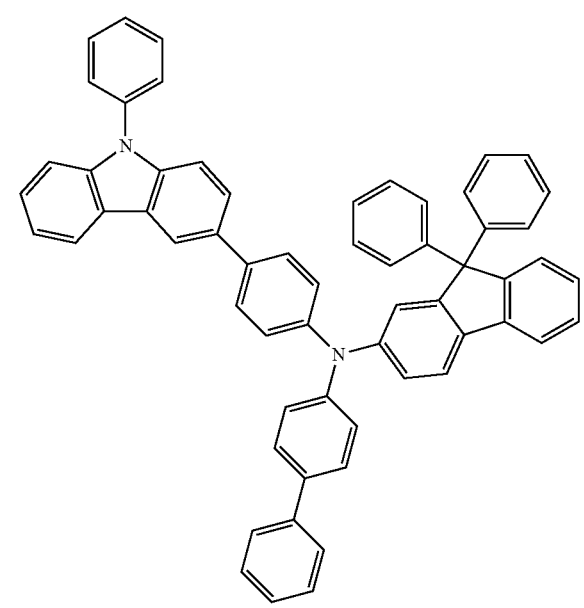
313

314
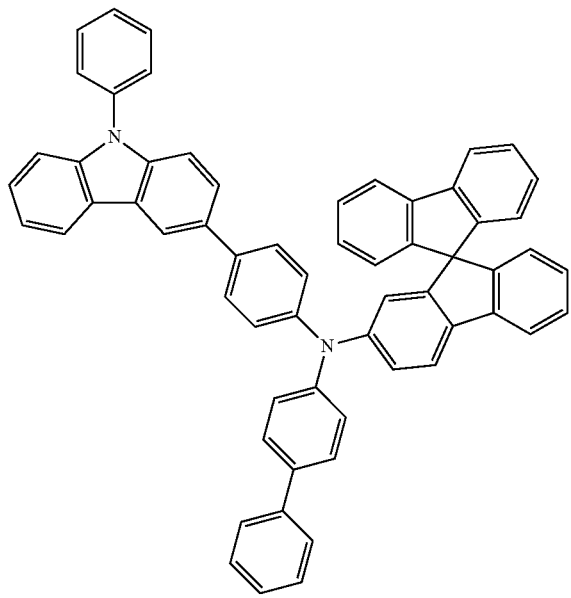
315
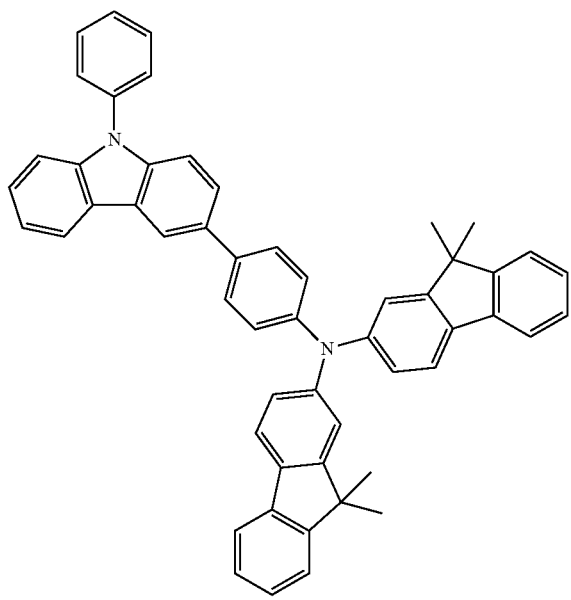
316
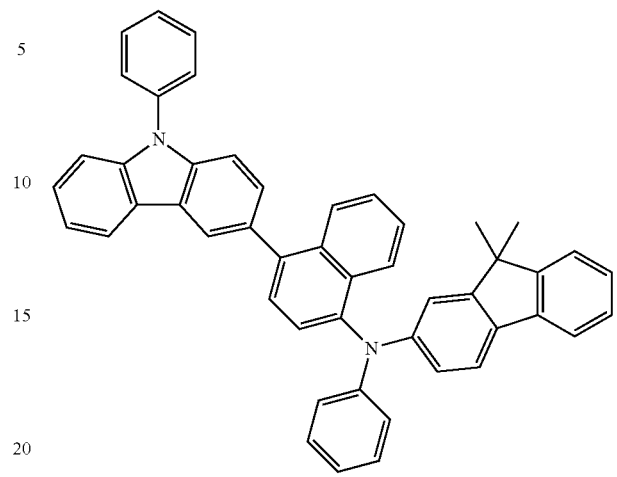
317
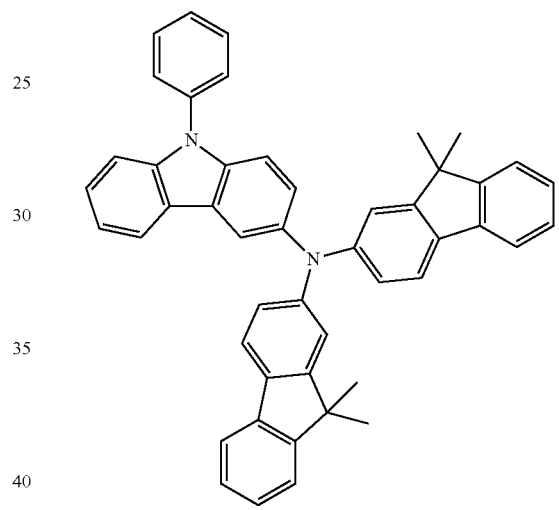
318
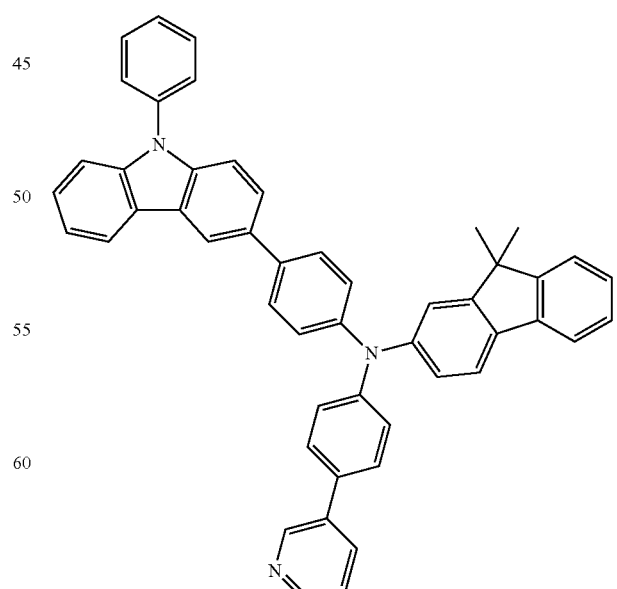

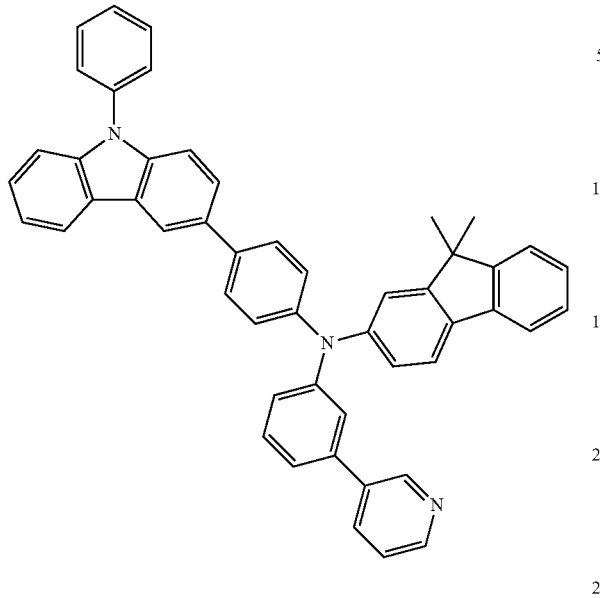

319

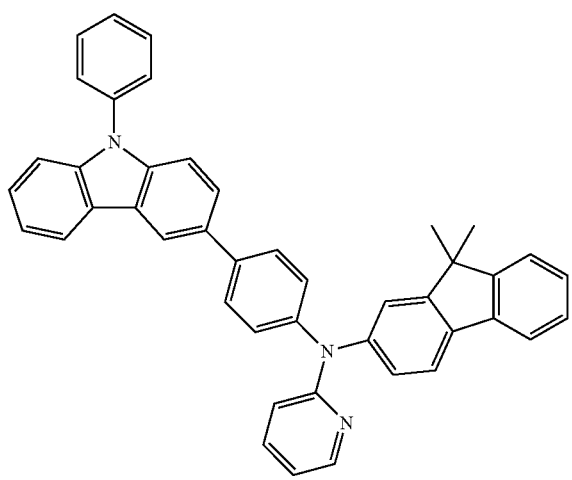

320

At least one of the HIL, HTL, and H-functional layer may further include a charge-generating material for improved layer conductivity, in addition to a suitable hole injecting material, hole transporting material, and/or material having both hole injection and hole transport capabilities as described above.

The charge-generating material may be, for example, a p-dopant. The p-dopant may be one of a quinine derivative, a metal oxide, or a cyano group-containing compound, but is not limited thereto. Non-limiting examples of the p-dopant are a quinone derivative such as tetracyanoquinonedimethane (TCNQ), 2,3,5,6-tetrafluoro-tetracyano-1,4-benzoquinonedimethane (F4-CTNQ), and the like; a metal oxide such as tungsten oxide, molybdenum oxide, and the like; and a cyano-containing compound such as Compound 200 below:

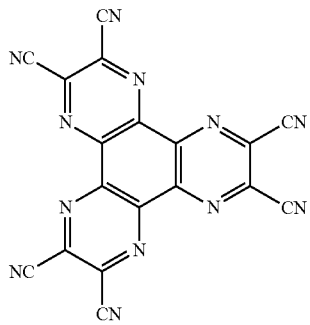

<Compound 200>

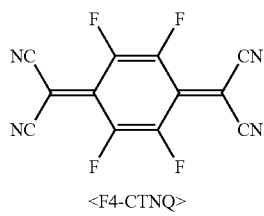

<F4-CTNQ>

When the HIL, the HTL, or the H-functional layer further includes a charge-generating material, the charge-generating material may be homogeneously dispersed or inhomogeneously distributed in the above-mentioned layers.

A buffer layer may be interposed between the EML and at least one of the HIL, HTL, and H-functional layer. The buffer layer may compensate for an optical resonance distance of light according to a wavelength of the light emitted from the EML, and thus may increase efficiency. The buffer layer may include any hole injecting material or hole transporting material that are widely known. In some other embodiments, the buffer layer may include the same material as one of the materials included in the HIL, HTL, and H-functional layer underlying the buffer layer.

Then, an EML may be formed on the HTL, H-functional layer, or buffer layer by vacuum deposition, spin coating, casting, LB deposition, or the like. When the EML is formed using vacuum deposition or spin coating, the deposition and coating conditions may be similar to those for the formation of the HIL, though the conditions for deposition and coating may vary depending on the material that is used to form the EML.

The EML may include a host.

Examples of the suitable host are $Alq_3$, 4,4'-N,N'-dicarbazole-biphenyl (CBP), poly(n-vinylcarbazole) (PVK), 9,10-di(naphthylene-2-yl)anthracene (ADN), TCTA, 1,3,5-tris(N-phenylbenzimidazole-2-yl)benzene (TPBI), 3-tert-butyl-9,10-di(naphth-2-yl)antracene (TBADN), E3, distyrylarylene (DSA), dmCBP (see Formula below), and Compounds 501 to 509 below, but are not limited thereto.

-continued
TPBI
dmCBP
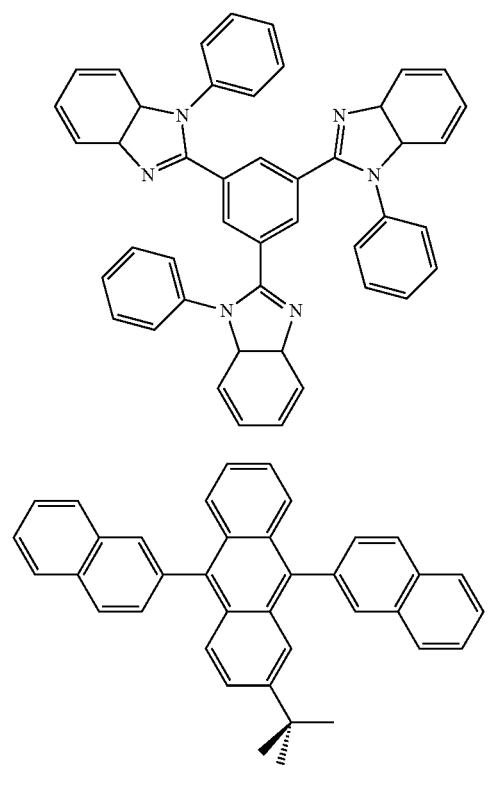
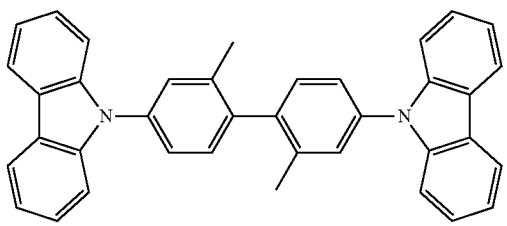
TBADN
501
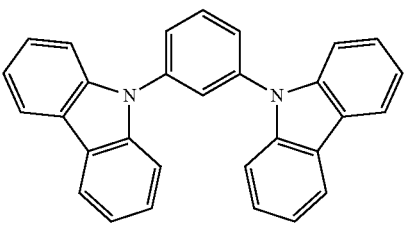
E3
502
PVK
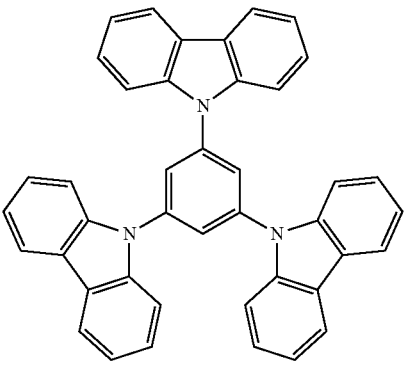
ADN
503
CBP
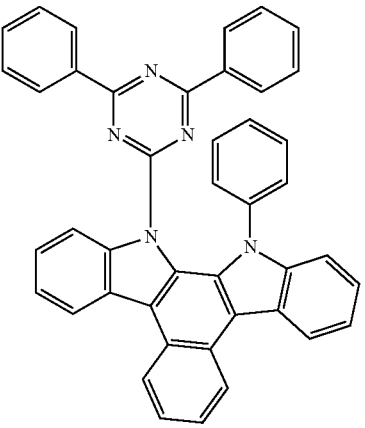

504 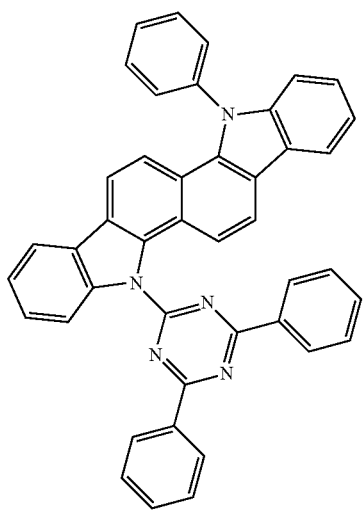

505 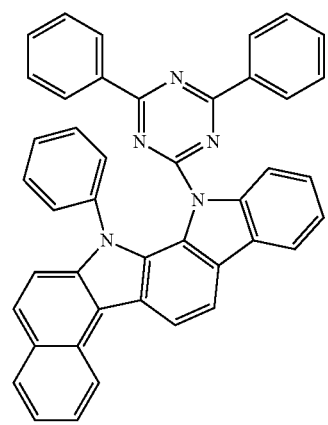

506 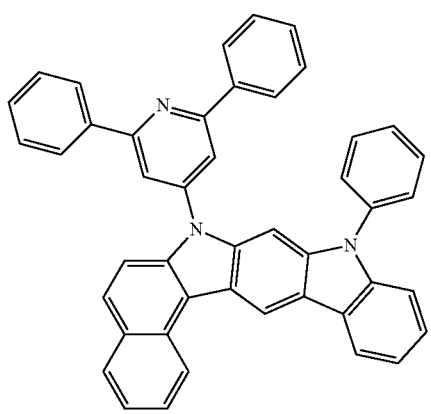

507 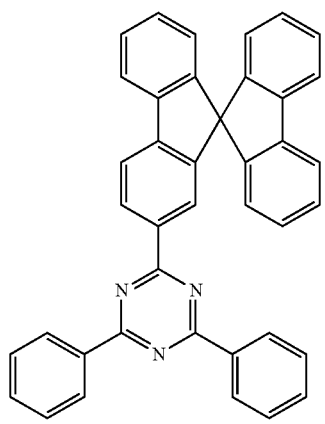

508 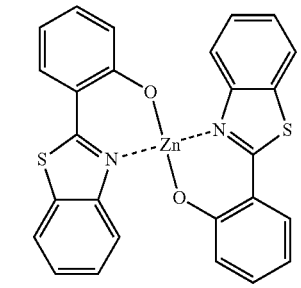

509 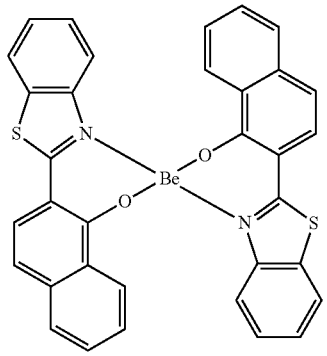

In some embodiments, an antracene-based compound represented by Formula 400 below may be used as the host:

<Formula 400>

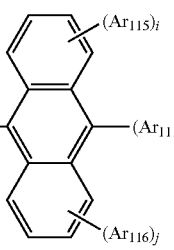

In Formula 400, $Ar_{111}$ and $Ar_{112}$ may each independently be a substituted or unsubstituted $C_6$-$C_{60}$ arylene group; $Ar_{113}$ to $Ar_{116}$ may each independently be a substituted or unsubstituted $C_1$-$C_{10}$ alkyl group or a substituted or unsubstituted $C_6$-$C_{60}$ aryl group; and g, h, l, and j may each independently be an integer of 0 to 4.

For example, in Formula 400, $Ar_{111}$ and $Ar_{112}$ may each independently be a phenylene group, a naphthylene group, a phenanthrenylene group, or a pyrenylene group; or a phenylene group, a naphthylene group, a phenanthrenylene group, a fluorenyl group, or a pyrenylene group substituted with at least one of a phenyl group, a naphthyl group, and an anthryl group.

In Formula 400, g, h, l, and j may each independently be 0, 1, or 2.

In Formula 400, $Ar_{113}$ to $Ar_{116}$ may each independently be a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenyl group, and a fluorenyl group substituted with at least one of a deuterium atom, a halogen atom, a hydroxyl group, a cyano atom, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; or

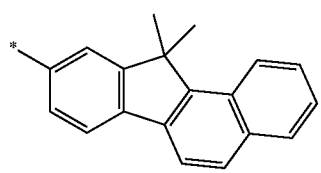

, but are not limited thereto.

For example, the antracene-based compound represented by Formula 400 above may be one of the compounds represented by the following Formulas, but is not limited thereto:

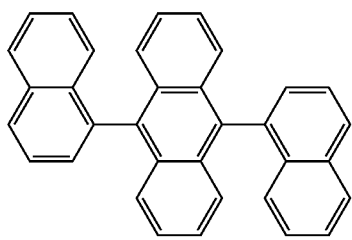

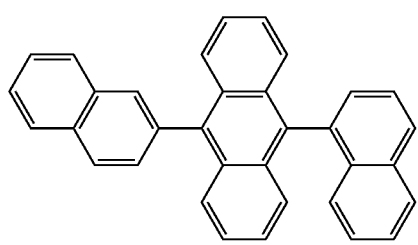

-continued

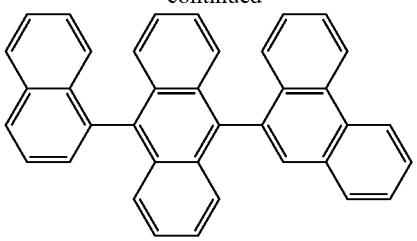

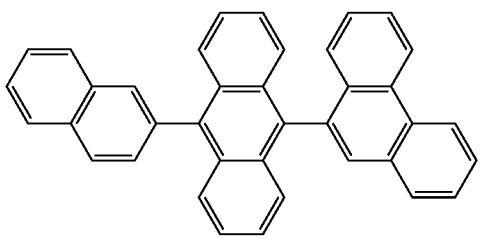

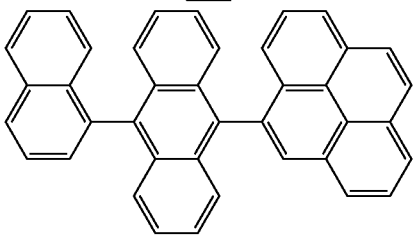

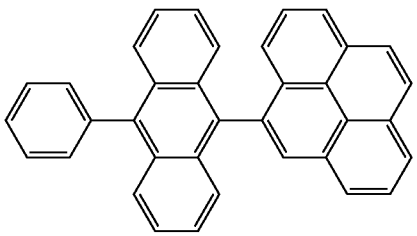

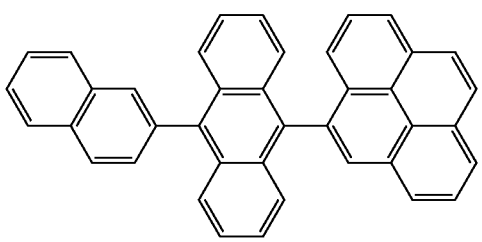

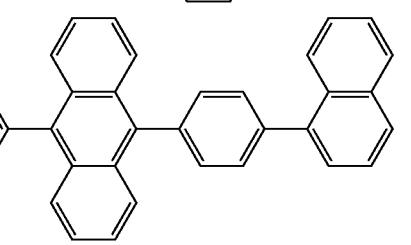

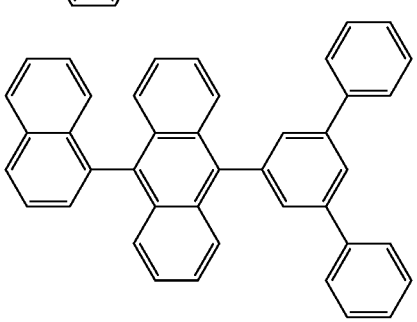

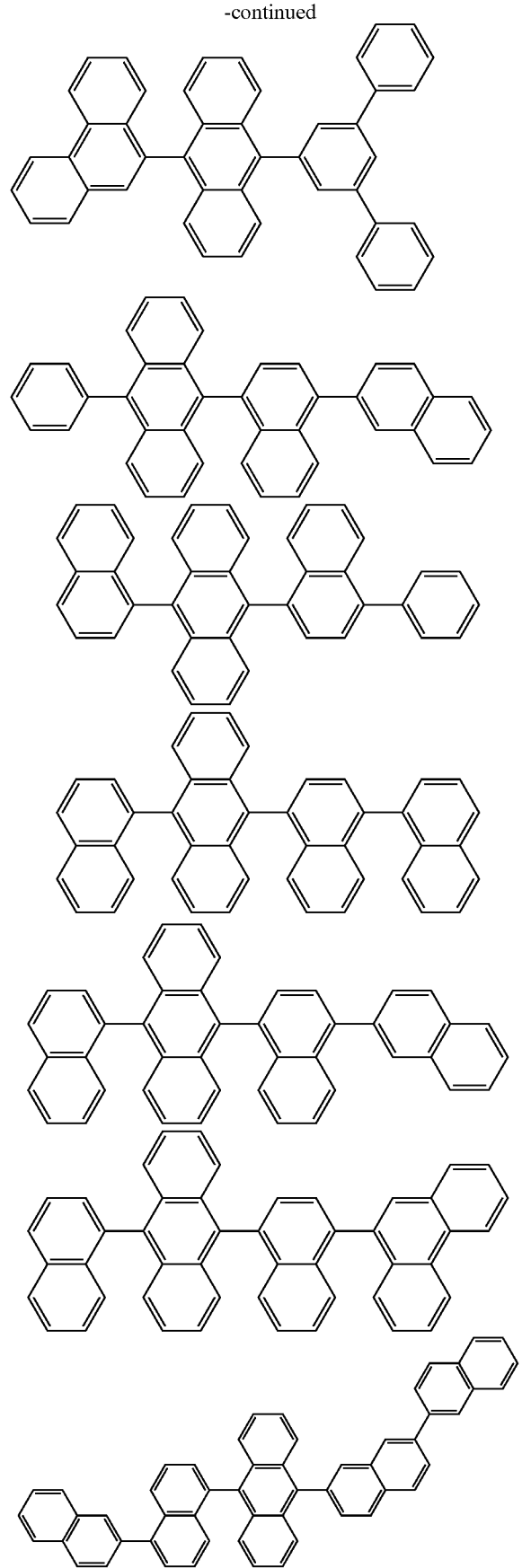
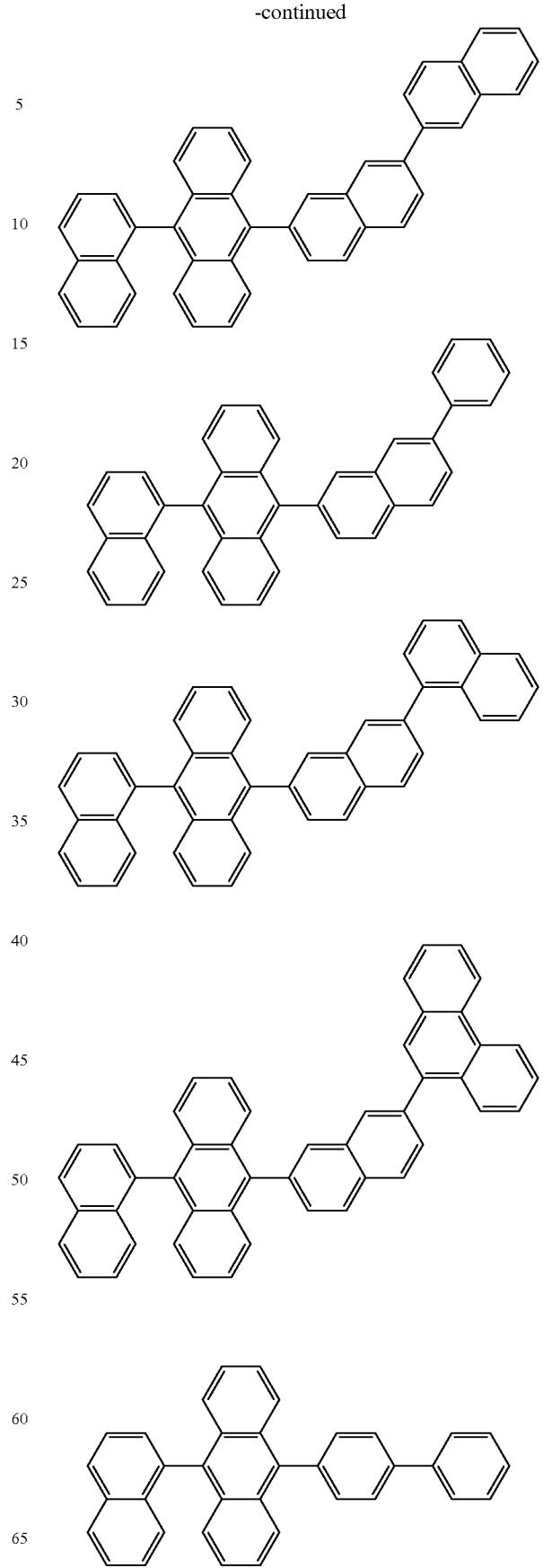

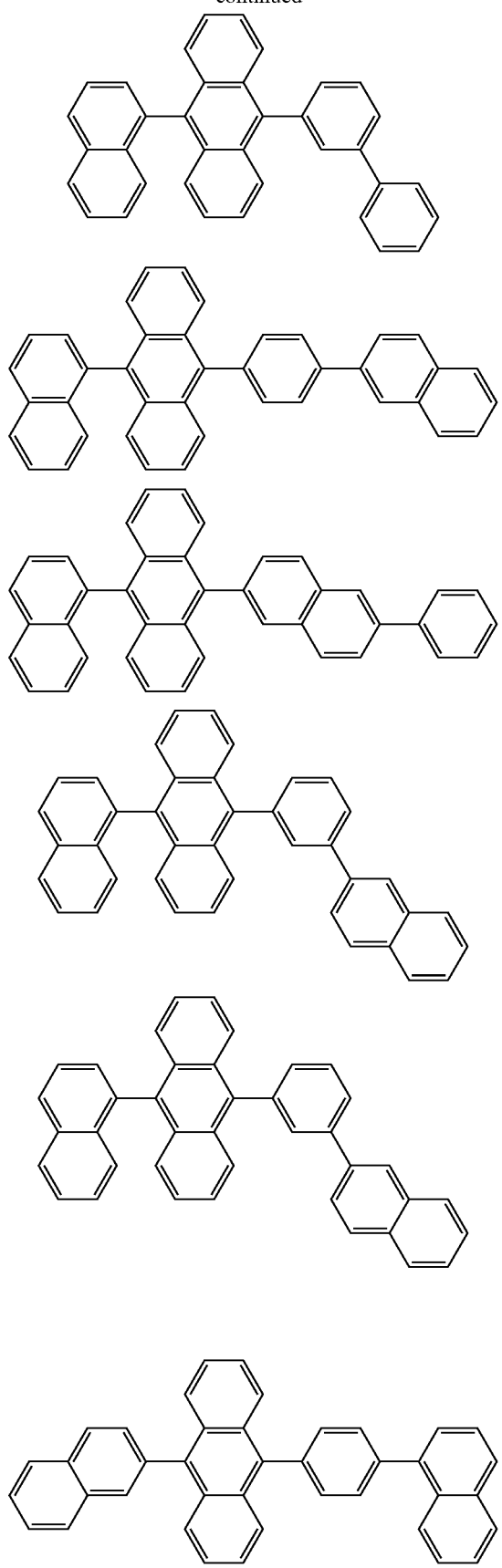
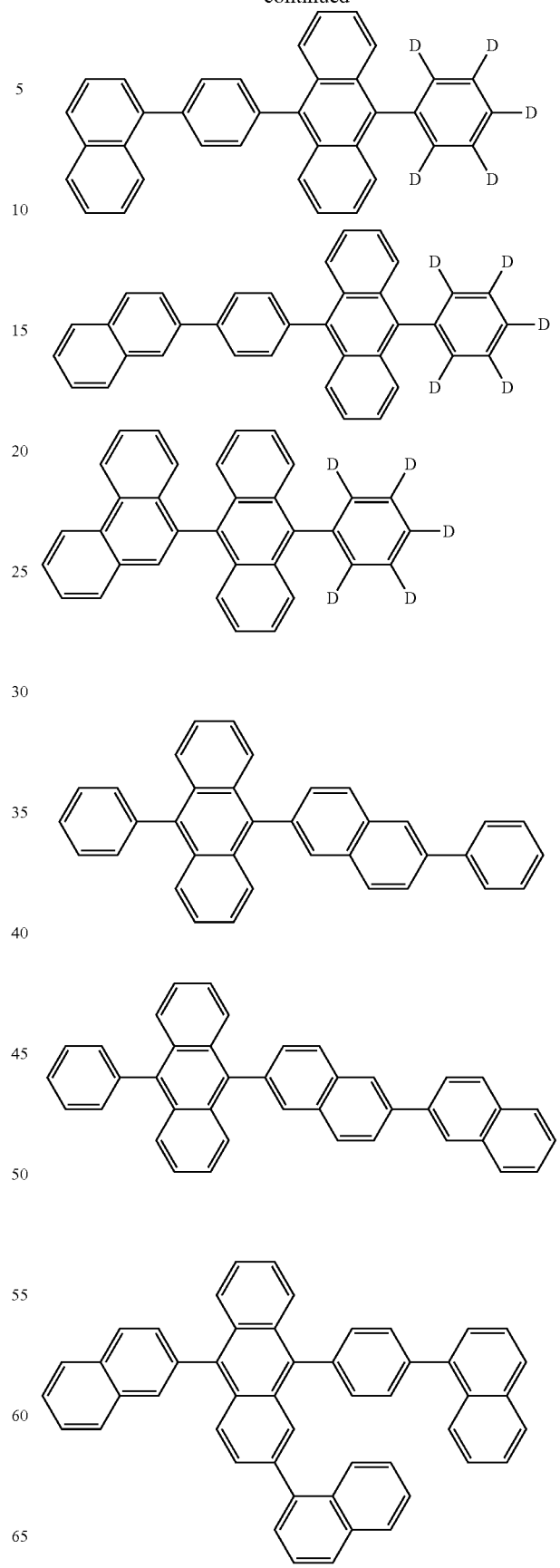

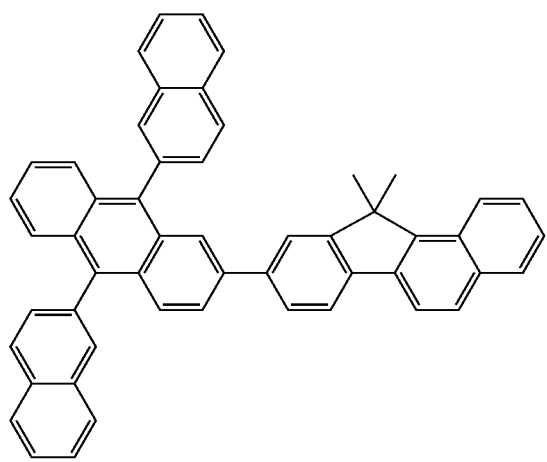

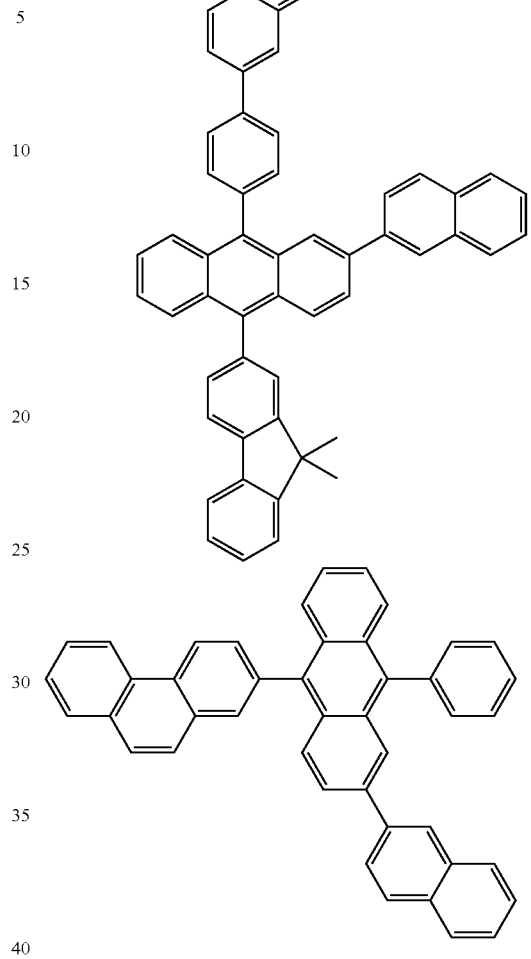

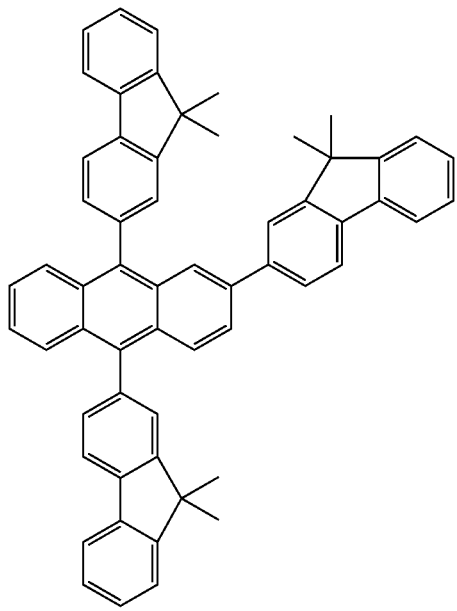

In some embodiments, an antracene-based compound represented by Formula 401 below may be used as the host:

<Formula 401>

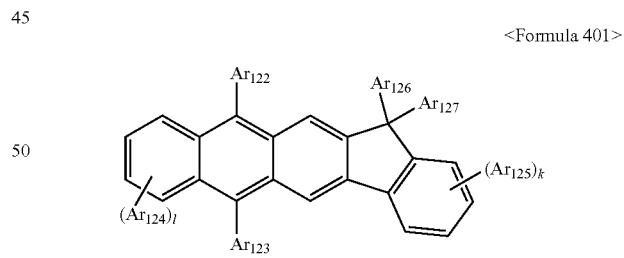

In Formula 401, $Ar_{122}$ to $Ar_{125}$ may be defined as described above in conjunction with $Ar_{113}$ of Formula 400, and thus detailed descriptions thereof will not be provided here.

In Formula 401, $Ar_{126}$ and $Ar_{127}$ may each independently be a $C_1$-$C_{10}$ alkyl group (i.e., a methyl group, an ethyl group, or a propyl group).

In Formula 401, k and l may each independently be an integer of 0 to 4. For example, k and l may be 0, 1, or 2.

For example, the antracene-based compound of Formula 401 may be one of the compounds represented by the following Formulas below, but is not limited thereto:

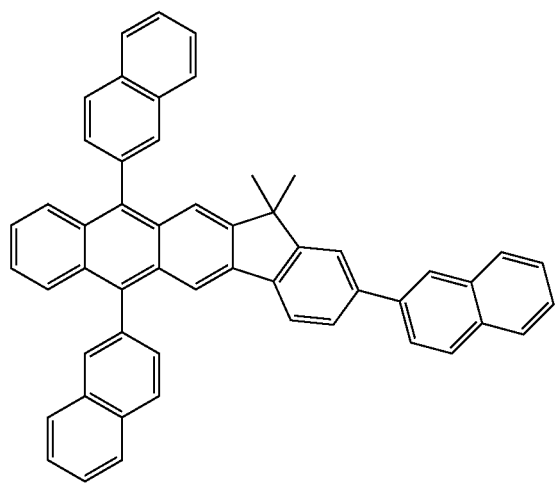
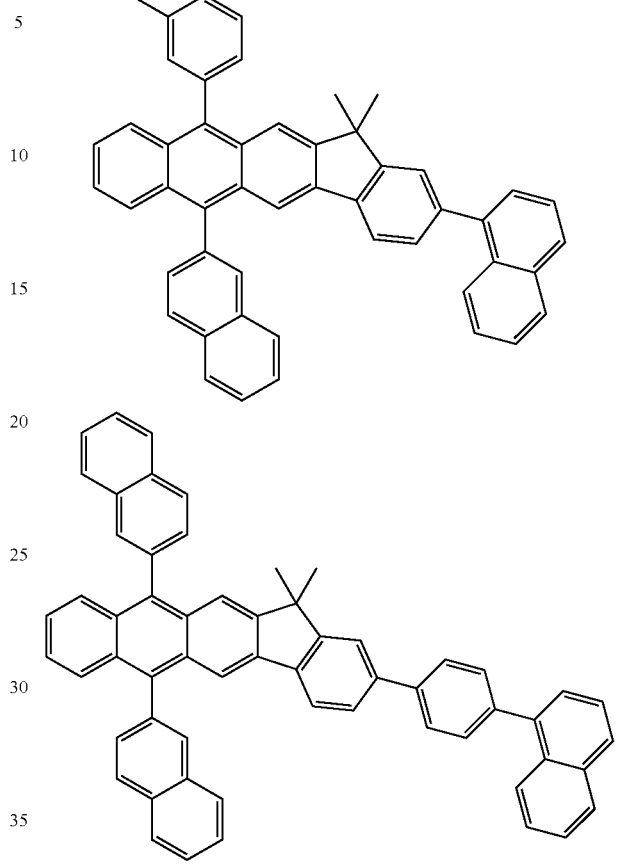
When the OLED is a full color OLED, the EML may be patterned into the red EML, the green EML, and the blue EML.
Meanwhile, at least one the red EML, the green EML, and the blue EML may include the dopant below (ppy=phenylpyridine):
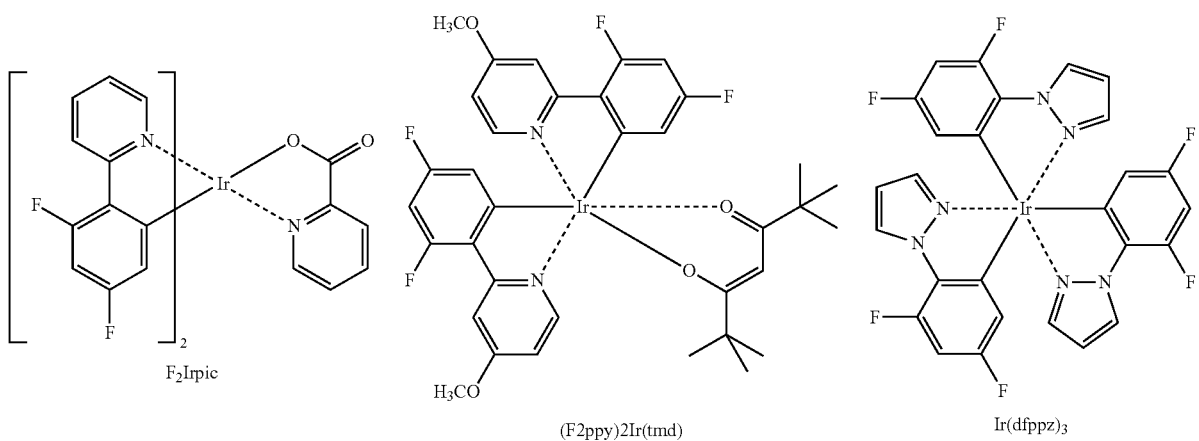

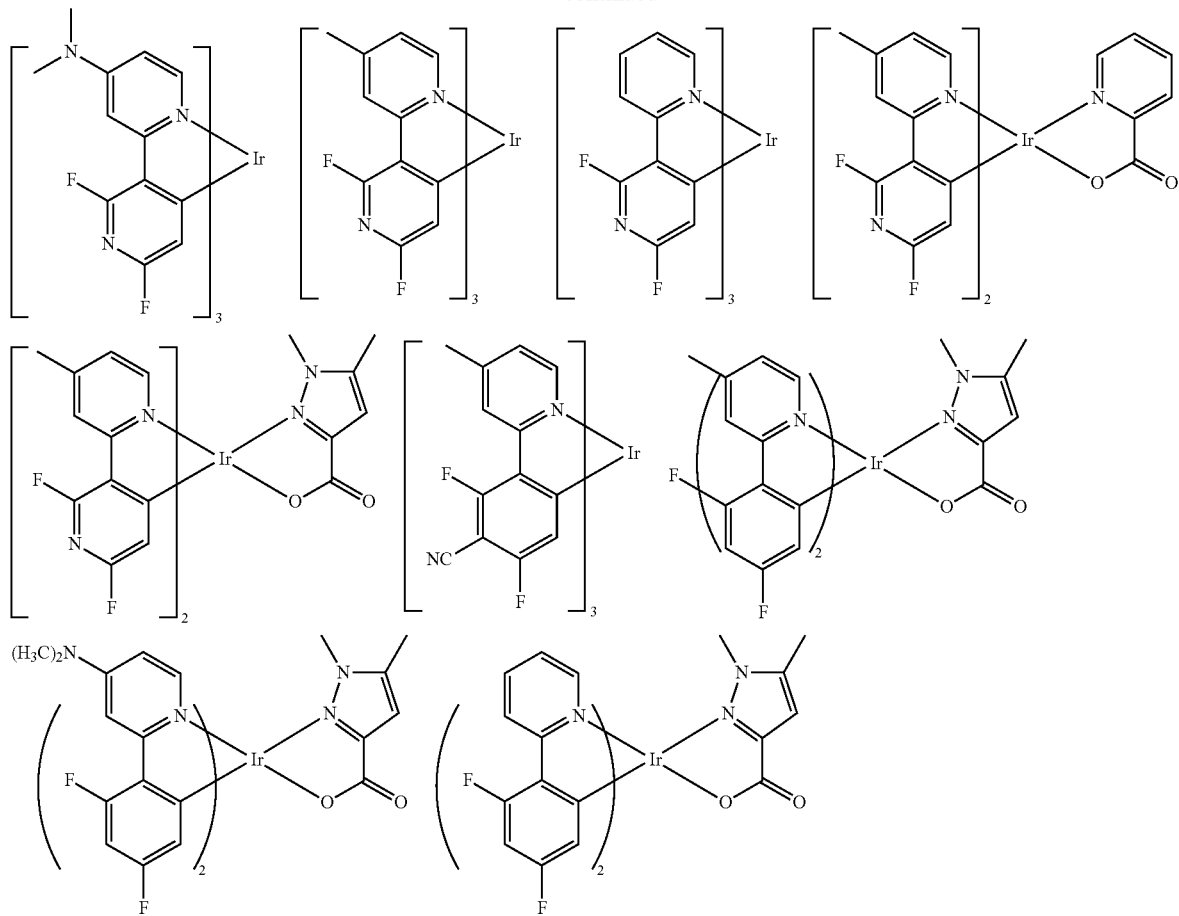
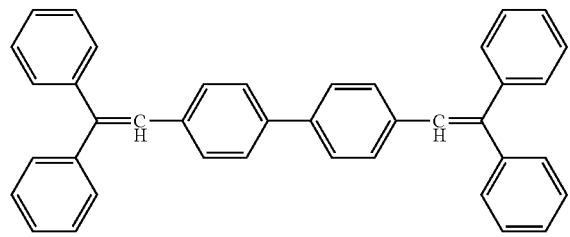
DPVBi
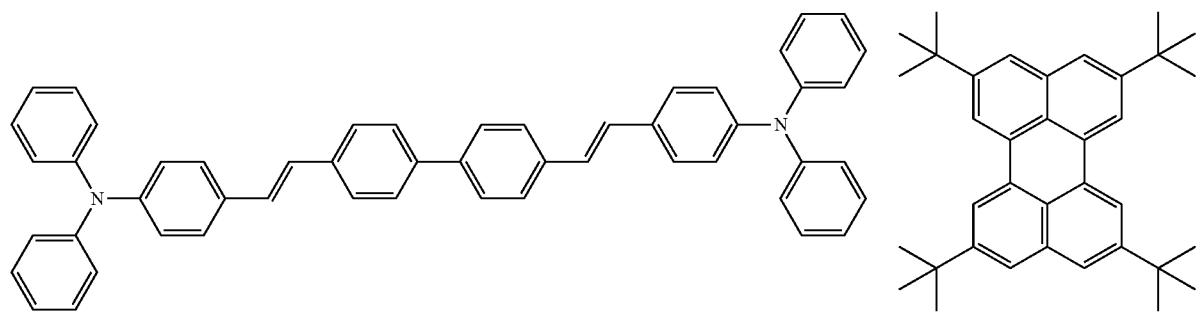
DPAVBi
TBPe

Examples of the red dopant are compounds represented by the following Formulas below, but are not limited thereto:
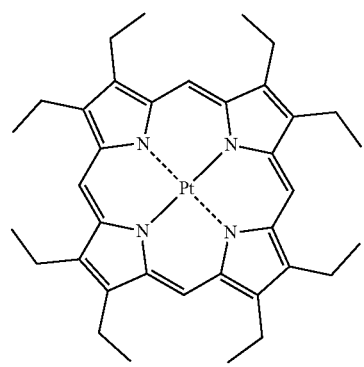
PtOEP
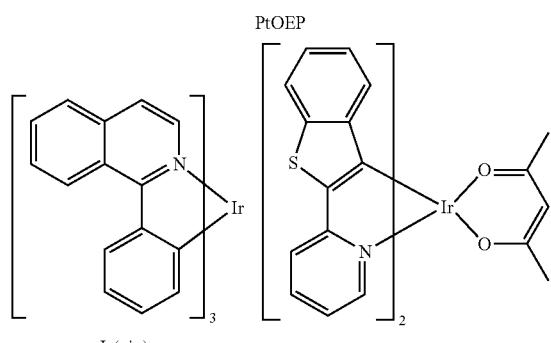
Ir(piq)₃  Btp₂Ir(acac)
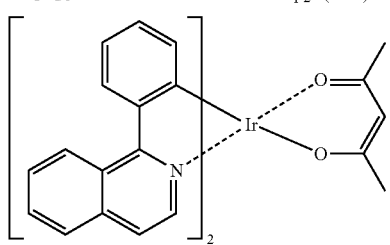
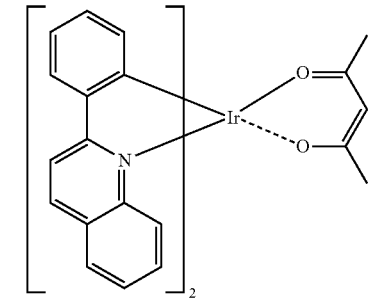
Ir(pq)₂(acac)
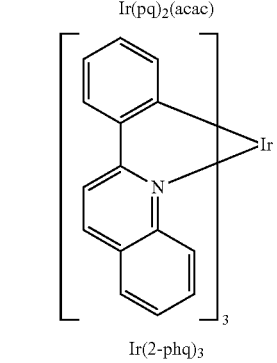
Ir(2-phq)₃
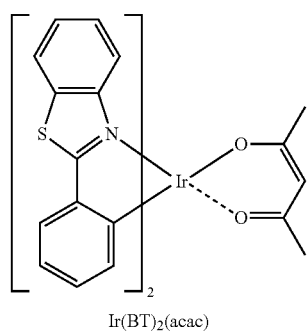
Ir(BT)₂(acac)
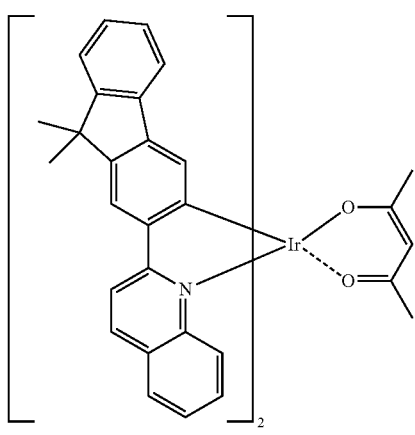
Ir(flq)₂(acac)
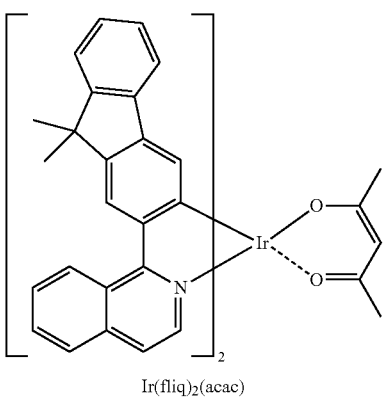
Ir(fliq)₂(acac)
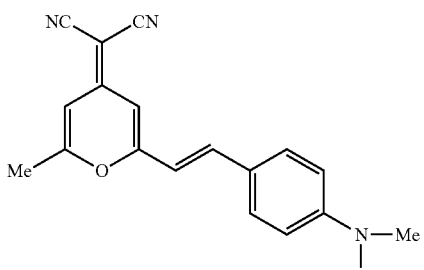
DCM -continued
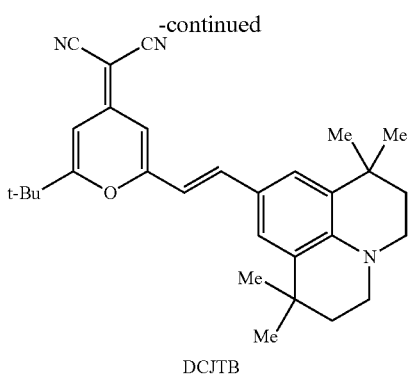
DCJTB
Examples of the green dopant are compounds represented by the following Formulas below, but are not limited thereto:
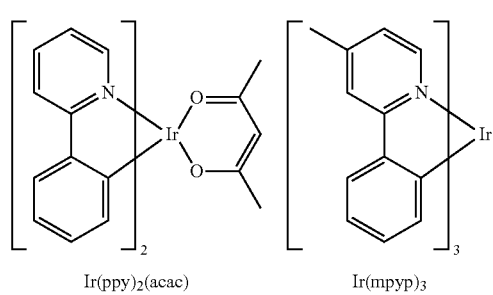
Ir(ppy)₃
Ir(ppy)₂(acac)   Ir(mpyp)₃
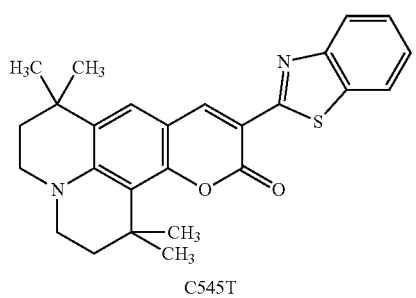
C545T
Examples of the dopant that may be used in the EML are Pd complexes or Pt-complexes represented by the following Formulas below, but are not limited thereto:
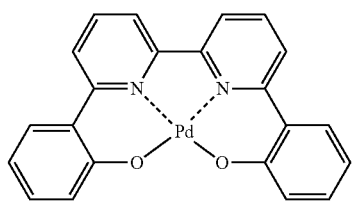
D1
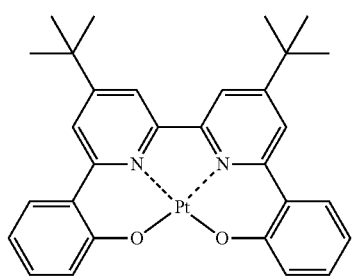
D2
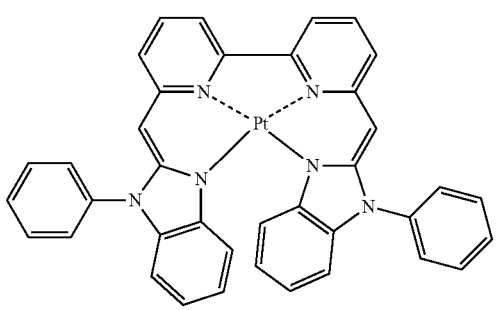
D3
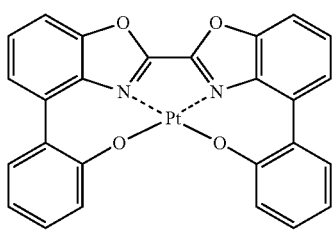
D4
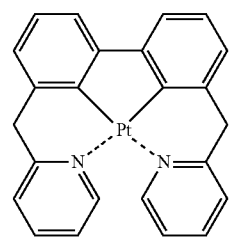
D5
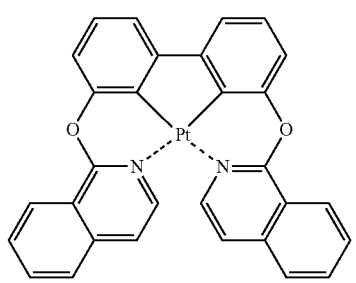
D6

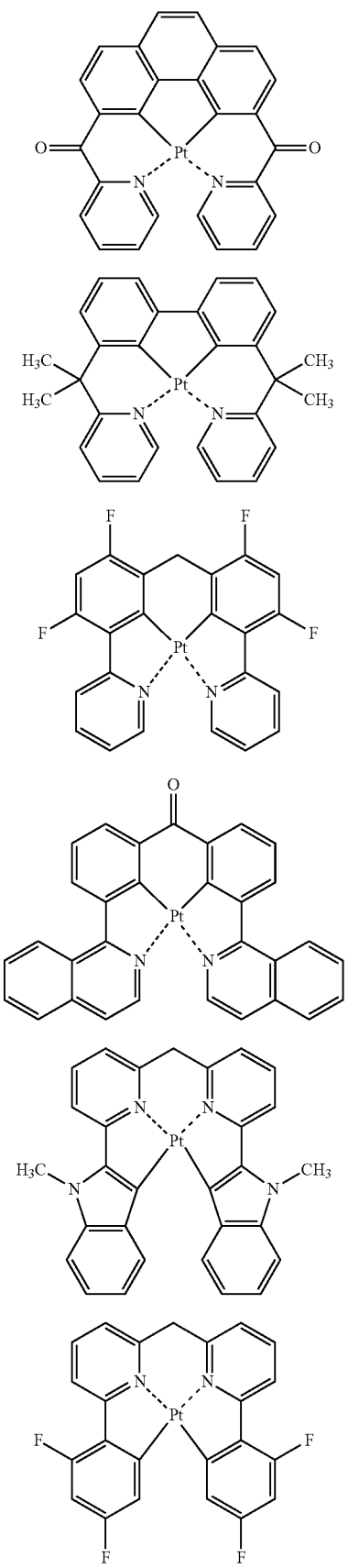
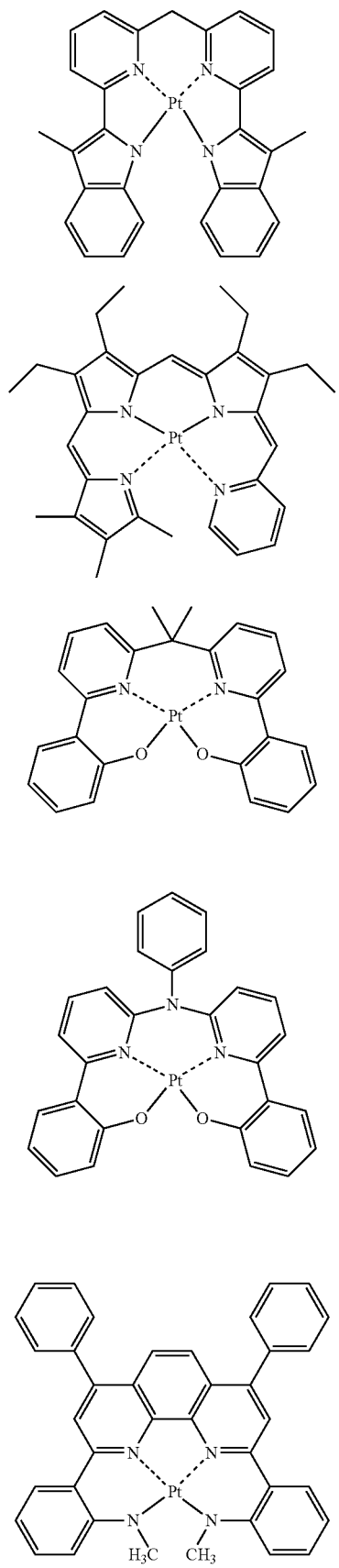

-continued

D18
D19
D20
D21
D22

-continued

D23
D24
D25
D26
D27
D28

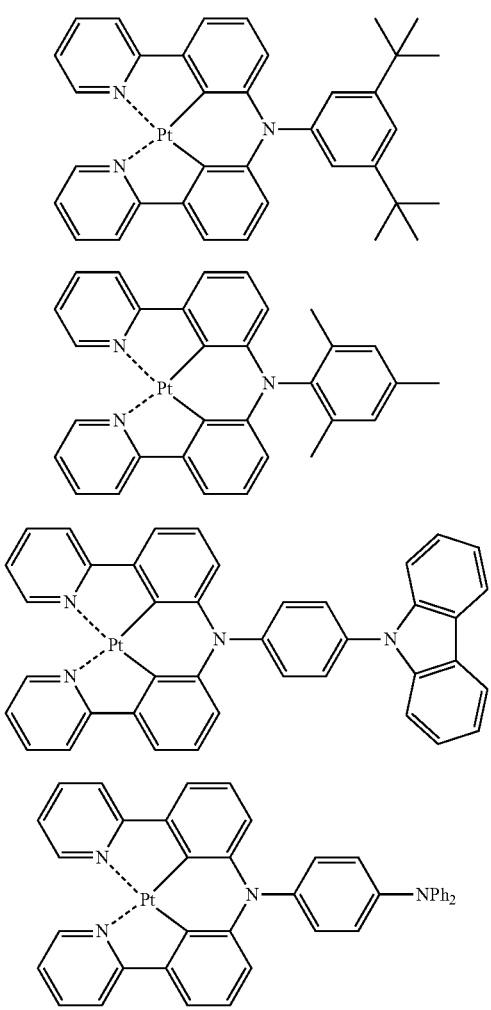
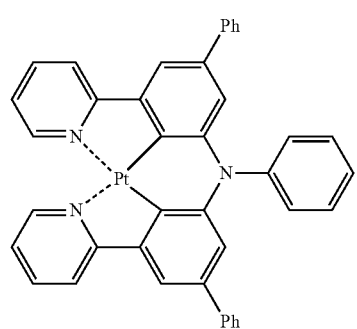
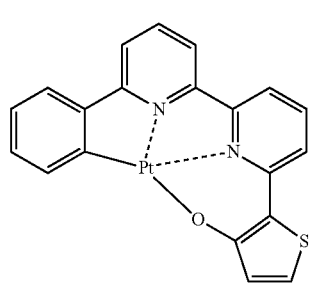
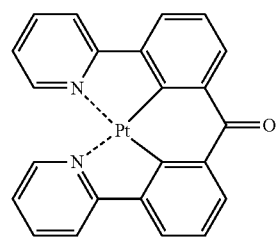
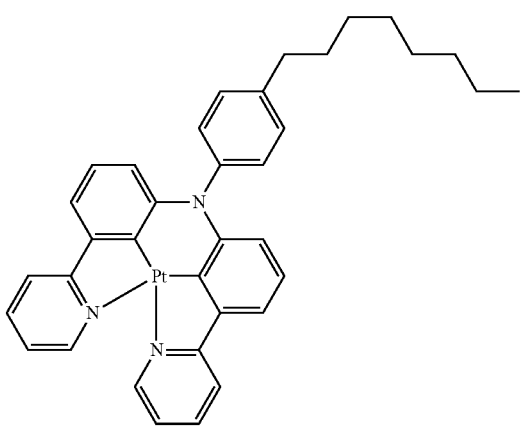
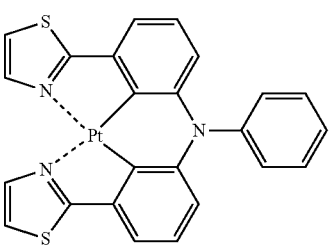

-continued
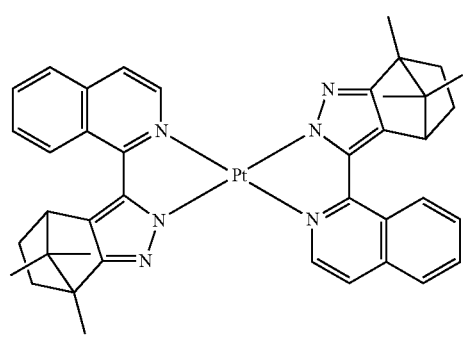
D40
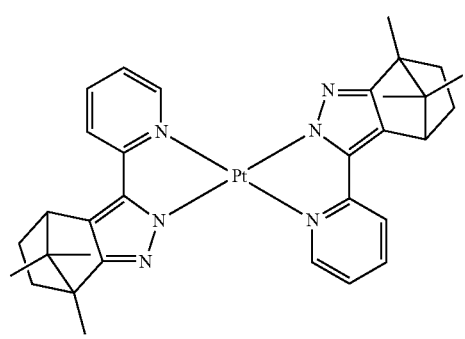
D41
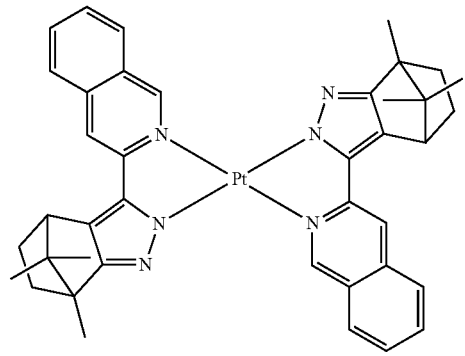
D42
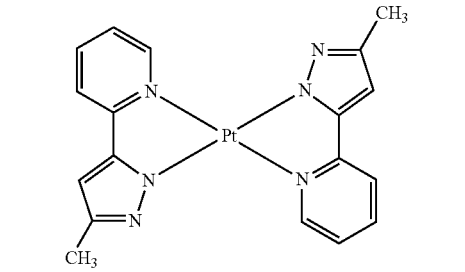
D43
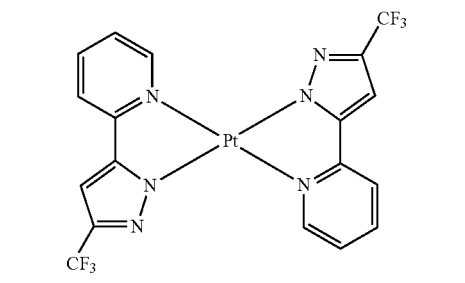
D44
-continued
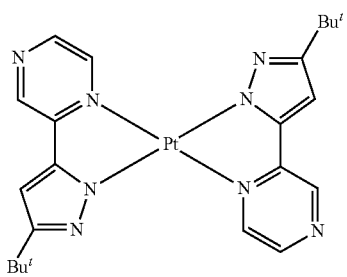
D45
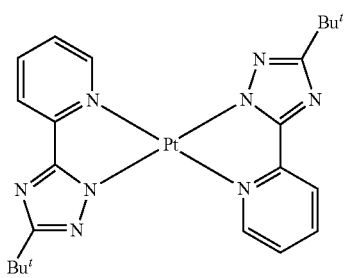
D46
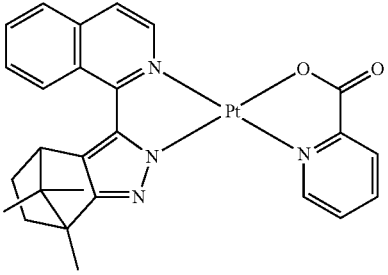
D47
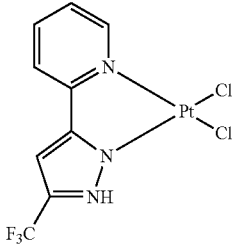
D48
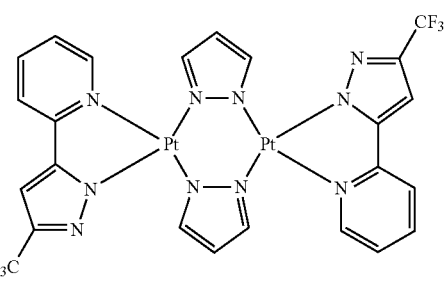
D49

-continued

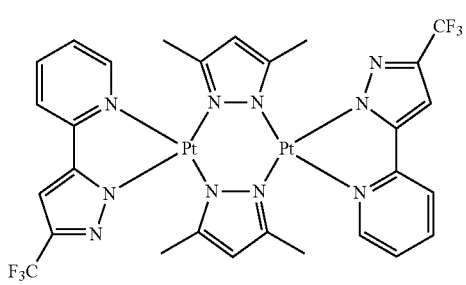

Examples of the dopant that may be used in the EML are Os-complexes represented by the following Formulas below, but are not limited thereto:

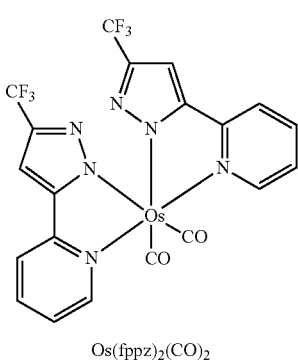

Os(fppz)₂(CO)₂

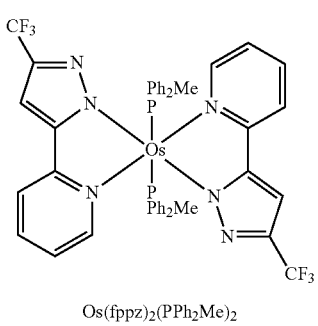

Os(fppz)₂(PPh₂Me)₂

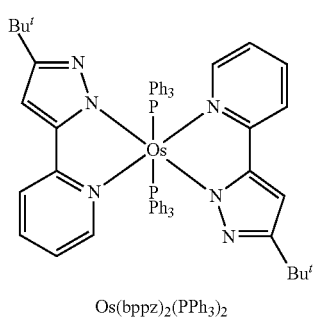

Os(bppz)₂(PPh₃)₂

-continued

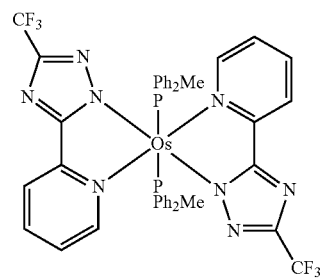

Os(fptz)₂(PPh₂Me)₂

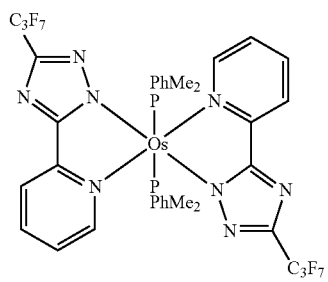

Os(hptz)₂(PPh₂Me₂)₂

When the EML includes both a host and a dopant, the amount of the dopant may be from about 0.01 parts to about 15 parts by weight based on 100 parts by weight of the host, but is not limited thereto.

The thickness of the EML may be from about 100 Å to about 1,000 Å, in some embodiments, from about 200 Å to about 600 Å. In one embodiment, when the thickness of the EML is within these ranges, the EML has good light-emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary depending on a compound that is used to form the ETL. A material for forming the ETL may be the compound of Formula 1 above or any suitable material that can stably transport electrons injected from an electron injecting electrode (cathode). Examples of the materials for forming the ETL are a quinoline derivative such as tris(8-quinolinorate)aluminum (Alq3), TAZ, BAlq, beryllium bis(benzoquinolin-10-olate) (Bebq₂), 9,10-di (naphthalene-2-yl)anthracene ADN, Compound 201, and Compound 202, but are not limited thereto.

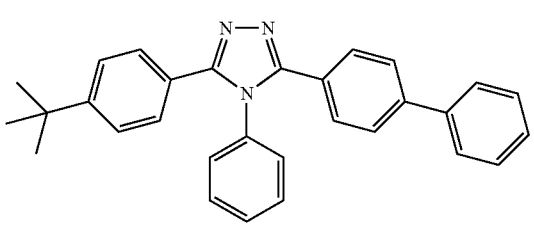

TAZ

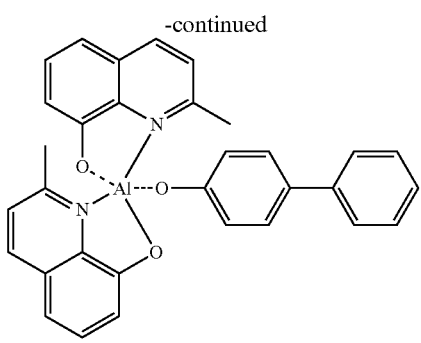

BAlq

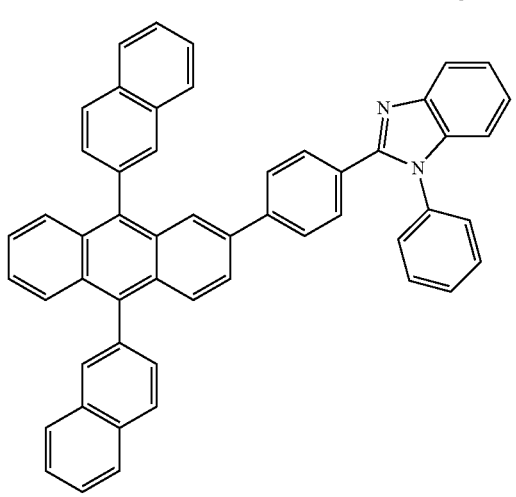

<Compound 201>

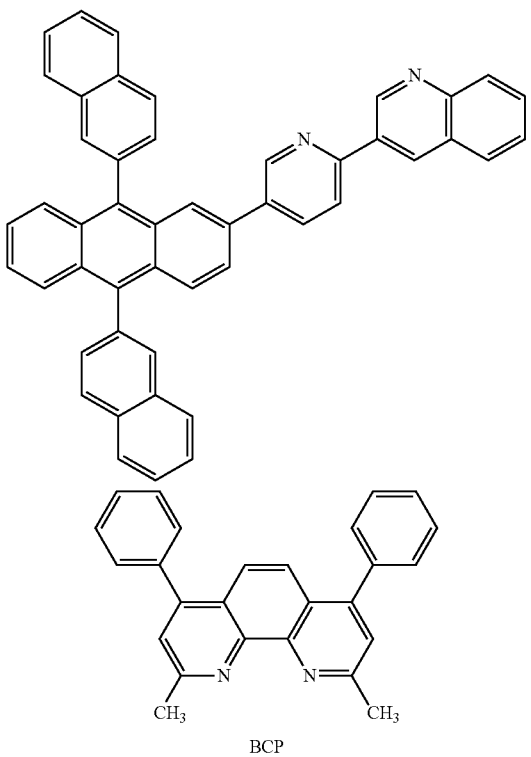

<Compound 202>

BCP

The thickness of the HTL may be from about 100 Å to about 1,000 Å, and in some embodiments, from about 150 Å to about 500 Å. In one embodiment, when the thickness of the ETL is within these ranges, the ETL has satisfactory electron transporting ability without a substantial increase in driving voltage.

In some embodiments, the ETL may further include a metal-containing material, in addition to any suitable electron-transporting organic compound.

The metal-containing material may include a lithium (Li) complex. Non-limiting examples of the Li complex are lithium quinolate (LiQ) and Compound 203 below:

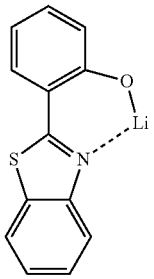

<Compound 203>

Also, an EIL, which facilitates injection of electrons from the cathode, may be disposed on the ETL. Any suitable electron-injecting material may be used to form the EIL.

Examples of materials for forming the EIL are LiF, NaCl, CsF, $Li_2O$, and BaO, which are known in the art. The deposition and coating conditions for forming the EIL may be similar to those for forming the HIL, though the deposition and coating conditions may vary depending on the material that is used to form the EIL.

The thickness of the EIL may be from about 1 Å to about 100 Å, and in some embodiments, from about 3 Å to about 90 Å. In one embodiment, when the thickness of the EIL is within these ranges, the EIL has satisfactory electron injection ability without a substantial increase in driving voltage.

A second electrode is disposed on the organic layer. The second electrode may be a cathode that is an electron injection electrode. Here, material for forming the second electrode may be a metal, an alloy, and an electro-conductive compound, which have a low work function, or a mixture thereof. In this regard, the second electrode may be formed of lithium (Li), magnesium (Mg), aluminum (Al), aluminum-lithium (Al—Li), calcium (Ca), magnesium-indium (Mg—In), magnesium-silver (Mg—Ag), or the like, and may be formed as a thin film type transmission electrode. In some embodiments, to manufacture a top-emission light-emitting device, the second electrode is formed to be suitably thin to allow for desired light transmission.

Although the OLED of the drawing is described above, the present invention is not limited thereto.

When a phosphorescent dopant is used in the EML, a HBL may be formed between the ETL and the EML or between the E-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. Any suitable hole-blocking material may be used, and examples of the hole-blocking materials are oxadiazole derivatives, phenanthroline derivatives, or the like. For example, bathocuproine (BCP) represented by the following formula may be used as a material for forming the HBL.

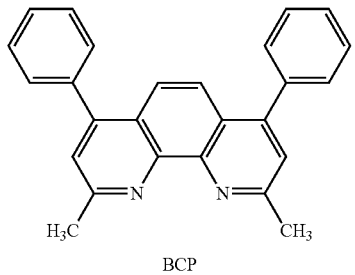 [SMILES: Cc1cc(-c2ccccc2)c2ccc3c(-c4ccccc4)cc(C)nc3c2n1 ; "BCP"]

BCP

The thickness of the HBL may be from about 20 Å to about 1000 Å, and in some embodiments, from about 30 Å to about 300 Å. In one embodiment, when the thickness of the HBL is within these ranges, the HBL has improved hole blocking ability without a substantial increase in driving voltage.

According to embodiments of the present invention, the OLED may be included in various types of flat panel display devices such as in a passive matrix OLED device or in an active-matrix OLED device. In particular, when the OLED is included in an active matrix OLED device including a thin-film transistor, the first electrode on the substrate may function as a pixel electrode, electrically connected to a source electrode or a drain electrode of the thin-film transistor. Moreover, the OLED may also be included in flat panel display devices having double-sided screens.

In some embodiments, the organic layer of the organic light-emitting device may be formed of the compound of Formula 1 by using a deposition method or may be formed using a wet process of coating a solution of the compound of Formula 1.

Hereinafter, the present invention will be described in more detail with reference to the following synthesis examples and other examples. However, these examples are for illustrative purposes only and are not intended to limit the scope of the present invention.

EXAMPLES

Synthesis Example 1: Synthesis of Compound 2

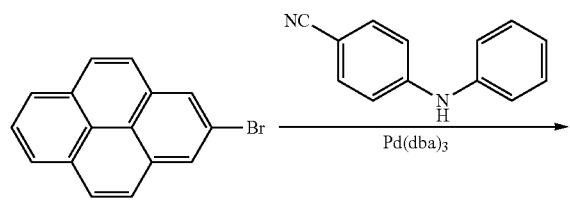

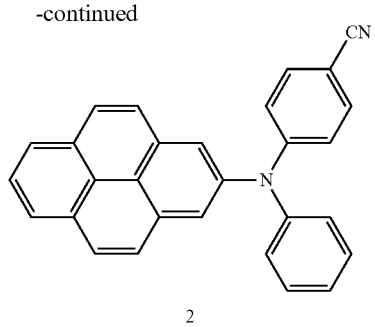

2

1.40 g (5.0 mmol) of 2-bromopyren (a systhesis according to methods suitable in the literature. Reference literature: Chem. Eur. J. 2012, 18, 5022-5035), 0.97 g (5.0 mmol) of 4-(phenylamino)benzonitrile, 0.09 g (0.1 mmol) of $Pd_2(dba)_3$, 0.01 g (0.1 mmol) of $PtBu_3$, and 1.38 g (10.0 mmol) of KOtBu were dissolved in 20 mL of toluene, and then stirred at a temperature of about 85° C. for about 2 hours. After the reaction solution was cooled to room temperature, the reaction solution was extracted three times with 20 mL of distilled water and 20 mL of diethyl ether. The organic phase was collected and was dried using magnesium sulfate to evaporate the solvent. The residue was separated and dissolved in 20 mL of toluene again. Next, 6.18 g (5.0 mmol) of 2-bromopyren, 0.09 g (0.1 mmol) of $Pd_2(dba)_3$, 0.01 g (0.1 mmol) of $PtBu_3$, and 1.38 g (10.0 mmol) of KOtBu were added to the reaction solution at a temperature of about 85° C. for about 2 hours. After the reaction solution was cooled to room temperature, the reaction solution was extracted three times with 20 mL of distilled water and 20 mL of diethyl ether. The organic phase was collected and was dried using magnesium sulfate to evaporate the solvent. The residue was separated and purified using silica gel column chromatography to obtain Compound 2 (1.67 g, 85% of yield). This compound was identified using mass spectrometry/fast atom bombardment (MS/FAB) and $^1$H NMR.

$C_{29}H_{18}N_2$ cal. 394.15. Found 395.15.

$^1$H NMR (400 MHz, $CDCl_3$) 8.24-8.21 (ss, 2H), 8.05-8.01 (m, 3H), 7.57-7.55 (ss, 2H), 7.47 (s, 2H), 7.39-7.35 (m, 2H), 7.10-7.05 (m, 2H), 6.74-6.72 (m, 2H), 6.66-6.63 (m, 1H), 6.24-6.23 (m, 2H)

Synthesis of Compound 4

Compound 4 (2.8 g, 75% of yield) was synthesized in the same manner as in Synthesis Example 1, except that phenyl-(4-pyridin-3-yl-phenyl)amine was used instead of 4-(phenylamino)benzonitrile. This compound was identified using $^1$H NMR and MS/FAB.

Synthesis of Compound 14

Compound 14 (2.5 g, 72% of yield) was synthesized in the same manner as in Synthesis of Compound 2, except that 4,6-diphenyl-[1,3,5]triazine-2-yl)phenylamine was used instead of 4-(phenylamino)benzonitrile. This compound was identified using $^1$H NMR and MS/FAB.

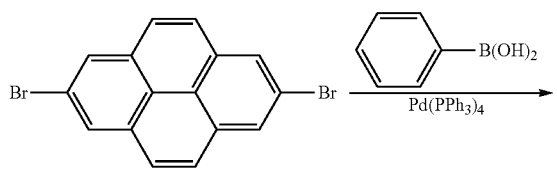

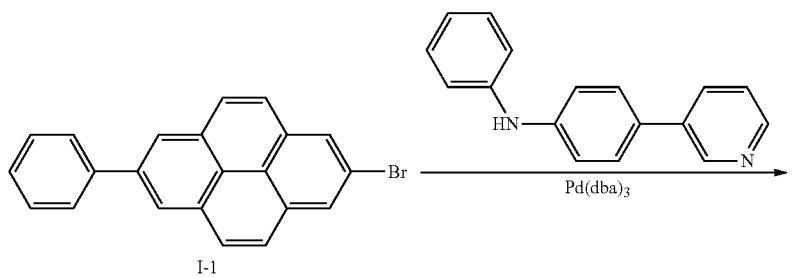

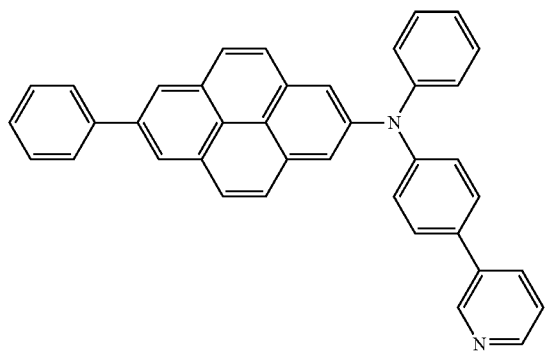

Synthesis of Intermediate I-1

10.8 g (30.0 mmol) of 2,7-dibromopyren (a synthesis according to methods known in the literature. Reference literature: Chem. Eur. J. 2012, 18, 5022-5035), 2.44 g (20 mmol) of phenylboronic acid, 1.15 g (1.0 mmol) of Pd(PPh$_3$)$_4$, and 4.14 g (30.0 mmol) of K$_2$CO$_3$ were dissolved in 60 mL of a mixed solution of tetrahydrofuran (THF)/H$_2$O (2/1), and then stirred at a temperature of about 80° C. for about 5 hours. After the reaction solution was cooled to room temperature, the reaction solution was extracted three times with 60 mL of distilled water and 60 mL of diethyl ether. The organic phase was collected and was dried using magnesium sulfate to evaporate the solvent. The residue was separated and dissolved using silica gel column chromatography to obtain 4.07 g (yield: 57%) of Intermediate I-1. This compound was identified using liquid chromatography-mass spectrometry (LC-MS). C$_{22}$H$_{13}$BrM$^+$ 356.0

Synthesis of Compound 22

Compound 22 (2.11 g, 81% or yield) was synthesized using Intermediate I-1 and en-phenyl-4-(pyridin-3-yl)aniline in the same manner as in Synthesis of Compound 2. This compound was identified using MS/FAB and $^1$H NMR.

C$_{39}$H$_{26}$N$_2$ cal. 522.21. Found 523.21.
$^1$H NMR (400 MHz, CDCl$_3$) 8.90 (m, 1H), 8.60-8.58 (m, 1H), 8.29 (s, 2H), 7.93-7.91 (m, 1H), 7.83-7.81 (ss, 2H), 7.76-7.72 (m, 2H), 7.62-7.60 (ss, 2H), 7.48-7.43 (m, 6H), 7.28-7.24 (m, 2H), 7.10-7.05 (m, 2H), 6.67-6.63 (m, 3H), 6.24-6.21 (m, 2H)

Synthesis of Compound 23

Compound 23 (2.2 g, 79% of yield) was synthesized in the same manner as in the synthesis of Compound 22, except that phenyl-(pyridine-3-yl)amine was used instead of en-phenyl-4-(pyridine-3-yl)aniline. This compound was identified using $^1$H NMR and MS/FAB.

Synthesis of Compound 28

Compound 28 (2.6 g, 80% of yield) was synthesized in the same manner as in the synthesis of Intermediate I-1, except that 2-pyridine-boronic acid was used instead of phenylboronic acid, and in the same manner as in the synthesis of Compound 22, except that 4-phenylamino-benzonitrile was used instead of en-phenyl-4-(pyridine-3-yl)aniline. This compound was identified using $^1$H NMR and MS/FAB.

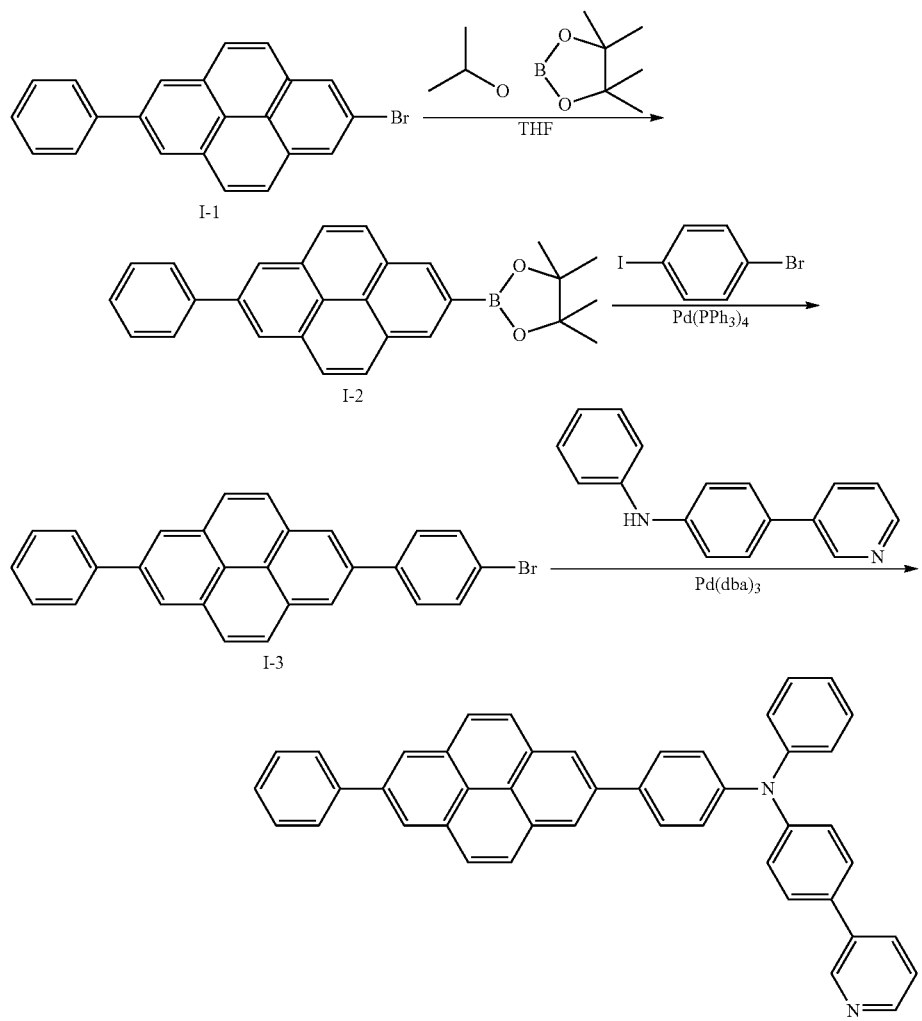

Synthesis of Intermediate I-2

3.57 g (10 mmol) of Intermediate I-1 and 6.25 mL (10 mmol) of n-BuLi (1.60 M hexane solution) were reacted in THF at about 78° C. for about 3 hours. Then, 2.04 g (12 mmol) of 2-isopropylboronic pinacol ester was added to the reaction solution at about 78° C., and then stirred at room temperature for about 12 hours, followed by adding 5 ml of 1N HCl (aq). After separating the organic phase of the reaction solution, the aqueous phase was extracted twice with 100 ml of dichloromethane. The organic phase of the extraction and the separated organic phase were collected and dried using magnesium sulfate to evaporate the solvent. The residue was separated and purified using silica gel column chromatography to obtain 3.15 g (yield 78%) of Intermediate I-2. This compound was identified using LC-MS.

$C_{28}H_{25}BO_2M^+$ 404.19

Synthesis of Intermediate I-3

4.04 g (10 mmol) of Intermediate I-2, 4.2 g (15.0 mmol) of 4-bromo-iodobenzene, 0.58 g (0.5 mmol) of $Pd(PPh_3)_4$, and 4.1 g (30.0 mmol) of $K_2CO_3$ were dissolved in 30 mL of a mixed solution of $THF/H_2O$ (volume ratio of 1:2), and then stirred at a temperature of about 80° C. for about 5 hours. After the reaction solution was cooled to room temperature, the reaction solution was extracted three times with 40 mL of distilled water and 50 mL of ethyl ether. The organic phase was collected and was dried using magnesium sulfate to evaporate the solvent. The residue was separated and purified using silica gel column chromatography to obtain 2.68 g (yield 62%) of Intermediate I-3. This compound was identified using LC-MS.

$C_{28}H_{17}BrM^+$ 432.05

Synthesis of Compound 34

Compound 34 (1.95 g, 75% of yield) was synthesized using Intermediate I-3 and en-phenyl-4-(pyridine-3-yl)aniline in the same manner as in Synthesis of Compound 2. This compound was identified using MS/FAB and $^1H$ NMR.

$C_{45}H_{30}N_2$ cal. 598.24. Found 599.24.

$^1H$ NMR (400 MHz, $CDCl_3$) 8.90 (m, 1H), 8.60-8.58 (m, 1H), 8.29 (s, 2H), 8.22 (s, 2H), 7.93-7.91 (m, 5H), 7.78-7.72 (m, 2H), 7.54-7.41 (m, 6H), 7.28-7.24 (m, 2H), 7.08-7.04 (m, 2H), 6.94-6.93 (m, 2H), 6.85-6.82 (m, 2H), 6.66-6.63 (m, 1H), 6.22-6.20 (m, 2H)

Synthesis of Compound 39

Compound 39 (1.7 g, 82% of yield) was synthesized in the same manner as in Synthesis of Compound 34, except that 4-(pyridine-3-yl-amine)benzonitrile was used instead of en-phenyl-4-(pyridine-3-yl)aniline. This compound was identified using $^1$H NMR and MS/FAB.

Synthesis of Compound 42

Compound 42 (2.1 g, 80% of yield) was synthesized in the same manner as in the synthesis of Intermediate I-3, except that 4'-bromo-4-iodo-biphenyl was used instead of 4-bromo-iodobenzene, and in the same manner as in the synthesis of Compound 34, except that phenyl-(4-pyridine-3-yl-phenyl) amine was used instead of en-phenyl-4-(pyridine-3-yl)aniline. This compound was identified using $^1$H NMR and MS/FAB.

Synthesis of Compound 47

Compound 47 (2.3 g, 83% of yield) was synthesized in the same manner as in the synthesis of Intermediate I-3, except that 2-bromo-6-iodo-naphthalene was used instead of 4-bromo-iodobenzne, and in the same manner as in the synthesis of Compound 34, except that 4-(naphthalene-1-yl-amino)benzonitrile was used instead of en-phenyl-4-(pyridine-3-yl)aniline. This compound was identified using $^1$H NMR and MS/FAB.

Synthesis of Compound 56

Compound 56 (1.9 g, 77% of yield) was synthesized in the same manner as in the synthesis of Intermediate I-3, except that 1,4-dibromo-naphthalene was instead of 4-bromo-iodobenzene, and in the same manner as in the synthesis of Compound 34, except that (4-fluoro-phenyl)quinoxaline-6-ylamine was used instead of en-phenyl-4-(pyridine-3-yl) aniline. This compound was identified using $^1$H NMR and MS/FAB.

Synthesis of Compound 59

Compound 59 (2.4 g, 73% of yield) was synthesized in the same manner as used to synthesize intermediate 1-3, except that 2,7-dibromo-9,9-dimethyl-9H-fluoren was used instead of 4-bromo-iodobenzene, and in the same manner as used to synthesize Compound 34, except that 4-(naphthalene-1-ylamine)benzonitrile was used instead of en-phenyl-4-(pyridine-3-yl)aniline. This compound was identified using $^1$H NMR and MS/FAB.

Synthesis of Compound 64

Compound 64 (2.3 g, 76% of yield) was synthesized in the same manner as used to synthesize Intermediate I-3, except that 3,7-dibromo-dibenzofuran was used instead of 4-bromo-iodobenzene, and in the same manner as used to synthesize Compound 34, except that (3,5-difluoro-phenyl)-phenylamine was used instead of en-phenyl-4-(pyridine-3-yl)aniline. This compound was identified using $^1$H NMR and MS/FAB.

Synthesis of Compound 69

Compound 69 (1.6 g, 70% of yield) was synthesized in the same manner as used to synthesize Intermediate I-3 except that 3,7-dibromo-dibenzothiophene was used instead of 4-bromo-iodobenzene, and in the same manner as used to synthesize Compound 34, except that phenyl-pyridine-3-ylamine was used instead of en-phenyl-4-(pyridine-3-yl) aniline. This compound was identified using $^1$H NMR and MS/FAB.

Synthesis of Compound 74

Compound 74 (1.8 g, 73% of yield) was synthesized in the same manner as used to synthesize Intermediate I-1, except that 2-pyridine-boronic acid was used instead of phenyl-boronic acid, and in the same manner as used to synthesize Compound 34, except that 4-(9-phenyl-9H-carbazole-2-ylamino)benzonitrile was used instead of en-phenyl-4-(pyridine-3-yl)aniline. This compound was identified using $^1$H NMR and MS/FAB.

Synthesis of Compound 75

Compound 75 (2.0 g, 72% of yield) was synthesized in the same manner as used to synthesize Compound 74, except that dibenzothiophene-3-yl-phenylamine was used instead of 4-(9-phenyl-9H-carbazole-2-ylamino)benzonitrile. This compound was identified using $^1$H NMR and MS/FAB.

Synthesis of Compound 80

Compound 80 (2.1 g, 68% of yield) was synthesized in the same manner as used to synthesize Intermediate I-1, Intermediate I-3, and Compound 34, except that naphthalene-2-boronic acid was used instead of phenyl-boronic acid in Intermediate I-1, 1,4-dibromo-2,3-difluoro-benzene was used instead of 4-bromo-iodobenzene in Intermediate I-3, and phenyl-(4-pyridine-3-yl-phenyl)amine was used instead of en-phenyl-4-(pyridine-3-yl)aniline in Compound 34, respectively. This compound was identified using $^1$H NMR and MS/FAB.

Synthesis of Compound 83

Compound 83 (2.5 g, 79% of yield) was synthesized in the same manner as used to synthesize Intermediate I-1 and Compound 34, except that 2-(9,9-dimethyl-9H-fluoren)-boronic acid was used instead of phenyl-boronic acid in Intermediate I-1, and 4-(naphthalene-1-ylamino)benzonitrile was used instead of en-phenyl-4-(pyridine-3-yl)aniline in Compound 34, respectively. This compound was identified using $^1$H NMR and MS/FAB.

Synthesis of Compound 92

Compound 92 (2.7 g, 85% of yield) was synthesized in the same manner as used to synthesize Intermediate I-1 and Compound 34, except that 3-(9-phenyl-9H-carbazole)-boronic acid was used instead of phenyl-boronic acid in Intermediate I-1, and phenyl-pyridine-3-ylamine was used instead of en-phenyl-4-(pyridine-3-yl)aniline in Compound 34. This compound was identified using $^1$H NMR and MS/FAB.

Additional compounds were synthesized using appropriate intermediate materials according to the synthetic pathways and the methods described as above, and were identified using $^1$H NMR and MS/FAB. The results are shown in Table 1 below.

Synthetic pathways and source materials for other compounds not in Table 1 will be obvious to one of ordinary skill in the art based on the synthetic pathways and source materials described above.

TABLE 1

| Compound | ¹H NMR (CDCl₃, 400 MHz) | MS/FAB found | MS/FAB calc. |
|---|---|---|---|
| 2 | δ = 8.24-8.21 (ss, 2H), 8.05-8.01 (m, 3H), 7.57-7.55 (ss, 2H), 7.47 (s, 2H), 7.39-7.35 (m, 2H), 7.10-7.05 (m, 2H), 6.74-6.72 (m, 2H), 6.66-6.63 (m, 1H), 6.24-6.23 (m, 2H) | 395.15 | 394.15 |
| 4 | δ = 8.90 (d, 1H), 8.60-8.58 (m, 1H), 8.23-8.21 (ss, 2H), 8.05-8.02 (m, 3H), 7.93-7.91 (m, 1H), 7.57-7.55 (ss, 2H), 7.48-7.44 (m, 3H), 7.28-7.24 (m, 2H), 7.09-7.05 (m, 2H), 6.67-6.63 (m, 3H), 6.23-6.21 (m, 2H) | 447.25 | 446.18 |
| 13 | δ = 8.86 (d, 1H), 8.65-8.64 (m, 1H), 8.23-8.21 (ss, 2H), 8.05-8.02 (m, 3H), 7.85-7.83 (m, 1H), 7.57-7.55 (ss, 2H), 7.52 (s, 2H), 7.43-7.35 (m, 3H), 7.24-7.16 (m, 2H), 7.00 (m, 1H), 6.75-6.72 (m, 2H), 6.41-6.39 (m, 1H) | 472.17 | 471.17 |
| 14 | δ = 8.71-8.68 (m, 4H), 8.23-8.21 (ss, 2H), 8.05-8.01 (m, 3H), 7.81 (s, 2H), 7.67-7.65 (ss, 2H), 7.59-7.56 (m, 4H), 7.42-7.36 (m, 4H), 7.15-7,12 (m, 2H), 7.06-7.02 (m, 1H) | 525.20 | 524.20 |
| 19 | δ = 8.08-8.06 (ss, 2H), 7.63 (s, 2H), 7.48-7.45 (ss, 2H), 7.41 (s, 2H), 7.38-7.35 (m, 2H), 7.10-7.05 (m, 2H), 6.74-6.72 (m, 2H), 6.66-6.63 (m, 1H), 6.24-6.21 (m, 2H), 2.62 (s, 3H) | 409.16 | 408.16 |
| 22 | δ = 8.90 (m, 1H), 8.60-8.58 (m, 1H), 8.29 (s, 2H), 7.93-7.91 (m, 1H), 7.83-7.81 (ss, 2H), 7.76-7.72 (m, 2H), 7.62-7.60 (ss, 2H), 7.48-7.43 (m, 6H), 7.28-7.24 (m, 2H), 7.10-7.05 (m, 2H), 6.67-6.63 (m, 3H), 6.24-6.21 (m, 2H) | 523.21 | 522.21 |
| 23 | δ = 8.53-8.52 (m, 1 H), 8.29 (s, 2H), 8.03 (m, 1 H), 7.83-7.81 (ss, 2H), 7.76-7.71 (m, 2H), 7.62-7.60 (ss, 2H), 7.48-7.41 (m, 5H), 7.30-7.26 (q, 1H), 7.15-7.10 (m, 3H), 6.66-6.63 (m, 1H), 6.32-6.30 (m, 2H) | 447.18 | 446.18 |
| 28 | δ = 8.68-8.67 (m, 1H), 8.50 (s, 2H), 8.09-8.07 (ss, 2H), 7.86-7.84 (m, 1H), 7.77-7.75 (m, 1H), 7.68-7.66 (ss, 2H), 7.41 (s, 2H), 7.38-7.36 (m, 2H), 7.30-7.27 (m, 1H), 7.10-7.05 (m, 2H), 6.74-6.72 (m, 2H), 6.65-6.63 (m, 1H), 6.23-6.21 (m, 2H) | 472.17 | 471.17 |
| 32 | δ = 8.29 (s, 2H), 8.12-8.10 (m, 1H), 7.87-7.81 (m, 3H), 7.77-7.72 (m, 2H), 7.67-7.65 (ss, 2H), 7.49-7.36 (m, 10H), 7.33-7.29 (t, 1H), 6.70-6.68 (m, 1H), 6.55-6.51 (m, 2H) | 521.19 | 520.19 |
| 34 | δ = 8.90 (m, 1H), 8.60-8.58 (m, 1H), 8.29 (s, 2H), 8.22 (s, 2H), 7.93-7.91 (m, 5H), 7.78-7.72 (m, 2H), 7.54-7.41 (m, 6H), 7.28-7.24 (m, 2H), 7.08-7.04 (m, 2H), 6.94-6.93 (m, 2H), 6.85-6.82 (m, 2H), 6.66-6.63 (m, 1H), 6.22-6.20 (m, 2H) | 599.24 | 598.24 |
| 39 | δ = 8.53-8.52 (m, 1 H), 8.29 (s, 2H), 8.22 (s, 2H), 8.01 (m, 1H), 7.94 (s, 4H), 7.78-7.73 (m, 2H), 7.59-7.55 (m, 2H), 7.48-7.39 (m, 5H), 7.28-7.25 (m, 1H), 6.97-9.64 (m, 1H), 6.88-6.85 (m, 2H), 6.72-6.68 (m, 2H) | 548.20 | 547.20 |
| 42 | δ = 8.90 (m, 1H), 8.60-8.58 (m, 1H), 8.31-8.29 (d, 4H), 7.93-7.91 (m, 5H), 7.83-7.73 (m, 4H), 7.65-7.62 9m, 2H), 7.48-7.41 (m, 6H), 7.28-7.24 (m, 2H), 7.08-7.04 (m, 2H), 6.94-6.92 (m, 2H), 6.85-6.82 (m, 2H), 6.66-6.63 (m, 1H), 6.22-6.20 (m, 2H) | 675.27 | 674.27 |
| 47 | δ = 8.37 (s, 2H), 8.29(s, 2H), 8.21 (m, 1H), 8.13-8.10 (m, 1H), 8.00-7.92 (m, 5H), 7.87-7.85 (m, 1H), 7.78-7.71 (m, 4H), 7.49-7.39 (m, 9H), 7.29-7.25 (t, 1H), 6.93-6.90 (dd, 1H), 6.73-6.71 (dd, 1H), 6.61-6.58 (m, 2H) | 647.24 | 646.24 |
| 56 | δ = 8.87 (d, 1H), 8.78 (d, 1H), 8.29 (s, 2H), 8.19 9s, 2H), 8.08-8.04 (m, 2H), 7.97 (s, 4H), 7.78-7.71 (m, 2H0, 7.59-7.57 (ss, 1H), 7.50-7.45 (m, 5H), 7.40-7.35 (m, 2H), 7.17-7.13 (m, 1H), 7.03-7.01 (ss, 1H), 6.94-6.88 (m, 2H), 6.52-6.48 (m, 2H) | 642.23 | 641.23 |
| 59 | δ = 8.29 (s, 2H), 8.13-8.12 (m, 3H), 7.98-7.92 (m, 4H), 7.87-7.85 (m, 1H), 7.77-7.73 (m, 3H), 7.68-7.66 (ss, 2H), 7.62-7.60 (dd, 1H), 7.48-7.36 (m, 8H), 7.29-7.25 (t, 1H), 6.75-6.73 (m, 1H), 6.63-6.61 (m, 3H), 6.35 (d, 1H), 1.63 (s, 6H) | 713.29 | 712.29 |

TABLE 1-continued

| Compound | ¹H NMR (CDCl₃, 400 MHz) | MS/FAB found | MS/FAB calc. |
|---|---|---|---|
| 64 | δ = 8.42 (s, 2H), 8.29 (s, 2H), 8.09-8.07 (m, 1H), 7.98-7.92 (m, 5H), 7.88-7.86 (ss, 1H), 7.78-7.71 (m, 3H), 7.48-7.41 (m, 3H), 7.16-7.14 (dd, 1H), 7.08-7.02 (m, 3H), 6.66-6.57 (m, 2H), 6.49-6.46 (m, 2H), 6.30-6.22 (m, 2H) | 648.23 | 647.21 |
| 69 | δ = 8.53-8.52 (m, 1H0, 8.41 (s, 2H0, 8.29 (s, 2H), 8.15-8.14 (m, 1H), 8.10-8.08 (m, 2H), 7.98-7.92 (m, 4H), 7.88-7.85 (dd, 1H), 7.82-7.80 (ss, 1H), 7.76-7.71 (m, 2H0, 7.48-7.41 (m, 3H), 7.29-7.26 (m, 1H), 7.17-7.09 (m, 4H), 7.04-7.02 (dd, 1H), 6.66-6.63 (m, 1H), 6.45-6.44 (m, 2H) | 629.20 | 628.20 |
| 74 | δ = 8.29 (s, 2H), 8.22 (s, 2H), 8.17-8.15 (m, 1H), 7.94 (s, 4H), 7.83-7.80 (m, 1H), 7.76-7.73 (m, 2H), 7.55-7.44 (m, 9H), 7.39-7.23 (m, 6H), 6.96-6.93 (m, 2H0, 6.90-6.87 (m, 2H), 6.82-6.78 (m, 2H) | 712.27 | 711.27 |
| 75 | δ = 8.68-8.66 (m, 1 H), 8.50 (s, 2H), 8.22 (s, 2H), 8.19-8.17 (m, 3H), 8.13-8.11 (m, 1H), 8.01-7.99 (ss, 2H), 7.86-7.73 (m, 3H), 7.55-7.52 (m, 2H), 7.46-7.42 (m, 1H), 7.38-7.34 (m, 1 H), 7.30-7.27 (m, 1H), 7.10-7.04 (m, 3H), 6.97-6.94 (dd, 1H), 6.70-6.63 (m, 3H), 6.40-6.37 (m, 2H) | 629.20 | 628.20 |
| 80 | δ = 8.90 (m, 1H), 8.60-8.58 (m, 1H), 8.37 (s, 2H), 8.24 (s, 1H), 8.17-8.15 (ss, 2H), 8.07 (s, 2H), 8.01-7.85 (m, 7H), 7.61-7.58 (m, 1H), 7.53-7.45 (m, 2H), 7.41-7.37 (t, 1H), 7.30-7.26 (m, 2H), 7.10-7.06 (m, 2H), 6.80-6.76 (m, 2H), 6.65-6.61 (m, 1H), 6.37-6.34 (m, 2H), 6.31-6.27 (m, 1H) | 689.24 | 684.24 |
| 83 | δ = 8.22 (s, 2H), 8.17-8.14 (m, 3H), 8.00-7.99 (dd, 1H), 7.96-7.94 (ss, 4H), 7.87-7.85 (m, 1H), 7.81-7.79 (dd, 1H), 7.76-7.75 (d, 1H), 7.73-7.71 (ss, 1H), 7.52-7.30 (m, 8H), 7.25-7.21 (t, 1H), 7.16-7.09 (m, 2H), 6.86-6.82 (m, 2H), 6.75-6.73 (m, 1H), 6.65-6.62 (m, 2H), 1.57 (s, 6H) | 713.29 | 712.29 |
| 88 | δ = 8.41 (s, 2H), 8.32-8.30 (m, 1H), 8.22 (s, 2H), 8.17-8.15 (m, 1H), 8.10-8.08 (m, 2H), 7.96-7.94 (m, 4H), 7.87-7.84 (m, 2H), 7.80-7.78 (m, 1H), 7.52-7.35 (m, 9H), 7.25-7.21 (t, 1H), 6.86-6.82 (m, 2H), 6.75-6.73 (m, 1H), 6.65-6.62 (m, 2H) | 703.21 | 702.21 |
| 90 | δ = 8.53-8.52 (m, 1H), 8.41 (s, 2H), 8.32-8.30 (m, 1H), 8.22 (s, 2H), 8.10-8.08 (m, 2H), 8.01-7.98 (m, 2H), 7.96-7.94 (ss, 3H), 7.86-7.78 (m, 2H), 7.59-7.55 (m, 2H), 7.46-7.35 (m, 4H), 7.28-7.25 (m, 1H), 6.97-6.94 (m, 1H), 6.88-6.85 (m, 2H), 6.72-6.68 (m, 2H) | 654.19 | 653.19 |
| 92 | δ = 8.53-8.52 (m, 1H), 8.33 (s, 2H), 8.24-8.20 (m, 4H), 8.01-7.92 (m, 5H), 7.77-7.70 (m, 2H), 7.59-7.56 (m, 2H), 7.50-7.47 (m, 4H), 7.39-7.35 (m, 1H), 7.31-7.21 (m, 3H), 7.12-7.08 (m, 3H), 6.97-6.95 (m, 1H), 6.66-6.61 (m, 3H), 6.33-6.31 (m, 2H) | 688.27 | 687.27 |

Example 1

In order to manufacture an anode, a corning 15 Ω/cm² (1200 Å) ITO glass substrate was cut to a size of 50 mm×50 mm×0.7 mm and then sonicated in isopropyl alcohol and pure water for about 5 minutes each, and then cleaned by irradiation of ultraviolet rays for about 30 minutes and exposed to ozone. The resulting glass substrate was loaded into a vacuum deposition device.

4,4',4"-Tris(N-(2-naphthyl)-N-phenyl-amino)-triphenylamine (hereinafter, 2-TNATA), was vacuum-deposited on the anode to a thickness of 600 Å to form an HIL, and 4,4'-bis[N-(1-naphtyl)-N-phenylamino]biphenyl (hereinafter, NPB) as a hole transporting compound was vacuum-deposited on the NIL to a thickness of 300 Å to form an HTL.

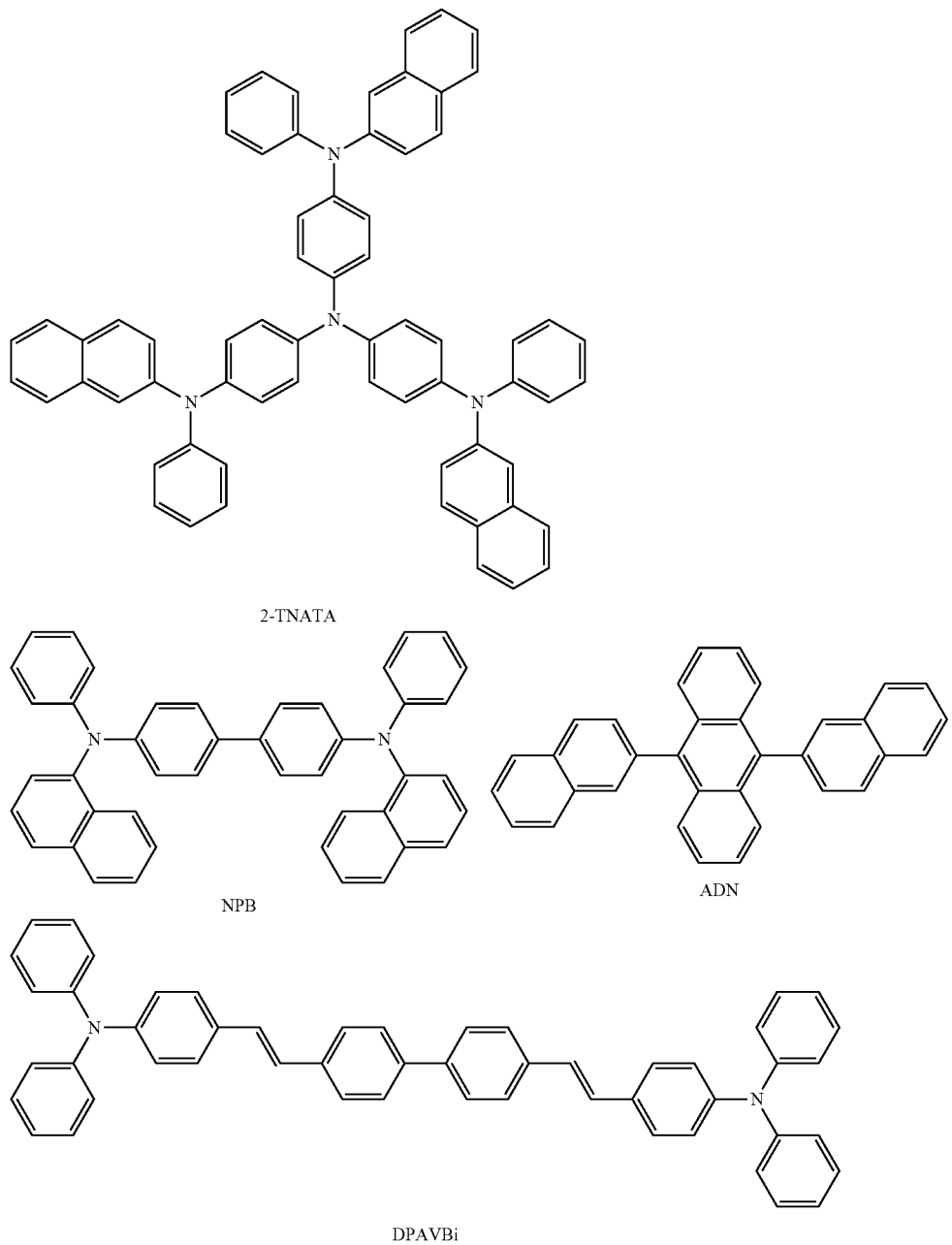

2-TNATA

NPB

ADN

DPAVBi 9,10-di-naphthalene-2-yl-anthracene (hereinafter, ADN) as a blue fluorescent host host, and 4,4'-bis[2-(4-(N,N-diphenylamino)phenyl)vinyl]biphenyl (hereinafter, DPAVBi) as a suitable blue fluorescent dopant, were co-deposited in a weight ratio of about 98:2 on the HTL to form an EML having a thickness of 300 Å.

Next, Compound 2 of the present invention was deposited on the EML to form an ETL to a thickness of 300 Å, and then LiF, which is a halogenated alkali metal, was deposited on the ETL to form an EIL to a thickness of 10 Å. Then, Al was vacuum-deposited on the EIL to form a cathode having a thickness of 3000 Å, thereby forming a LiF/Al electrode and completing the manufacture of an OLED.

The OLED had a driving voltage of about 5.35 V at a current density of 50 mA/cm², a luminosity of 3,350 cd/m², a luminescent efficiency of 7.20 cd/A, and a half life-span (hr @100 mA/cm²) of about 550 hours.

Example 2

An OLED was manufactured in the same manner as in Example 1, except that Compound 4 was used instead of Compound 2 to form the ETL The OLED had a driving voltage of about 5.30 V at a current density of 50 mA/cm², a luminosity of 3,315 cd/m², a luminescent efficiency of 7.12 cd/A, and a half life-span (hr @100 mA/cm²) of about 456 hours.

Example 3

An OLED was manufactured in the same manner as in Example 1, except that Compound 14 was used instead of Compound 2 to form the ETL.

The OLED had a driving voltage of about 5.18 V at a current density of 50 mA/cm$^2$, a luminosity of 3,020 cd/m$^2$, a luminescent efficiency of 6.98 cd/A, and a half life-span (hr @100 mA/cm$^2$) of about 511 hours.

Example 4

An OLED was manufactured in the same manner as in Example 1, except that Compound 19 was used instead of Compound 2 to form the ETL.

The OLED had a driving voltage of 5.0 W at a current density of 50 mA/cm$^2$, a luminosity of 3,565 cd/m$^2$, a luminescent efficiency of 7.58 cd/A, and a half life-span (hr @100 mA/cm$^2$) of about 573 hours.

Example 5

An OLED was manufactured in the same manner as in Example 1, except that Compound 23 was used instead of compound 2 to form the ETL.

The OLED had a driving voltage of 5.25V at a current density of 50 mA/cm$^2$, a luminosity of 3,230 cd/m$^2$, a luminescent efficiency of 7.05 cd/A, and a half life-span (hr @100 mA/cm$^2$) of about 526 hours.

Example 6

An OLED was manufactured in the same manner as in Example 1, except that Compound 28 was used instead of Compound 2 to form the ETL.

The OLED had a driving voltage of about 5.29 V at a current density of 50 mA/cm$^2$, a luminosity of 2,925 cd/m$^2$, a luminescent efficiency of 7.36 cd/A, and a half life-span (hr @100 mA/cm$^2$) of about 512 hours.

Example 7

An OLED was manufactured in the same manner as in Example 1, except that Compound 34 was used instead of Compound 2 to form the ETL.

The OLED had a driving voltage of about 5.05 V at a current density 50 mA/cm$^2$, a luminosity of 3,860 cd/m$^2$, a luminescent efficiency of 7.87 cd/A, and a half life-span (hr @100 mA/cm$^2$) of about 687 hours.

Example 8

An OLED was manufactured in the same manner as in Example 1, except that Compound 39 was used instead of Compound 2 to form the ETL.

The OLED had a driving voltage of about 5.01 V at a current density 50 mA/cm$^2$, a luminosity of 3,185 cd/m$^2$, a luminescent efficiency of 7.53 cd/A, and a half life-span (hr @100 mA/cm$^2$) of about 668 hours.

Example 9

An OLED was manufactured in the same manner as in Example 1, except that Compound 42 was used instead of Compound 2 to form the ETL.

The OLED had a driving voltage of about 5.15 V at a current density 50 mA/cm$^2$, a luminosity of 3,890 cd/m$^2$, a luminescent efficiency of 8.07 cd/A, and a half life-span (hr @100 mA/cm$^2$) of about 693 hours.

Example 10

An OLED was manufactured in the same manner as in Example 1, except that Compound 47 was used instead of Compound 2 to form the ETL.

The OLED had a driving voltage of about 5.30 V at a current density 50 mA/cm$^2$, a luminosity of 3,180 cd/m$^2$, a luminescent efficiency of 7.56 cd/A, and a half life-span (hr @100 mA/cm$^2$) of about 655 hours.

Example 11

An OLED was manufactured in the same manner as in Example 1, except that Compound 56 was used instead of Compound 2 to form the ETL.

The OLED had a driving voltage of about 5.36 V at a current density 50 mA/cm$^2$, a luminosity of 3,295 cd/m$^2$, a luminescent efficiency of 7.02 cd/A, and a half life-span (hr @100 mA/cm$^2$) of about 604 hours.

Example 12

An OLED was manufactured in the same manner as in Example 1, except that Compound 59 was used instead of Compound 2 to form the ETL.

The OLED had a driving voltage of about 5.18 V at a current density 50 mA/cm$^2$, a luminosity of 3,530 cd/m$^2$, a luminescent efficiency of 7.73 cd/A, and a half life-span (hr @100 mA/cm$^2$) of about 637 hours.

Example 13

An OLED was manufactured in the same manner as in Example 1, except that Compound 64 was used instead of Compound 2 to form the ETL.

The OLED had a driving voltage of about 5.33 V at a current density 50 mA/cm$^2$, a luminosity of 3,375 cd/m$^2$, a luminescent efficiency of 7.18 cd/A, and a half life-span (hr @100 mA/cm$^2$) of about 466 hours.

Example 14

An OLED was manufactured in the same manner as in Example 1, except that Compound 69 was used instead of Compound 2 to form the ETL.

The OLED had a driving voltage of about 5.38 V at a current density 50 mA/cm$^2$, a luminosity of 3,070 cd/m$^2$, a luminescent efficiency of 7.00 cd/A, and a half life-span (hr @100 mA/cm$^2$) of about 443 hours.

Example 15

An OLED was manufactured in the same manner as in Example 1, except that Compound 74 was used instead of Compound 2 to form the ETL.

The OLED had a driving voltage of about 5.26 V at a current density 50 mA/cm$^2$, a luminosity of 3,325 cd/m$^2$, a luminescent efficiency of 7.24 cd/A, and a half life-span (hr @100 mA/cm$^2$) of about 577 hours.

Example 16

An OLED was manufactured in the same manner as in Example 1, except that Compound 75 was used instead of Compound 2 to form the ETL.

The OLED had a driving voltage of about 5.58 V at a current density 50 mA/cm², a luminosity of 3,540 cd/m², a luminescent efficiency of 6.87 cd/A, and a half life-span (hr @100 mA/cm²) of about 455 hours.

Example 17

An OLED was manufactured in the same manner as in Example 1, except that Compound 80 was used instead of Compound 2 to form the ETL.

The OLED had a driving voltage of about 5.32 V at a current density 50 mA/cm², a luminosity of 3,320 cd/m², a luminescent efficiency of 7.39 cd/A, and a half life-span (hr @100 mA/cm²) of about 401 hours.

Example 18

An OLED was manufactured in the same manner as in Example 1, except that Compound 83 was used instead of Compound 2 to form the ETL.

The OLED had a driving voltage of about 5.11 V at a current density 50 mA/cm², a luminosity of 3,735 cd/m², a luminescent efficiency of 7.65 cd/A, and a half life-span (hr @100 mA/cm²) of about 562 hours.

Example 19

An OLED was manufactured in the same manner as in Example 1, except that Compound 92 was used instead of Compound 2 to form the ETL.

The OLED had a driving voltage of about 5.43 V at a current density 50 mA/cm², a luminosity of 3,460 cd/m², a luminescent efficiency of 7.41 cd/A, and a half life-span (hr @100 mA/cm²) of about 419 hours.

Comparative Example 1

An OLED was manufactured in the same manner as in Example 1, except that the Alq3 was used instead of Compound 2 to form the EML.

The OLED had a driving voltage of about 7.25 V at a current density 50 mA/cm², a luminosity of 2,250 cd/m², a luminescent efficiency of 4.19 cd/A, and a half life-span (hr @100 mA/cm²) of about 163 hours.

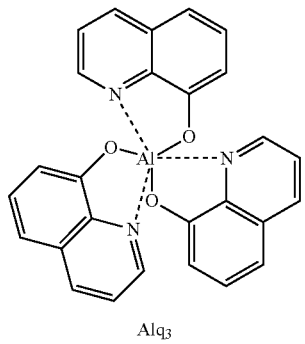

Alq3

Comparative Example 2

An OLED was manufactured in the same manner as in Example 1, except that Compound 100 was used instead of Compound 2 to form the EML.

The OLED had a driving voltage of about 5.37 V at a current density 50 mA/cm², a luminosity of 2,650 cd/m², a luminescent efficiency of 6.23 cd/A, and a half life-span (hr @100 mA/cm²) of about 275 hours.

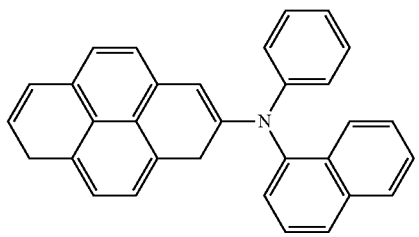

100

The characteristics and lifetimes of the OLEDs of Examples are shown in Table 2 below.

TABLE 2

| | ETL or EML material | Driving voltage (V) | Current density (mA/cm²) | Luminance (cd/m²) | Efficiency (cd/A) | Emission color | Half-life span (hr @100 mA/cm²) |
|---|---|---|---|---|---|---|---|
| Example 1 | Compound 2 | 5.35 | 50 | 3,350 | 7.20 | Blue | 550 hr |
| Example 2 | Compound 4 | 5.30 | 50 | 3,315 | 7.12 | Blue | 456 hr |
| Example 3 | Compound 14 | 5.18 | 50 | 3,020 | 6.98 | Blue | 511 hr |
| Example 4 | Compound 19 | 5.09 | 50 | 3,565 | 7.58 | Blue | 573 hr |
| Example 5 | Compound 23 | 5.25 | 50 | 3,230 | 7.05 | Blue | 526 hr |
| Example 6 | Compound 28 | 5.29 | 50 | 2,925 | 7.36 | Blue | 512 hr |
| Example 7 | Compound 34 | 5.05 | 50 | 3,860 | 7.87 | Blue | 687 hr |
| Example 8 | Compound 39 | 5.01 | 50 | 3,185 | 7.53 | Blue | 668 hr |
| Example 9 | Compound 42 | 5.15 | 50 | 3,890 | 8.07 | Blue | 693 hr |
| Example 10 | Compound 47 | 5.30 | 50 | 3,180 | 7.56 | Blue | 655 hr |

TABLE 2-continued

| | ETL or EML material | Driving voltage (V) | Current density (mA/cm²) | Luminance (cd/m²) | Efficiency (cd/A) | Emission color | Half-life span (hr @100 mA/cm²) |
|---|---|---|---|---|---|---|---|
| Example 11 | Compound 56 | 5.36 | 50 | 3,295 | 7.02 | Blue | 604 hr |
| Example 12 | Compound 59 | 5.18 | 50 | 3,530 | 7.73 | Blue | 637 hr |
| Example 13 | Compound 64 | 5.33 | 50 | 3,375 | 7.18 | Blue | 466 hr |
| Example 14 | Compound 69 | 5.38 | 50 | 3,070 | 7.00 | Blue | 443 hr |
| Example 15 | Compound 74 | 5.26 | 50 | 3,325 | 7.24 | Blue | 577 hr |
| Example 16 | Compound 75 | 5.58 | 50 | 3,540 | 6.87 | Blue | 455 hr |
| Example 17 | Compound 80 | 5.32 | 50 | 3,320 | 7.39 | Blue | 401 hr |
| Example 18 | Compound 83 | 5.11 | 50 | 3,735 | 7.65 | Blue | 562 hr |
| Example 19 | Compound 92 | 5.43 | 50 | 3,460 | 7.41 | Blue | 419 hr |
| Comparative Example 1 | Alq₃ | 7.25 | 50 | 2,250 | 4.19 | Blue | 163 hr |
| Comparative Example 2 | Compound 100 | 5.37 | 50 | 2,650 | 6.23 | Blue | 275 hr |

The OLED manufactured using compounds represented by Formula 1 according to embodiment of the present invention had significantly lower driving voltages and improved I-V-L characteristics compared to the Comparative Examples. In particular, the OLED of Examples had markedly improved lifetimes compared to Comparative Examples.

As described above, an organic light-emitting device including a compound of Formula 1 may have high efficiency, brightness, and a long lifespan.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. An organic light-emitting device comprising:
   a first electrode;
   a second electrode; and
   an organic layer between the first electrode and the second electrode, wherein the organic layer comprises a compound represented by Formula 1 below:

<Formula 1>

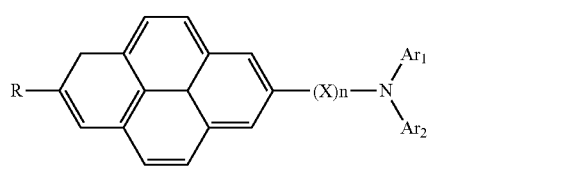

wherein, in Formula 1,
   R is a substituted or unsubstituted $C_6$-$C_{60}$ aryl group;
   $Ar_1$ and $Ar_2$ are each independently a substituted or unsubstituted $C_6$-$C_{60}$ aryl group;
   X is a substituted or unsubstituted $C_6$-$C_{60}$ arylene group; and
   n is 2.

2. The organic light-emitting device of claim 1, wherein in Formula 1, R is selected from one of the groups represented by Formulas 2a to 2b below:

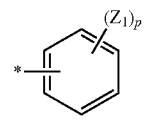

2a

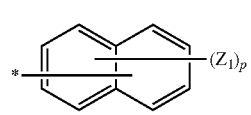

2b wherein, in Formulas 2a to 2b, $Z_1$ are each independently selected from a hydrogen atom, a deuterium atom, a substituted or unsubstituted —$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano atom, a nitro group, a hydroxyl group, or a carboxyl group;

p is an integer for 1 to 7—to correspond to Formula 2b; and

* is a binding site.

3. The organic light-emitting device of claim 1, wherein in Formula 1, $Ar_1$ and $Ar_2$ are each independently selected from the groups represented by Formulas 3a to 3b below:

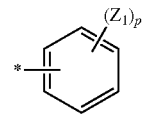

3a

-continued

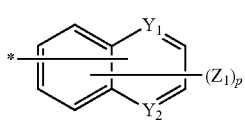
3b wherein, in Formulas 3a to 3b,
$Y_1$ to $Y_2$ are each independently CH;
$Z_1$ are each independently selected from a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano atom, a nitro group, a hydroxyl group, or a carboxyl group;
p is an integer of 1 to 7; and
* is a binding site.

4. The organic light-emitting device of claim 1, wherein in Formula 1, X is one of the groups represented by Formulas 4a to 4b below:

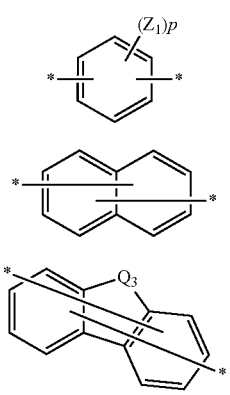

wherein, in Formulas 4a to 4b,
$Z_1$ are each independently selected from a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano atom, a nitro group, a hydroxyl group, or a carboxyl group;
p is an integer of 1 to 4; and
* is a binding site.

5. The organic light-emitting device of claim 1, wherein the organic light-emitting device comprises an emission layer and further comprises an electron injection layer, a functional layer having both electron injection and electron transport capabilities, a hole injection layer, a hole transport layer, or a functional layer having both hole injection and hole transport capabilities,
wherein the emission layer further comprises an anthracene-based compound, an arylamine-based compound, or a styryl-based compound.

6. The organic light-emitting device of claim 1, wherein the organic light-emitting device comprises an emission layer and further comprises an electron injection layer, a functional layer having both electron injection and electron transport capabilities, a hole injection layer, a hole transport layer, or a functional layer having both hole injection and hole transport capabilities,
wherein at least one of a red emission layer, a green emission layer, a blue green emission layer, or a white emission layer of the emission layer comprises a phosphorescent compound.

7. The organic light-emitting device of claim 6, wherein the functional layer having both hole injection and hole transport capabilities, the hole injection layer, or the hole transport layer comprises a charge-generating material.

8. The organic light-emitting device of claim 7, wherein the charge-generating material is a p-dopant.

9. The organic light-emitting device of claim 8, wherein the p-dopant is a quinone derivative.

10. The organic light-emitting device of claim 8, wherein the p-dopant is a metal oxide.

11. The organic light-emitting device of claim 8, wherein the p-dopant is a cyano group-containing compound.

12. The organic light-emitting device of claim 11, wherein the cyano group-containing compound is a compound represented by the formula below:

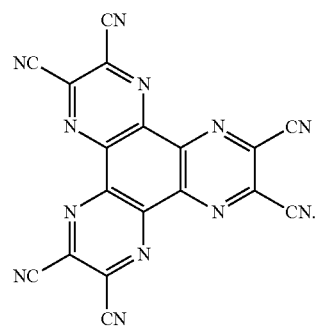 [SMILES: N#Cc1nc2c3nc(C#N)c(C#N)nc3c3nc(C#N)c(C#N)nc3c2nc1C#N]

13. The organic light-emitting device of claim 1, wherein the organic layer further comprises a metal complex.

14. The organic light-emitting device of claim 13, wherein the metal complex is a lithium (Li) complex.

15. The organic light-emitting device of claim 13, wherein the metal complex is a lithium quinolate (LiQ).

16. The organic light-emitting device of claim 13, wherein the metal complex is Compound 203 below:

<Compound 203>

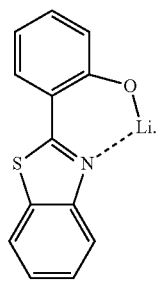

17. The organic light-emitting device of claim 1, wherein the organic layer is formed of the compound of Formula 1 using a wet process.

18. A flat panel display device comprising the organic light-emitting device of claim 1, wherein the first electrode of the organic light-emitting device is electrically connected to a source electrode or a drain electrode of a thin-film transistor.

19. The organic light-emitting device of claim 1, wherein the compound of Formula 1 is compound 42:

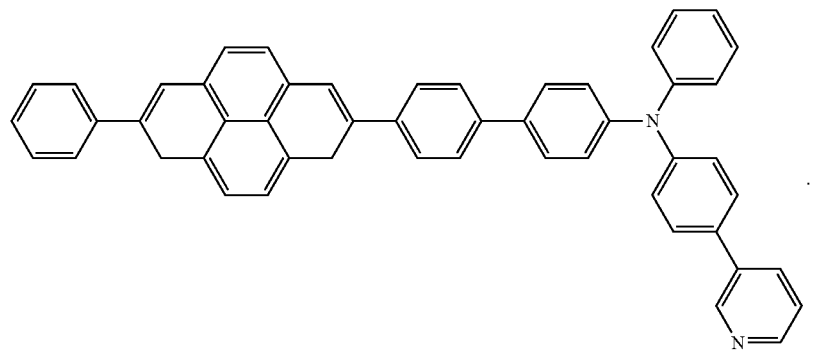
* * * * *